United States Patent [19]
Mashikian et al.

[11] Patent Number: 5,272,439
[45] Date of Patent: Dec. 21, 1993

[54] METHOD AND APPARATUS FOR THE DETECTION AND LOCATION OF FAULTS AND PARTIAL DISCHARGES IN SHIELDED CABLES

[75] Inventors: Matthew S. Mashikian, Storrs; Robert B. Northrop, Chaplin; Rajeev Bansal, Willington; Francesco Palmieri, Storrs, all of Conn.

[73] Assignee: University of Connecticut, Storrs, Conn.

[21] Appl. No.: 839,914

[22] Filed: Feb. 21, 1992

[51] Int. Cl.$^5$ ............................................. G01R 31/11
[52] U.S. Cl. .................................. 324/520; 324/527; 324/532; 324/533; 324/534
[58] Field of Search ............... 324/512, 520, 527, 534, 324/533, 535, 536, 532

[56] References Cited

U.S. PATENT DOCUMENTS

| | | |
|---|---|---|
| 2,628,267 | 2/1953 | Stringfield et al. |
| 2,783,434 | 2/1957 | Babler |
| 3,244,975 | 4/1966 | Bauer |
| 3,255,406 | 6/1966 | Schluter |
| 3,281,673 | 10/1966 | Richardson |
| 3,911,358 | 10/1975 | Shalyt et al. |
| 4,013,948 | 3/1977 | Tanaka et al. |
| 4,063,165 | 12/1977 | Lanz |
| 4,104,582 | 8/1978 | Lambertsen |
| 4,356,443 | 10/1982 | Emery ............................ 324/520 X |
| 4,491,782 | 1/1985 | Bellis et al. |
| 4,499,417 | 2/1985 | Wright et al. |
| 4,887,041 | 12/1989 | Mashikian et al. |

OTHER PUBLICATIONS

"Fundamental Limitations In The Measurement of Corona and Partial Discharge", S. A. Boggs et al, IEEE Transactions On Electrical Insulation vol. EI-17 No. 2, Apr. 1982.

"A New Method for Detection and Location of Distributed Partial Discharges (Cable Faults) in High Voltage Cables Under External Interference", M. Beyer et al, IEEE Transaction on Power Apparatus and Systems, vol. PAS 101, No. 9, Sep. 1982.

"Digital Location of Partial Discharges in HV Cables", H. Borsi, IEEE Transactions on Electrical Insulatoin, vol. 27, No. 1, Feb. 1992.

"Location of Small Discharges in Plastics Insulated High Voltage Cables", L. Wierings, IEEE Transaction on Power Apparatus and Systems, vol. PAS 104, No. 1, Jan. 1985.

"Improvements in the Instrumentation for Partial Discharge Locations in Cables", W. L. Weeks et al, IEEE Transactions on Power Apparatus and Systems, vol. PAS 104, No. 4, Apr. 1985.

*Primary Examiner*—Kenneth A. Wieder
*Assistant Examiner*—Glenn W. Brown

[57] ABSTRACT

A method and apparatus for locating an incipient fault at a point along the length of an insulated power line includes the application of an excitation voltage at an open end of the power line, and the signal pulse transmitted along the power line to the open end is passed through a high pass filter to remove the portion of the signal which is at a frequency below the excitation voltage and its harmonics. The filtered signal is amplified and passed through a band pass filter to remove a high frequency portion of the signal containing a large proportion of noise relative to the frequency of the partial discharge frequency from the incipient fault. This filtered signal is passed to a digital storage device adapted to be triggered by a signal of a predetermined amplitude, and the triggered digital storage device receives the amplified signal directly from the amplifier and stores digital data concerning amplitude and time for the peaks of the amplified signal for a predetermined period of time. The stored digital data is processed to identify the peaks reflecting the point of partial discharge in the power line.

34 Claims, 61 Drawing Sheets

FRONT PANEL

OPEN LOOP GAIN K
0.000E0

ROUDTRIP TIME DELAY DELTA
0

SIMULATED SIGNAL
0  0.000E0

OUTPUT ARRAY LENGTH
0

ROUDTRIP TRANSFER FUNCTION
0  0.000E0

BLOCK DIAGRAM

```
/*
 * SUBROUTIN FOR PDMODEL(SUB).VI
 *
 * LABVIEW CIN PROGRAM -- THINK C
 *
 */

TYPEDEF LONG INT32;
TYPEDEF SHORT DOUBLE FLOAT64;
TYPEDEF INT INT16;

#INCLUDE "PDMODEL(SUB).H"

PASCAL      VOID CININIT () {}
PASCAL      VOID CINDISPOSE () {}
PASCAL      VOID CINABORT () {}
PASCAL      VOID CINRUN (K, DELTA, N, X, Y)
            TD1HDL      X, Y;
            INT16       *N, *DELTA;
            FLOAT64     *K;
            {
            INT16       n, K, M, L, D;
            TD1         *PY, *PX;
            FLOAT64     G1[1024], *PG1, Y1[2000], *PY1;

SETHANDLESIZE (Y, (*N) * SIZEOF (FLOAT64) + SIZEOF (INT32));

PX=*X;
            M=PX->DIMSIZE;
            PY=*Y;
            PY->DIMSIZE = *N;
            L=*N; D=*DELTA;

PG1=G1; PY1=Y1;
            FOR (n=0; n<(L+D); n++) {
                    PY1[n]=0; PG1[n]=0;
                    IF ((n-D)>=0) {
                            FOR (K=D; K<=n; K++) {
                                    IF ((n-K)<M)
                                            PG1[n]=PG1[n] + (PY1[K-D] * PX->ARG1[n-K]);
                                    }
                            IF ((n-D)<D)
                                    PY1[n]=*K * (PX->ARG1[n-D] + PG1[n]);
                            ELSE PY1[n]=*K * PG1[n];
                            }
                    }

FOR (n=D; n<(L+D); n++)
                    PY->ARG1[n-D] = PY1[n] / *K;
            }

PASCAL      VOID CINLOAD () {}
PASCAL      VOID CINSAVE () {}
```

FIG. 18C

```
/*
 * CODE INTERFACE NODE HEADER FILE
 */

/*
 * TYPEDEFS
 */

TYPEDEF STRUCT {
      INT32 DIMSIZE;
      FLOAT64 ARG1[];
} TD1;
TYPEDEF TD1 **TD1HDL;

/*
 * CODE INTERFACE NODE PROTOTYPES:
 */

PASCAL VOID CININIT(VOID);
PASCAL VOID CINDISPOSE(VOID);
PASCAL VOID CINABORT(VOID);
PASCAL VOID CINRUN(FLOAT64 *INPUT1, INT16 *INPUT2, INT16 *INPUT3,
TD1HDL INPUT4, TD1HDL OUTPUT1);
PASCAL VOID CINLOAD(VOID);
PASCAL VOID CINSAVE(VOID);
```

FIG. 18D

FRONT PANEL

STARTING POINT
[0]

DATA LENGTH
[0]

STEP
[0]

NEW FOLDER NAME
[ ]

FILE NUMBER
[0.00]

TIME OFFSET
[0.00]

TIME NORMALIZER
[0.00]

OUTPUT ARRAY
[0] [0.00]

FIGURE 22 (L)

FRONT PANEL

| THE 1ST ZERO CROSSING | DISTANCE |
| 0 | 0 |

THE 2ND ZERO CROSSING
0

ARRAY SIZE
0

INPUT ARRAY
| 0 | 0.00 |

OUTPUT ARRAY 1
| 0 | 0.00 |

OUTPUT ARRAY 2
| 0 | 0.00 |

FIGURE 23 (F)

METHOD AND APPARATUS FOR THE DETECTION AND LOCATION OF FAULTS AND PARTIAL DISCHARGES IN SHIELDED CABLES

BACKGROUND OF THE INVENTION

The present invention relates to methods and apparatus for locating incipient faults in electric power distribution cables.

As discussed at length in U.S. Pat. No. 4,887,041 granted Dec. 12, 1989 to Matthew S. Mashikian, Robert B. Northrop, Rajeev Bansal and Chrysostomos L. Nikias and entitled "Method and Instrumentation for the Detection, Location and Characterization of Partial Discharges and Faults in Electric Power Cables", insulated underground power cables are extensively used to distribute electrical energy. Power cables which are used at elevated voltages, basically consist of a central conductor surrounded by a thin concentric layer of a semi-conducting material which is referred to as a conductor shield, a concentric layer of insulating material such as oil impregnated paper, polyethylene, or other polymer, and a second concentric semi-conducting layer referred to as an insulation shield, and a metal conductor applied in the form of a thin helically wound concentric cylindrical wires or flat strips which provide a ground or neutral. This assembly may be covered by a thin electrically insulating jacket. Power cables designed to operate below three thousand volts and communication cables may omit semi-conducting shields and neutrals.

As discussed in the aforementioned patent, such insulated cables are intended to operate safely and effectively over lifespans exceeding thirty years. However, because of manufacturing defects, installation errors, or aging under adverse conditions, cables may develop incipient faults which are evidenced by a "partial discharge" (PD) at the point of the incipient fault. Because of a defect developing within or adjacent to the insulation of a cable, intermittent arcing (partial discharge) occurs within the insulation. As used herein, the term "incipient fault" refers to a fault within the cable which will not cause immediate failure but which may lead to eventual failure, and the term "partial discharge" refers to the intermittent arcing which will occur at such a point particularly when a large excitation voltage is applied to the line. The energy involved in this partial discharge is extremely small, and, depending upon the type of insulating material, localized deterioration of the material occurs. Eventually, such incipient faults will produce a complete breakdown of the cable. Should this occur during a critical period, such as during a period of peak demand, there can be considerable customer inconvenience.

The location of faults in power lines has been the subject matter of prior patents and various technical papers. U.S. Pat. No. 2,628,267 measures the time of arrival of surge currents and reflections emanating from a ground along the cable. U.S. Pat. Nos. 3,244,975 and 3,255,406 disclose what is referred to as an impulse reflection method of testing cables where the time difference of detection of transmitted and reflected pulses are measured to determine fault location. U.S. Pat. No. 4,104,582 measures the time by clocking a counter. U.S. Pat. No. 4,491,782 discloses a technique of recording impulse reflection where impulse reflection signals are measured during normal operation and also under fault conditions, and it makes a comparison after fault occurs to determine the location of the fault in a cable.

In the aforementioned Mashikian et al U.S. Pat. No. 4,887,041, there is disclosed apparatus and methods for locating an incipient fault along a power transmission line using filters and amplification to modify the high frequency pulses on the line resulting from an excitation voltage and these modified pulses are converted into digital data interpreted by a computer to locate the point of the incipient fault along the length of the power line. Although this method and apparatus is effective, electrical noise in some installations may generate signals which are greater in amplitude than the signals from the fault and produce unreliable triggering of the digital storage oscilloscope used to record the data. In residential communities where underground electric power distribution cables are most widely used, electrical noise occurring within the frequency spectrum of the PD signals is predominantly from amplitude modulated (AM) radio broadcasts (550–1650 kHz). If the signal to noise ratio is not sufficiently high, the apparatus and method of the Mashikian et al Patent has not been uniformly reliable.

It is an object of the present invention to provide a novel method for detecting and approximating the position of an incipient fault in an electrical power transmission line wherein there may be substantial electrical noise.

It is also an object to provide such a method which will function effectively in environments which produce electrical noise signals of greater strength than the signals generated by the incipient fault.

Another object is to provide a method which is nondestructive, rapidly employed and reasonably accurate.

A further object is to provide novel apparatus for practicing the method which is relatively easily transported and operated.

SUMMARY OF THE INVENTION

It has now been found that the foregoing and related objects may be readily attained in a method for locating an incipient fault at a point along the length of an insulated power line which includes the steps of applying an excitation voltage at an open end of the power line and passing the signal pulse transmitted along the power line to the open end through a high pass filter to remove the portion of the signal which is at a frequency below the excitation voltage and its harmonics. The filtered signal is amplified and passed through a band pass filter to remove a high frequency portion of the signal containing a large proportion of noise relative to the partial discharge frequency signal occupying the same.

The filtered signal from the band pass filter is passed to a digital storage device adapted to be triggered by a signal of a predetermined amplitude. When triggered by a filtered signal of at least the predetermined amplitude, the triggered digital storage device receives the amplified signal directly from the amplifier and storing digital data concerning amplitude and time for the peaks of the amplified signal for a predetermined period of time. The stored digital data is processed to identify the peaks reflecting the point of partial discharge in the power line.

In one embodiment, the digital storage device is triggered by a multiplicity of times to store data from a predetermined number of discrete triggered time periods, and the processor processes the data from the predetermined number of periods.

Generally, the band pass filter removes the portion of the signal above about 450 kHz. The digital storage device, upon triggering, is operative to record data in that portion of the amplified signal which has passed through the band pass filter to produce the triggering signal. Usually, the amplified signal entering the digital storage device is time delayed to enable the triggering signal to trigger the digital storage device.

The processing step includes the alignment of the first peaks of the stored data for the number of triggered time periods, and the stored data concerning amplitude for the peaks at the same time periods is averaged to identify the peaks and time for the signals of the point of incipient fault.

Generally, the triggering signal from the amplifier has rounded peaks of reduced amplitude, and the processing step includes the estimation of the peak of the signal prior to rounding. The estimation desirably employs second order equations for increase and decay of the signal amplitude.

The processing determines the time location of an initial series of at least two peaks, and preferably three peaks. The processed data is further processed to estimate the position of the point of partial discharge along the length of the power line.

Desirably, there is included an initial step of injesting an artificial partial discharge signal at one open end of the power line and processing the signal received at the same end of the power line after multiple reflections at both ends to produce a mathematical model simulating a partial discharge input at the one end for the simulation of a partial discharge at any point along the length of the power line. The step of processing of the digital data from the digital storage device analyzes the stored digital data and the mathematical model to estimate the point of the partial discharge.

In residential areas, the power line carries current at 60 Hertz and the high pass filter removes that portion of the signal which is below about 10 kHz.

Preferably, the predetermined number of time periods is at least 25, and the time periods are at least about 5 microseconds.

Desirably, the method may also include the steps of applying an excitation voltage at one end of the insulated power line, and placing a pulse receiver at a point along the length of the power line spaced a known lineal distance form the one end. The signal generated by the excitation voltage is received and processed to obtain data reflecting amplitude and time of signal peaks corresponding to the known distance. The data obtained from the known distance processing is compared with the stored data reflecting the point of partial discharge to indicate the relative position of the point of partial discharge.

Alternatively, the method may also include the steps of placing a pulse receiver at the open end of the power line and applying an excitation voltage at a point along the length of the power line spaced a known lineal distance form the open end thereof. The signal generated by the excitation voltage is received and processed to obtain data reflecting amplitude and time of signal peaks corresponding to the known distance. The digital data obtained from the known distance processing is compared with the stored digital data reflecting the point of partial discharge to indicate the relative position of the point of partial discharge.

In addition, the method may include the steps of preliminarily applying an excitation voltage of zero to the line and amplifying the signal pulse received at the open end. The amplified signal pulse is analyzed to evaluate its frequency components. The frequencies obtained from the evaluation of the signal pulse using the zero excitation voltage are utilized to establish the frequencies to be set in digital notch filters from the signal. These frequencies may be used to adjust the parameters in the processing of the digitally stored data to create adaptively digital notch filtering of the stored data during processing to eliminate digitally the undesirable frequencies.

The apparatus for locating an incipient fault at a point along the length of an insulated power line includes (a) means for applying an excitation voltage at an open end of the power line, and (b) means for receiving and analyzing a signal pulse transmitted along the power line to the open end. This receiving and analyzing means includes (i) a high pass filter to remove the portion of the signal pulse which is at a frequency below the excitation voltage and its harmonics, (ii) an amplifier for the filtered signal, (iii) a band pass filter to remove a high frequency portion of the amplified signal containing a large proportion of noise relative to the frequency of the partial discharge signal occupying the same frequency band, and (iv) a digital storage device adapted to be triggered by a signal of a predetermined amplitude from the band pass filter, and, when triggered the device receives the amplified signal directly from the amplifier and stores digital data concerning amplitude and time for the peaks of the amplified signal for a predetermined period of time. The apparatus also includes a processor for processing the stored digital data to identify the peaks reflecting the point of partial discharge in the power line.

In a preferred embodiment, the apparatus includes control means to permit triggering of the storage device from a predetermined number of discrete triggered time periods, and storage of the data therefrom. The processor processes the data from the predetermined number of periods.

DETAILED DESCRIPTION OF THE PREFERRED EMBODIMENT

Figure 1:
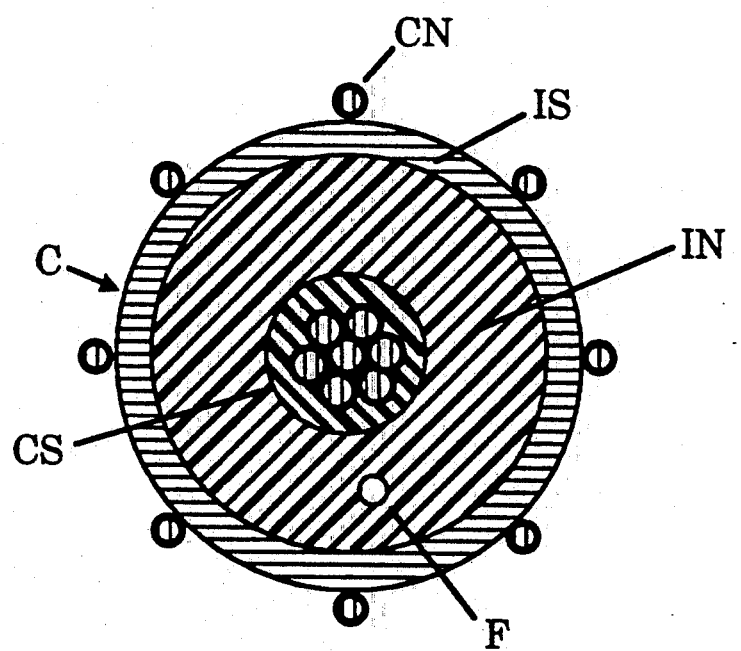
FIG. 1 is a cross sectional view of a typical inground cable and diagrammatically illustrating a fault within the insulation.

In the aforementioned Mashikian et al U.S. Pat. No. 4,887,041, there has been described in detail apparatus for generating an excitation signal and processing the signal which is detected in the power line following the excitation signal. This allows identification of the peaks evidencing a partial discharge and thereby permits location of the point of the partial discharge along the length of the power line. The relevant theories and basic structure are disclosed in the patent and incorporated herein by reference, and the following description will concentrate on the developments which enable operation of this type of system under conditions of high electrical noise.

In accordance with the present invention, the signal received at the open end of the line at which the excitation voltage is applied, filtered, amplified and passed through a band pass filter which is operative to remove a substantial amount of the electrical noise. This provides a signal which functions as an external trigger for a digital storage oscilloscope (DSO) which analyzes and records the data relating to amplitude and time for the amplified pulse passing therethrough. When the oscilloscope is triggered by a signal which is of a predetermined amplitude, the DSO records the data relating to the amplified signal for a finite period of time, and this process may be repeated to record data from a relatively large number of discrete periods. This data is then processed to minimize the effect of the noise and to identify the peaks reflecting the point of partial discharge. This data is then processed further in a manner generally similar to that in the prior Mashikian et al Patent to locate the point of the incipient fault along the length of the power line.

When the partial discharge (PD) signal level is significantly higher than the noise level prevailing at the test site, the internal trigger and the signal averaging routine of the digital storage oscilloscope (DSO) can be used successfully to capture and enhance the PD waveforms. However, when the PD signals are weaker than the noise, the internal trigger may not operate reliably.

As indicated previously, the ambient noise in residential neighborhoods is dominated by AM broadcast signals and, therefore, is the strongest in the 550–1650 kHz band. A Fourier analysis of a typical PD signal indicates that this signal has a substantial amount of its power in the frequency range below 500 kHz as well as in the frequency range above 1,650 kHz. As a result, it has been found that the apparatus can discriminate between the PD signal and this noise component by use of a band pass filter with a pass band of 10–450 kHz, and an adjustable gain of 5–20. A significant portion of the PD signal power can be passed through the filter to the DSO while the unwanted AM broadcast frequency components as well as the 60 Hz high voltage signal (and its harmonics) are substantially attenuated. In this way, the DSO is triggered only by actual PD signals and not by noise. Once triggered, the DSO records data relevant to the entire unattenuated amplified signal including the portion which provided the triggering signal.

Turning first to FIG. 1, this illustrates a typical in-ground cable cross section. The cable C comprises a central stranded conductor SC surrounded by a thin concentric layer of semi-conducting material known as a conductor shield CS, and an insulating material IN such as oil impregnated paper, polyethylene, or other polymers. The insulation IN is covered by a second concentric semi-conducting layer, termed an insulation shield IS, over which a metal conductor is applied in the form of a thin tape, helically wound concentric cylindrical wires, or flat straps identified by the reference CN. FIG. 1 also diagrammatically illustrates an incipient fault F in the cable insulation IN.

Figure 2:
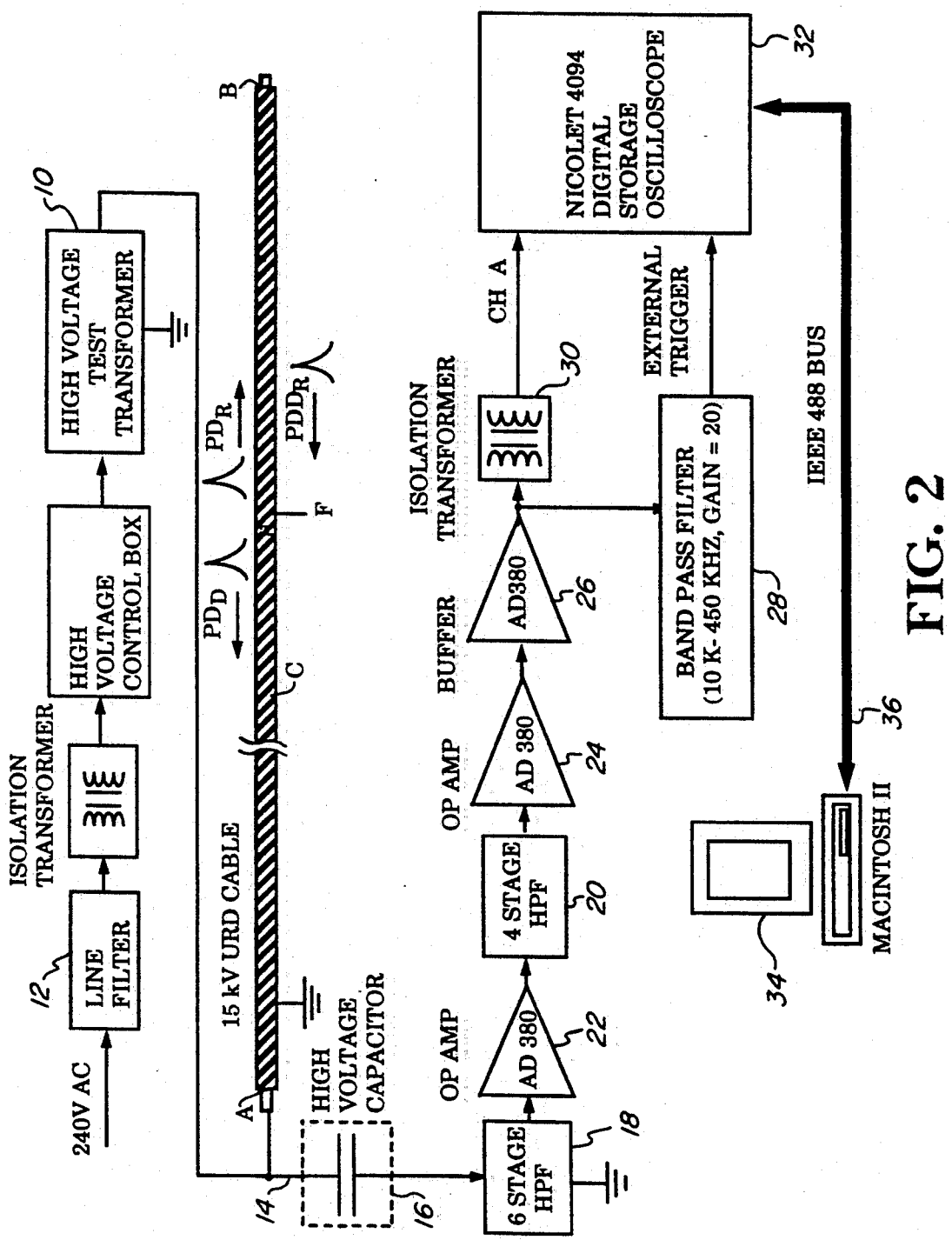
FIG. 2 is a schematic illustration of apparatus embodying the present invention as applied to a diagrammatically illustrated cable.

Turning next to FIG. 2, therein schematically illustrated is apparatus for operation in accordance with the present invention applied to a representation of a cable C having ends A and B. Assuming there is an incipient fault or defect in the cable denoted by the reference character F and a partial discharge occurs. This will produce a pulse with frequencies exceeding 5000 kHz which will travel in two directions, and it must be considered as a plurality of pulses which are designated as $PD_D$ and $PD_R$. Pulse $PD_D$ will also be reflected to end B and then reflected as a pulse $PD_{DR}$ back toward end A. The time difference in the receipt of these three pulses at end A is utilized to calculate the location of the fault, as will hereinafter be explained.

As excitation voltage is applied to end A of cable C from a parallel resonant transformer 10. The voltage applied to the end A of cable C is termed "excitation voltage". When end B is open, the excitation voltage will be normally at or below the level of the normal line voltage to avoid harming the cable insulation. However, if desired, a higher voltage may be employed. It is not necessary to open end B if it is suitably terminated to reflect high frequency pulses, and the excitation voltage is normal line voltage. A transformer presents a high impedance and will reflect partial discharge signals. Preferably, a low pass filter 12 is inserted in primary side of transformer 10 to reduce power line spikes such as may be generated by silicon controlled rectifiers.

When the cable C is excited with the excitation voltage, and a partial discharge occurs, there will be current pulses transmitted in its conductors CN. These pulses are of a high frequency and will travel on the conductors CN. At end A, these pulses are passed through the line 14 and capacitor 16, and thence through the high pass filters 18, 20 and amplifiers 22, 24. The filtered and amplified signal is then passed through a buffer 26 and split in dual paths to the band pass filter 28 and isolation transformer 30.

The filtered signal exciting the band pass filter 28 passes to the digital storage oscilloscope (DSO) 32, and, if it contains pulses of a predetermined magnitude, it will trigger operation of the DSO 30. The DSO 32 then functions to record the data concerning amplitude and time in the amplified signal supplied to it through the isolation transformer 30. The DSO 32 will typically discretely record such data for a short period of 5-20 microseconds, and then be retriggered for additional periods. The DSO 32 communicates with a microcomputer 34 to process the data stored in DSO 32, as will be described hereinafter. It will graphically display the lineal distance to the detected incipient fault.

A Model 4094A DSO manufactured by Nicolet Corporation of Madison, Wisconsin utilized in practice of the invention, is capable of digitizing the analog partial discharge signals. This Nicolet DSO, in addition to having a high resolution waveform digitizer, has a memory buffer, a general purpose instrumentation bus interface 36 to communicate with microcomputer 34, a trigger generator, and the ability to communicate with a microcomputer to supply data for computations. In addition, the DSO 32 is able to perform Fourier frequency spectrum analysis. The trigger of the DSO 32 is electronically coupled to the output of the band pass filter 28. The microcomputer 34 is a Macintosh II or equivalent, or a higher grade microcomputer.

Figure 3:
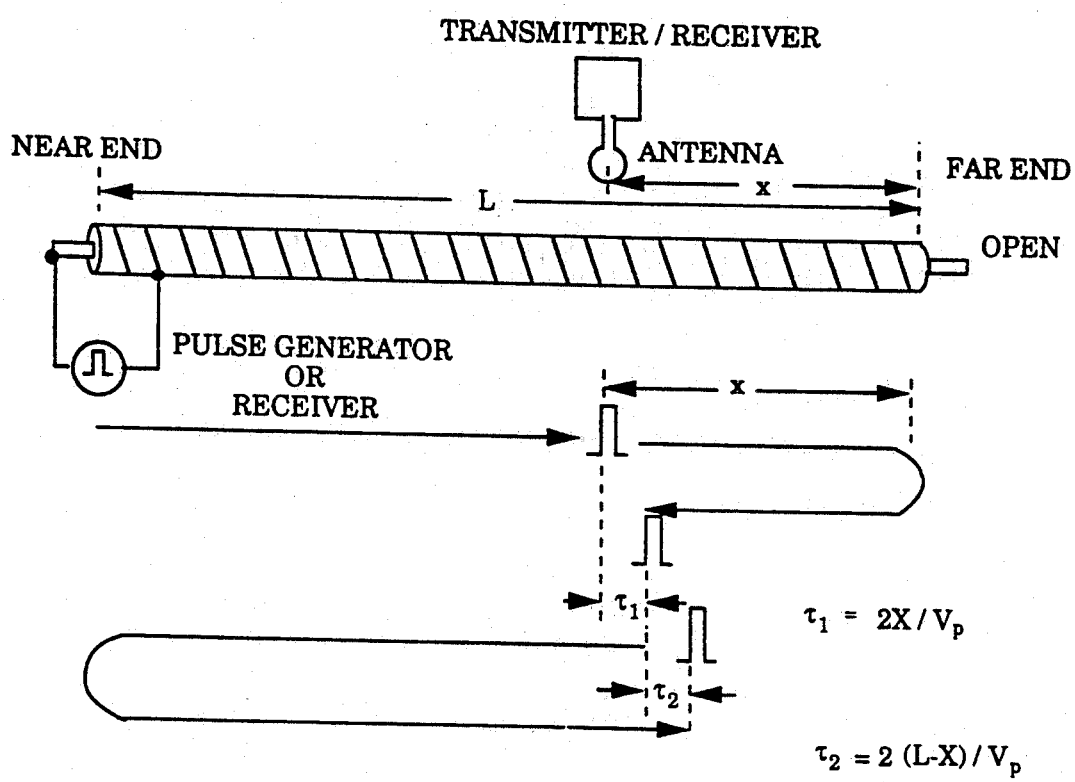
FIG. 3 is a schematic illustration of the method of the present invention for calibrating a position along the length of a cable by a transmitter or receiver.

However, when a cable is buried in a trench, the length of the cable may be longer than the trench due to undulations or "snaking" of the cable in the trench when it is laid. Although the distance to the location of the position of a fault in the cable may be detected by the apparatus in terms of cable length, this position may not correspond to the same linear length of the trench. The length of the trench has previously been recorded by the utility company or cable installer and is data of record. For example, if one assumes that a pulse discharge site is located at approximately seventy-five percent of the cable length from end point A, a small test hole may be dug in the ground at this assumed percentage of the trench length until the cable C is uncovered. This position of the cable is generally different from the seventy-five percent cable length position sought. To determine the exact position of this location with respect to the cable length, a non-destructive electrical signal is injected into the cable C. As indicated in FIG. 3, this may be effected by remotely inducing a propagating electromagnetic wave between the cable outer electrode and earth by means of an antenna-like device located at this point, or by introducing an electric pulse between the cable outer electrode and ground at one of the cable terminals and monitoring, through a remote antenna, its passage at the location investigated.

This signal is induced in the neutral conductors CN and travels both directions along the cable behaving exactly like a pulse discharge signal. A succession of pulses similar to the PD pulses are received and these may be amplified and recorded by the digital storage oscilloscope 32. The position along the trench in percent of cable length is determined by dividing the time between the current pulses by the distance between the pulses.

This information may now be incorporated into the analysis provided by the microprocessor which now has:

1. The length along the cable C from point A to the partial discharge site F.
2. The length along the cable C from point A where the calibrator antenna was located.
3. The length along the trench from point A to the point where the calibrator antenna was located.

Figure 4:
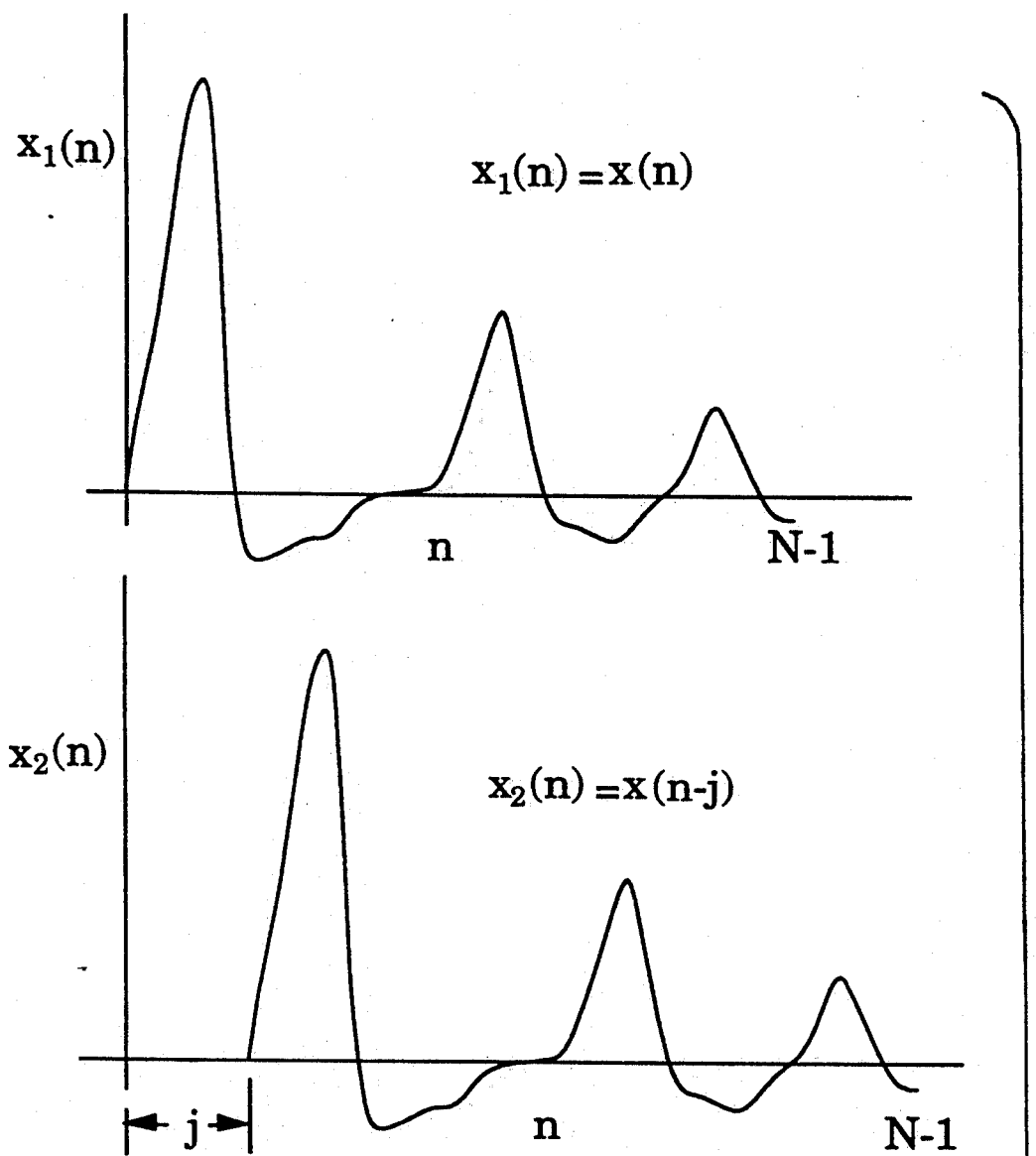
FIG. 4 schematically illustrates the time shifting effect used for correlation of the peaks of signals in discretely recorded time periods.
Figure 7:
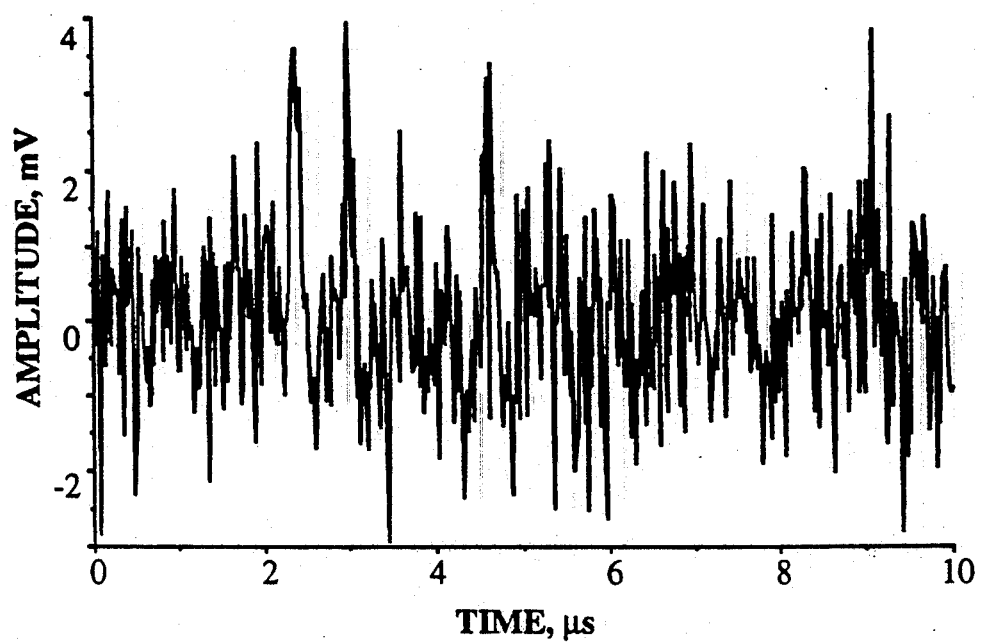
FIG. 7 is an oscilloscope tracing of the signal of FIG. 5 mixed with 100% of the noise shown in FIG. 6.
Figure 8:
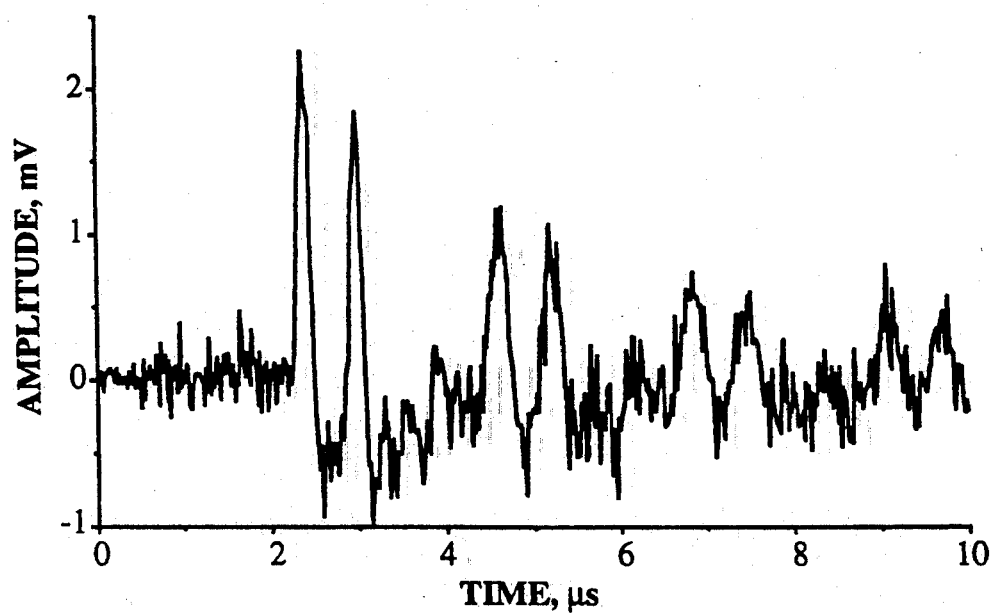
FIG. 8 is a schematic oscilloscope tracing of the partial discharge signal recovered after averaging a multiplicity of noisy signals of the type seen in FIG. 7 by use of the present invention.

If the noise spectrum is relatively broad, the filtered waveform from the band pass filter may be attenuated and rounded due to the removal of frequency components by the filters. In such a case, it is not possible to use the built in signal averaging algorithm directly to enhance signal to noise ratio (SNR) for detection and location. In the method of the present invention, individual frames of 2-10 microseconds duration are recorded and filtered. Then the first of these frames is treated as a reference template. Every other frame is cross correlated with the reference frame, one at a time. In each instance, the maximum of the cross correlation function is sought to determine the amount each frame must be time shifted so that all the subsequent frames can be lined up with the initial reference frame. Once the frames have been lined up, they can be averaged together to reduce noise from the recorded waveform and to "peak" the PD signals. The procedure has been used successfully for averaging 30-100 filtered waveforms. The mathematical steps are outlined in FIG. 4 and typical results are displayed in FIGS. 5-8. In FIG. 7, it is very difficult to discriminate between the PD signal and the noise but the use of the external trigger with the new signal averaging scheme allows the recovery of the PD signal from the original noisy background seen in FIG. 8.

Another method for reducing the obscuring effect of the environmental noise makes use of an adaptive digital notch filtering system. In this method, the instrumentation functions as follows:

First, the excitation voltage is reduced to zero, thus not allowing any partial discharge signal to exit. Therefore, the signal recorded by DSO 32 represents essentially the environmental noise, such as AM broadcast noise. The Fourier analysis capability of the DSO 32 is then used to determine the prominent frequencies in this noise which need to be eliminated. This information is utilized to set up automatically the parameters of a digital notch filtering program existing in the software repertoire of the DSO 32. The digital notch filters are adaptively adjusted to remove the offending noise frequencies.

After the digital parameters are set in the DSO 32, the excitation voltage is increased until a partial discharge signal is detected. The method for triggering the DSO 32 under high noise conditions by means of the signal processed through the band pass filter 30 has been described previously. The DSO 32 now captures and digitizes a partial discharge signal mixed with noise. Instead of repeating the process over 30 times and averaging the signals as described previously, this method allows the noisy signal to be processed by the adaptive digital filter which has been previously adjusted to the prevailing ambient conditions. The result of this process is a substantial elimination of the noise, leaving a clear partial discharge signal to be further analyzed by the microcomputer.

Although the technique described previously is practically applicable for field use, it does require operator intervention to select the frequencies to be eliminated. A more general adaptive technique has been developed to circumvent this drawback and, at the same time, make use of the transfer function of the cable for added accuracy.

The first step consists in obtaining, in situ, the traveling wave characteristics of the cable by injecting a narrow (almost an impulse) voltage pulse, a few volts in amplitude, at the measuring end of the cable as described in Mashikian et al U.S. Pat. No. 4,887,041.

Figure 9:
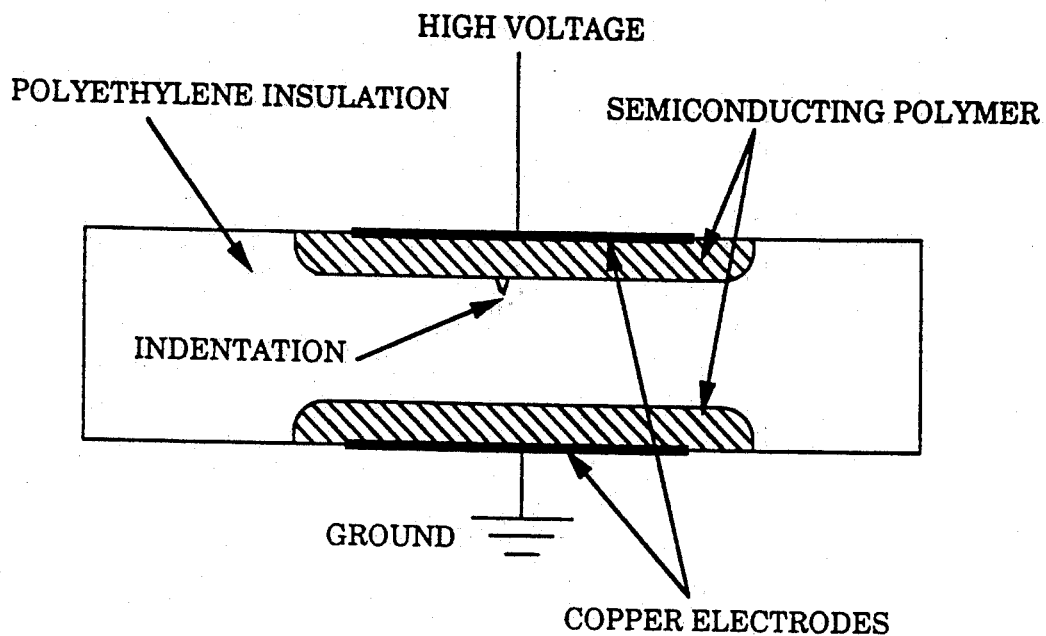
FIG. 9 is a schematic illustration of a partial discharge cell utilized in the methods of the present invention.
Figure 10:
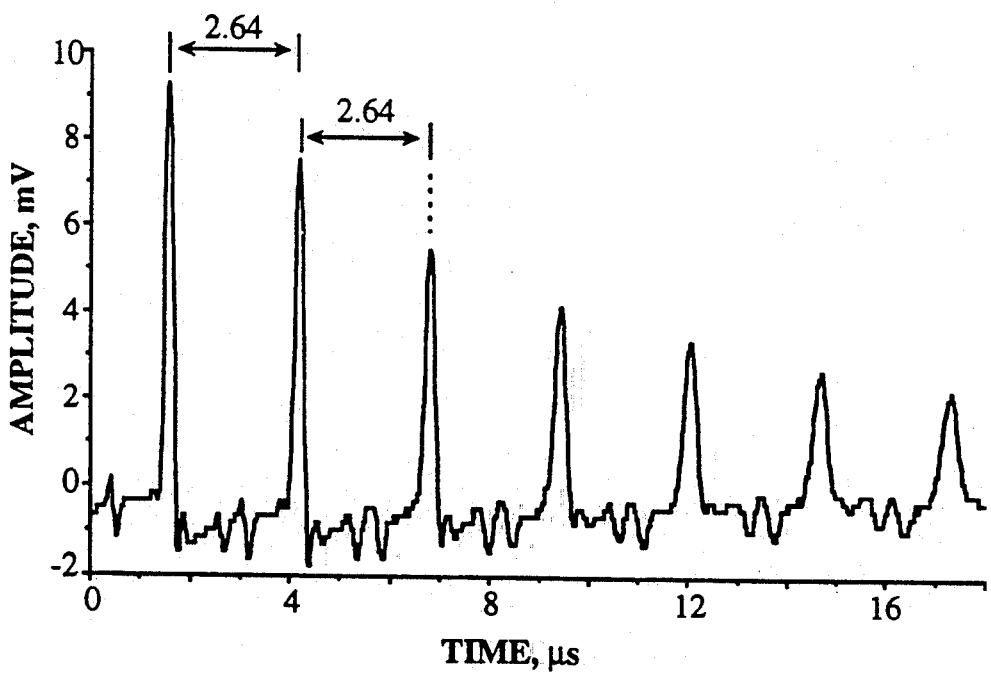
FIG. 10 is a schematic illustration of the signal reflecting partial discharge pulses from the DOE terminal of FIG. 9 after repeated reflections from both ends of the cable.

Alternatively, this may be done by a technique in which a specially designed defective insulation system (the DOE PD cell) serves the same function as the pulse generator used before for injecting pulses. The DOE PD cell shown in FIG. 9 consists of a shaped polyethylene disk between two copper disks. When the DOE PD cell is placed at the cable terminal and the cable is excited at a moderate power frequency voltage (around 2 kV), a PD occurs in the DOE cell and travels back and forth along the cable, giving rise to a sequence of wavelets as shown in FIG. 10. The distance between two consecutive wavelets is proportional to twice the length of the cable. If h(t,2L) is the impulse response to the full cable length L for one round trip of the signal, the sequence shown in FIG. 10 is given by g(t,2L) represented in the block diagram of FIG. 11.

Therefore, one wavelet is represented by h(t,2L). If H($\omega$2L) represents the Fourier Transform of h(t,2L), then the transforms of two consecutive wavelets will be related by:

$$H_2(\omega,2L) = H_1(\omega,2L)e^{-2\gamma(\omega)L}$$

where the propagation constant $\gamma(\omega)$ is given by:

$$\gamma(\omega) = \alpha(\omega) + j\beta(\omega)$$

Figure 11:
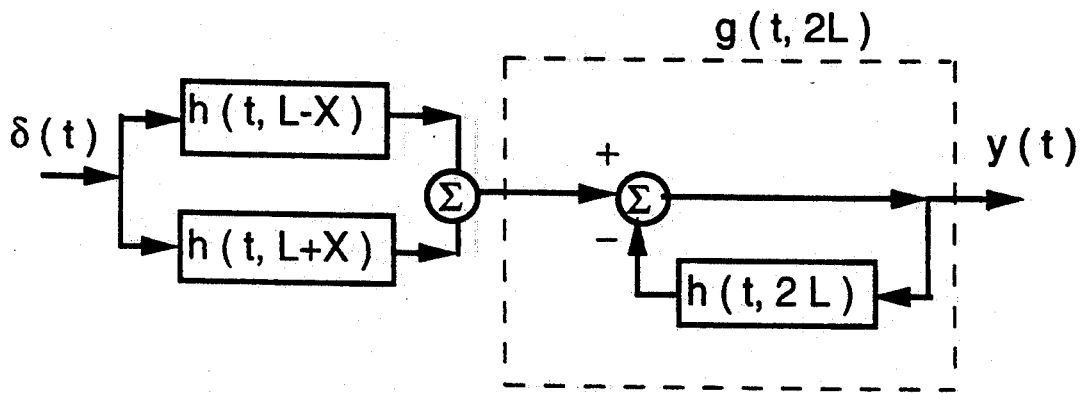
FIG. 11 is a block diagram illustrating the pulse propagation and reflection in the cable.

The quantities of $\alpha(\omega)$ and $\beta(\omega)$ a the frequency dependent attenuation and phase constants of the cable and are readily determined, in situ, by analyzing any two consecutive wavelets as shown in FIG. 10. If a partial discharge occurs at a distance x from the remote end of the cable, the initial two consecutive wavelets recorded at the measuring end will be described by the impulse responses h(t,L−x) and h(t,L+x), as shown in FIG. 11. These, then are subjected to repeated reflections through the cables according to g(t,2L). This technique was used to model the actual response of FIG. 12 and is shown as FIG. 13. For all practical purposes, the two responses can be perfectly overlapped.

Knowing $\alpha(\omega)$, $\beta(\omega)$ and h(t,2L), the response of a partial discharge occurring at any arbitrary location x can be reconstructed through the model of FIG. 11. This requires the use of an inverse Fourier transformation. As all the calculations are performed digitally, the Z-transform equivalents of the expressions formerly introduced are utilized. The signal obtained with each assumed location x is now cross correlated with the actual noisy signal which is recorded. The exact location x of the PD is that which maximizes the cross correlation function.

This methodology has been used to recover the original PD signal when it was mixed with different levels of noise. The noise level was increased in steps from zero to ten (10) times its base value, and this was then added to the base PD signal to simulate measurements in environments of increasing levels of noise. The original signal was then reconstructed using the technique previously described. As an illustration, the PD signal was added to seven (7) times the noise. The PD signal was literally buried in noise and impossible to readily detect. Application of the method previously described reproduced the original signal. The location of the point of partial discharge, as a percentage of total cable length, was determined within 0.05 percent error.

To improve the accuracy and the robustness of the cable modeling technique described above, additional techniques may be employed.

Figure 14:
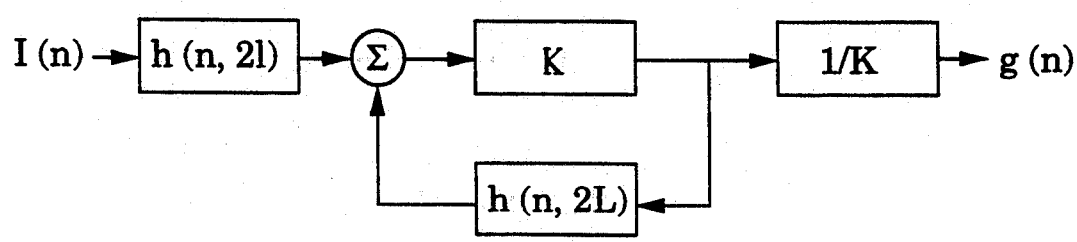
FIG. 14 is a refined model for an open circuited cable of a length L.
Figure 15:
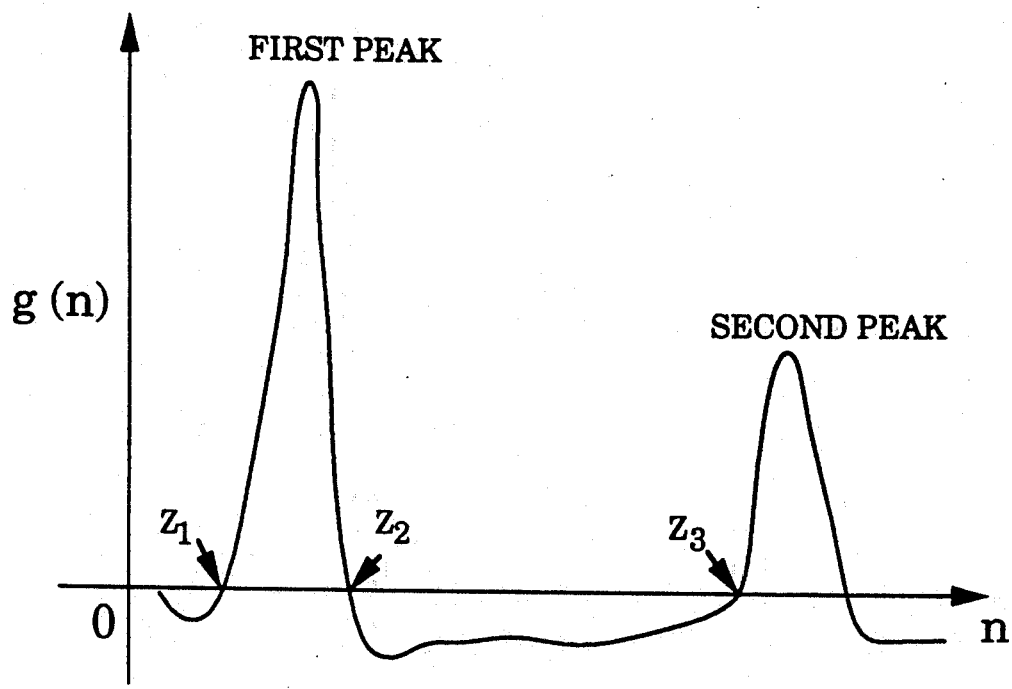
FIG. 15 is an illustration of the discretized record of the first two pulses from the cable.

The impulse response g(t,2L) of an open circuited cable length L was modeled earlier by the block diagram of FIG. 11. To make the model stable under diverse conditions, the mode) is refined by incorporating an adjustable parameter open loop gain K, as shown in FIG. 14. In its discrete version (Z transform domain), the cable response g(n) can be expressed as $$g(n) = h(n-\Delta,2L) + K \cdot g(n-\Delta)^* h(n,2L)$$

where h(n,2L) is the roundtrip cable transfer function, $\Delta$ is the roundtrip time delay, and * represents the convolution operation.

The parameters K and $\Delta$ are estimated by using a new adaptive method.

Finding K: The LMS (least mean squared error) learning law is used for determining K $$K_{i+1} = K_i + \alpha \delta_i$$

where $K_i$ is the previous value, $K_{i+1}$ is the new estimate, and is the suitably chosen constant If d(n) is the actual measured response of the cable, the following definitions may be employed $$d'(n) = d(n) - H(n-\Delta,2L)$$

and $$g'(n) = Kg(n-\Delta)^* h(n,2L)$$

Now $\delta_i$ can be determined as $$\delta_i = \sqrt{\Sigma\, d'(n)^2} - \sqrt{\Sigma\, g'(n)^2}$$

Finding $\Delta$:

A cross correlation coefficient may be defined as follows:

$$pdg = \frac{\Sigma\, d(n)g(n)}{[\Sigma\, g(n)^2 \cdot \Sigma\, d(n)^2]^{1/2}}$$

The measured data provides an estimate $\Delta_o$ for the round trip delay $\Delta$. In this technique, $\Delta_o$ is an overestimate of $\Delta$, i.e., $\Delta_o$ is slightly larger than the real value of $\Delta_r$ of the round trip time delay.

Therefore, for the range $$\Delta = \Delta_0 \text{ to } \Delta = \Delta_0 - \frac{\Delta_0}{5},$$

the computation is: $g_i(n) = h(n-\Delta_i,2L) + Kg(n-\Delta_i)^* h(n,2L)$ with $\Delta_{i+1} = \Delta_i - 1$ and, in each instance, the computation of $P_{DG1} \cdot \Delta_r$ is the value of $\Delta$ which corresponds to the maximum value of the cross correlation coefficient.

Figure 5:
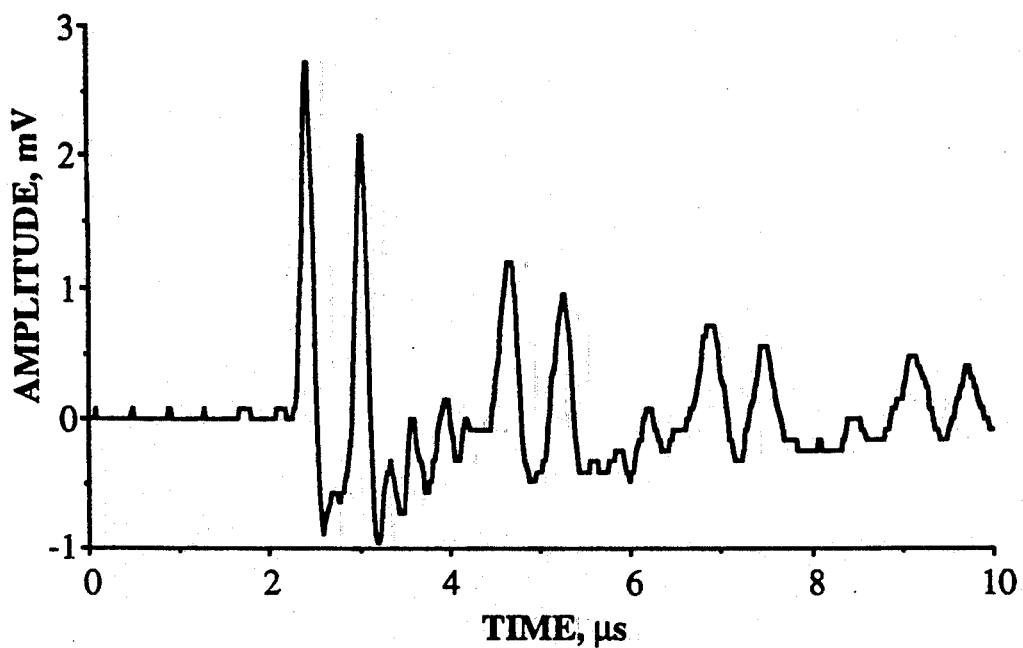
FIG. 5 is an oscilloscope tracing of a partial discharge signal recorded under low noise conditions.
Figure 6:
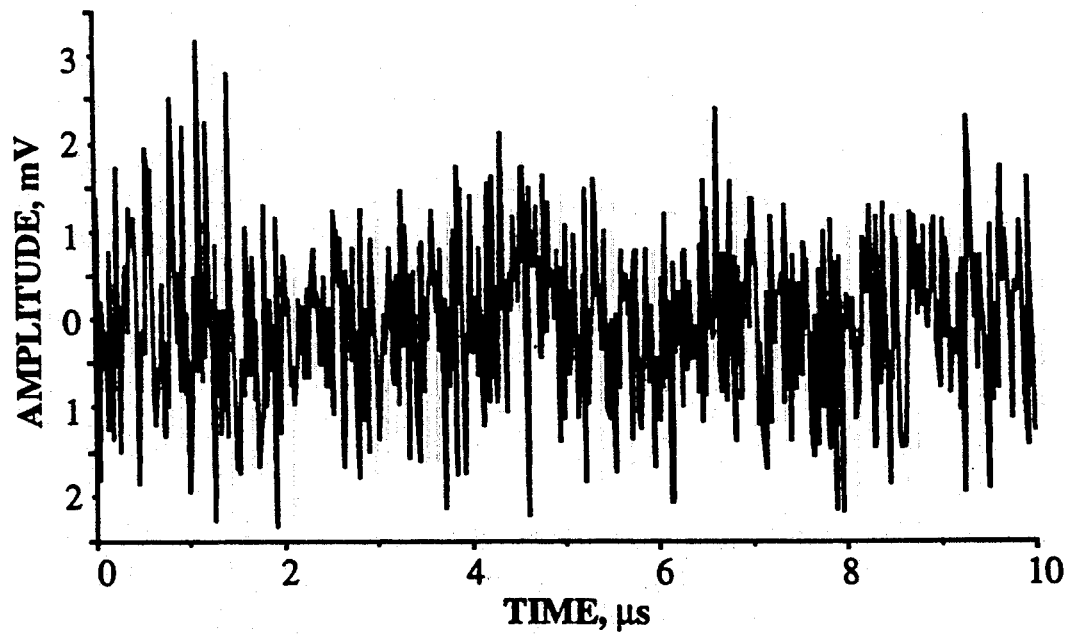
FIG. 6 is an oscilloscope tracing of typically recorded environmental noise.
Figure 12:
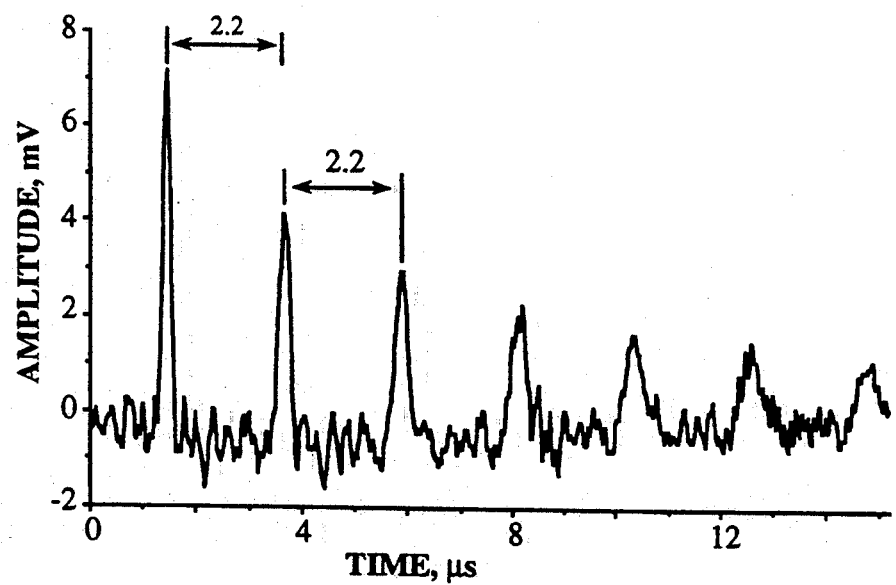
FIG. 12 is a schematic illustration of the signal reflecting the recorded response from a cable to a pulse injected at a terminal end.
Figure 13:
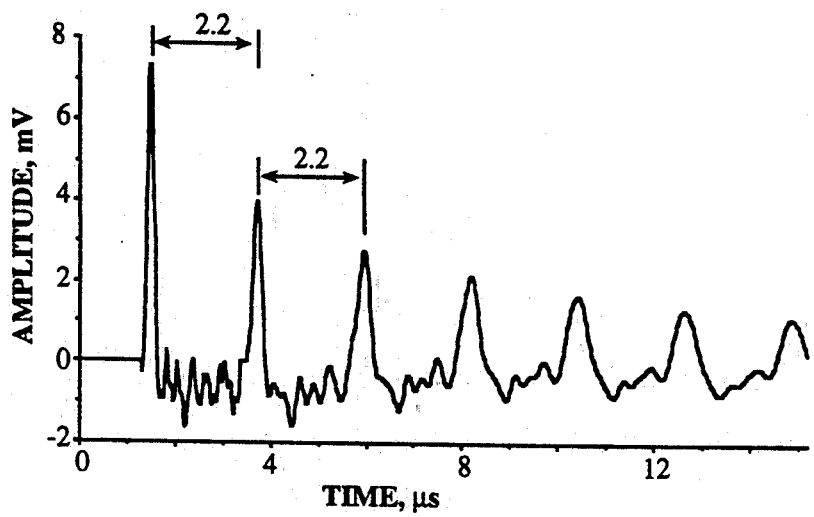
FIG. 13 is a modeled response of the cable to a pulse injected at its terminal.

$\Delta_o$, is initial estimate for the round trip time delay and is obtained from the measured response of the open circuited cable to a pulse/PD signal injected at one terminal (see, for example, FIG. 12). $\Delta_o$ is taken to be the time interval between the first two (marked 1 and 2 in FIG. 12) pulses. A detailed description follows:

With reference to FIG. 5 which is discretized version of the first two pulses from FIG. 12, it may be seen that the first peak always has the maximum value in the whole sequence. If the index which produces the maximum value $m_1$ is found, then $$g(m_1) = max[g(n)]$$

Starting from $m_1$, a search of the rising portion of the first peak is made for the first value of $g(n)$ which is less than or equal to zero. The index which causes this value is designated $Z_1$. At the same time, the derivative of $g(n)$ is computed and defined as $$g'(n) = \frac{g(n+1) - g(n-1)}{2}$$

If, before $Z_1$ is obtained, $g(n)$ becomes less than or equal to zero, then this value n is taken as $Z_1$.

Using the same method, the falling portion of the first peak is used to find $Z_2$; however, when $g(n) > 0$, this value of n is taken as $Z_2$.

The signal remaining after taking out all of the data before $Z_2$ is $g_1(n)$. The same procedure as described above, but applied to the second peak $g_2(n)$ is repeated to find $Z_3$. The round trip time delay is:

$$\Delta_o = Z_3 - Z_1 + 1$$

Figure 16:
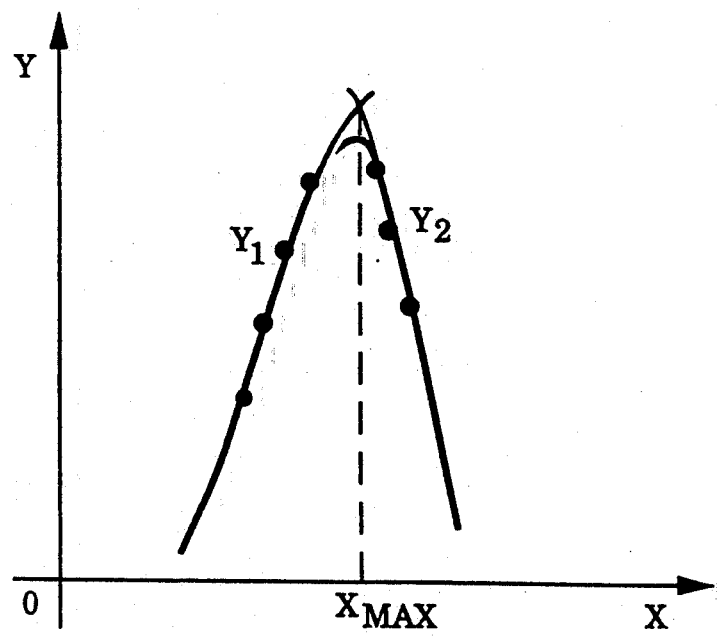
FIG. 16 is a schematic illustration of the technique for estimating the peak location in accordance with the present invention.
Figure 17:
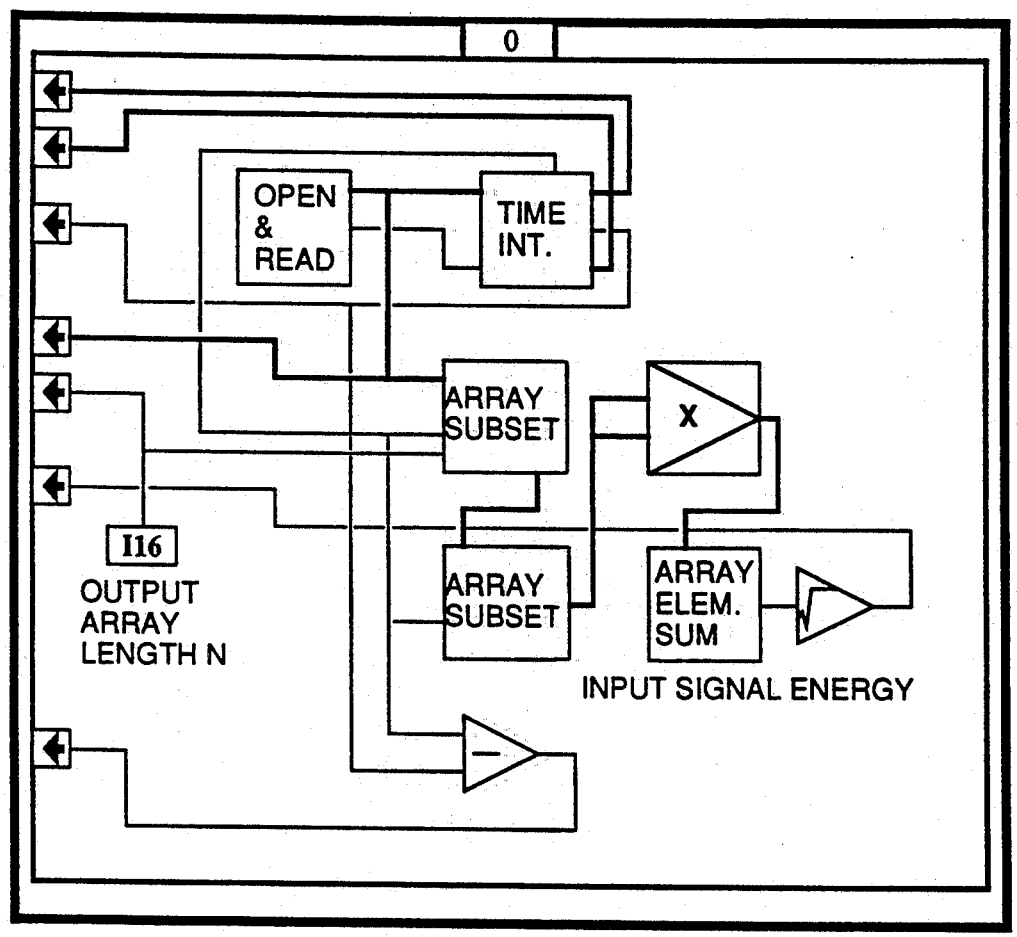
FIGS. 17A-H, 18A-D, 19A-R, 20A-C, 21A-I, 22A-F, 23A-F, 24A-B, and 25A-B are illustrations of the software diagrams used to practice the method of the present invention and the screen outputs resulting therefrom.
Figure 17:
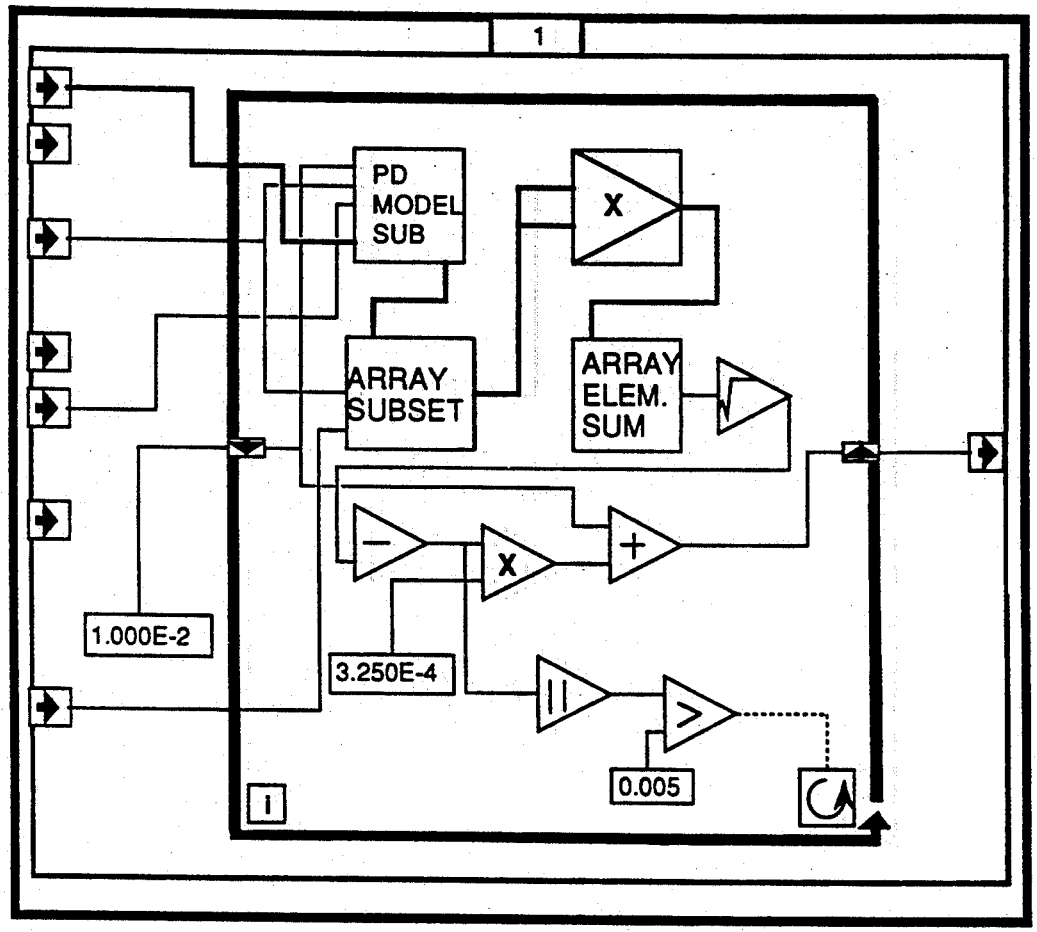
Figure 17:
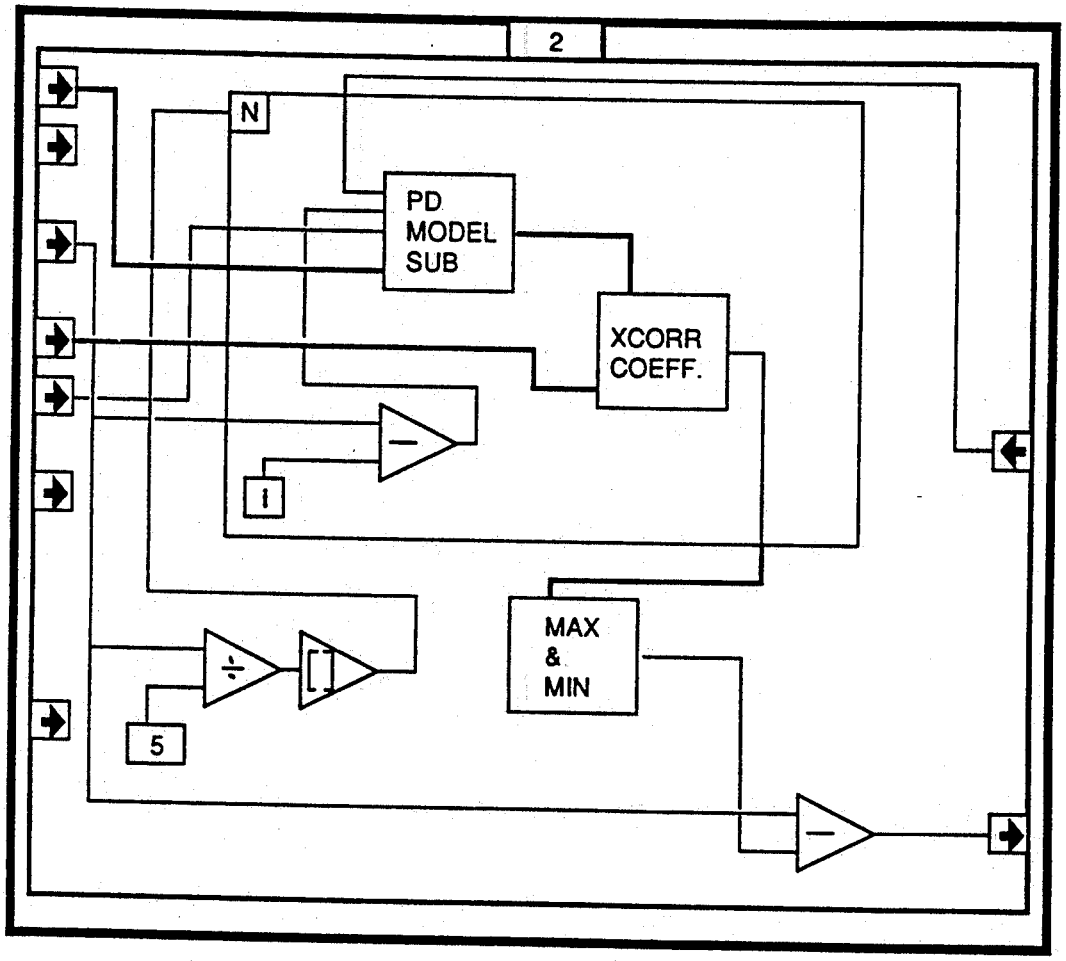
Figure 17:
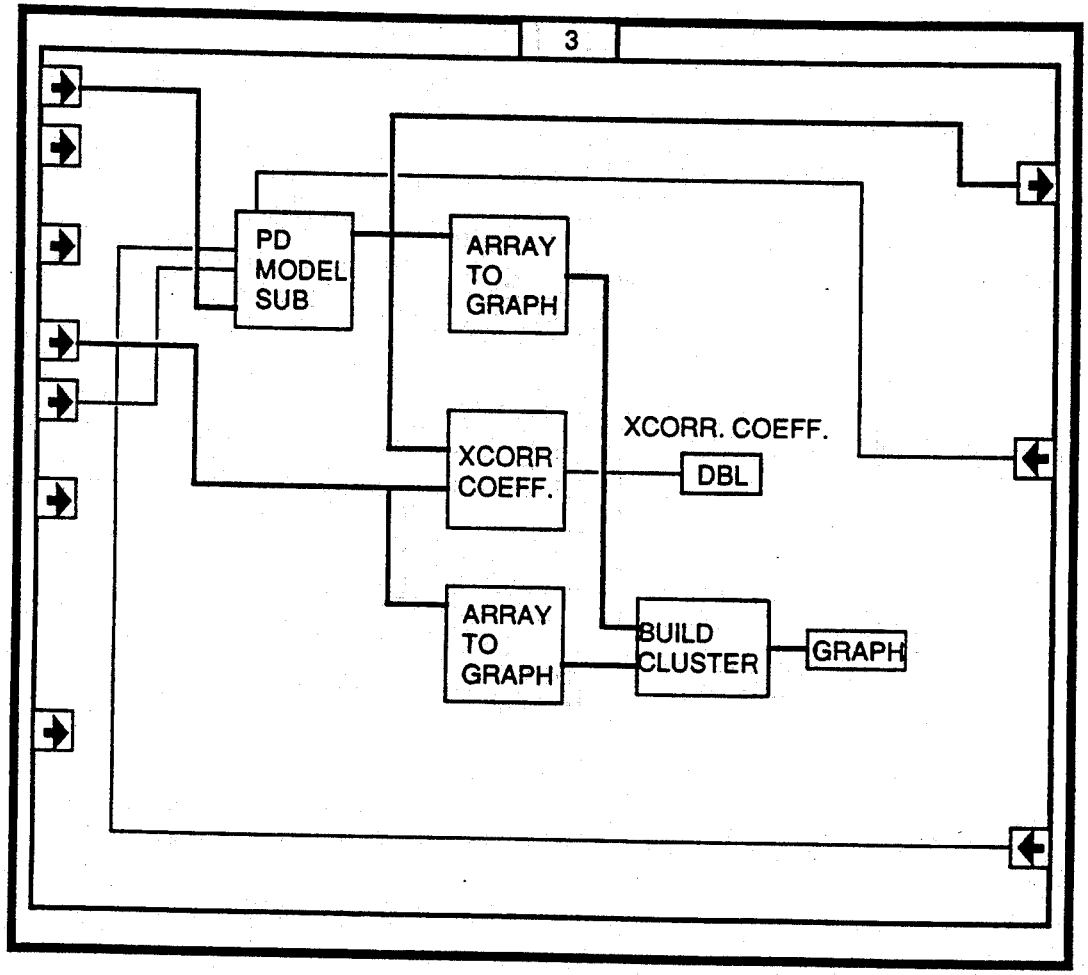
Figure 17:
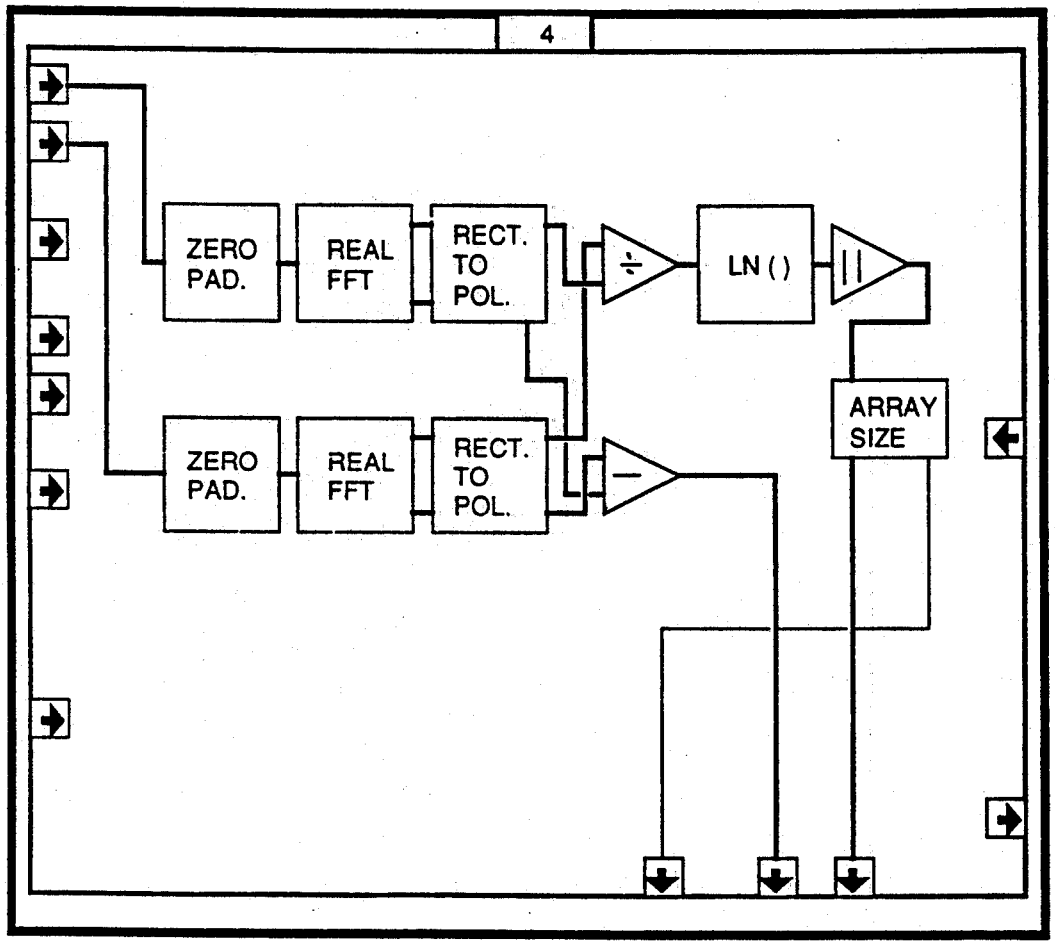
Figure 17:
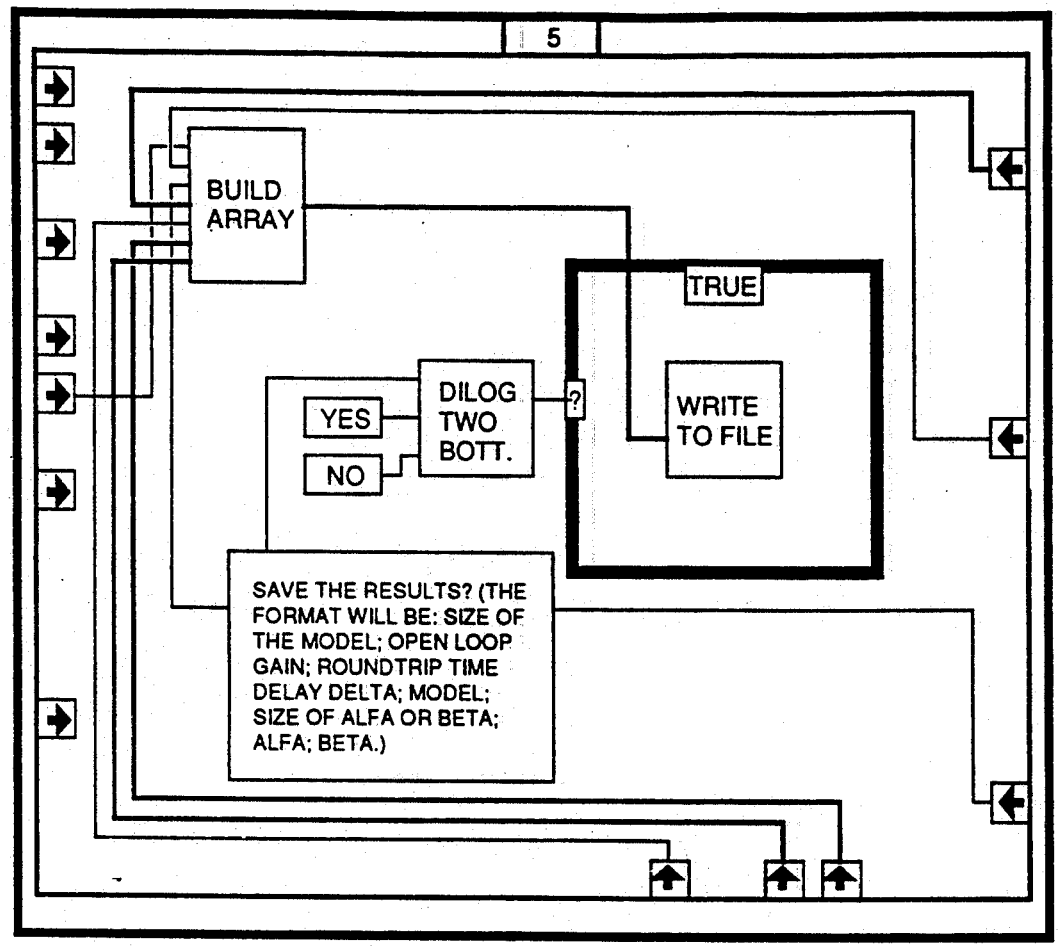
Figure 17:
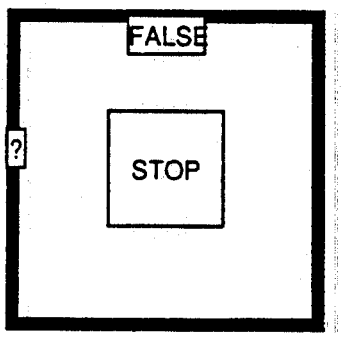
Figure 17:
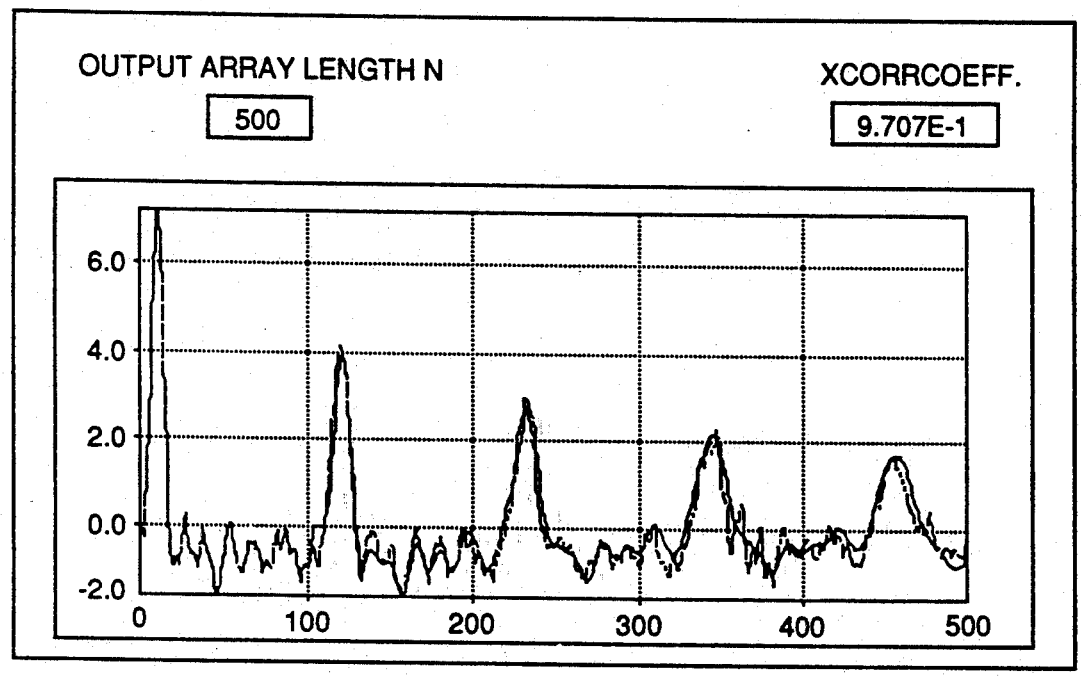

In some situations, the peak of the rounded waveform being recorded in the DSO may not be readily discernible because of filtering or high frequency attenuation of the cable. An interpolation technique has been developed to provide the best estimate of the actual peak location. Two second degree polynomials $y_1$, $y_2$ are used to represent the rising and falling parts of the waveforms of interest as seen in FIG. 16 and according to:

$$y_1 = a_0 + a_1 x + a_2 x^2$$

$$y_2 = b_0 + b_1 x + b_2 x^2$$

Then, the estimated peak location $x_{max}$ is determined as $$x_{max} = \frac{-(b_1 - a_1) \pm [(b_1 - a_1)^2 - 4(b_0 - a_0)(b_2 - a_2)]^{1/2}}{2(b_2 - a_2)}$$

The computer software utilized in the practice of the present invention has been easily created by defining the criteria in a software package designated "LAB-VIEW 2" by National Instruments of Austin, Texas. This software is described in U.S. Pat. No. 5,901,221. This software allows the user to define programs or routines by block diagrams which are referred to as "virtual instruments".

Using this package, the following routines were created by the block diagrams illustrated in the attached drawings.

LMS-Model 1-KD

This program is shown in FIGS. 17a-17g and accepts the data provided by the reflections of an artificial PD signal injected at one of the cable ends and builds a mathematical model capable of simulating a partial discharge injected at the same cable end. The virtual instrument sets the propagation model of a power cable. The methods used are the adaptive method and the cross correlation method. The graphic representation action seen in FIG. 17h shows both the model and the cross correlation coefficient between the model and the measured signal. The results can be saved on disk.

PD Model (sub)

Figure 18:
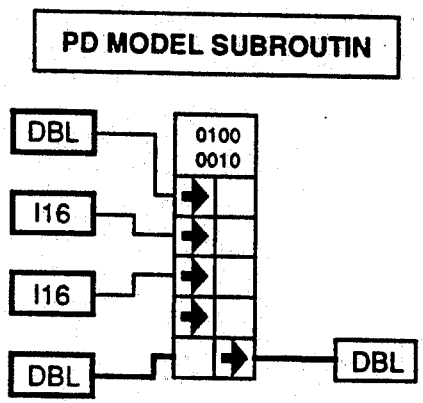
Figure 19:
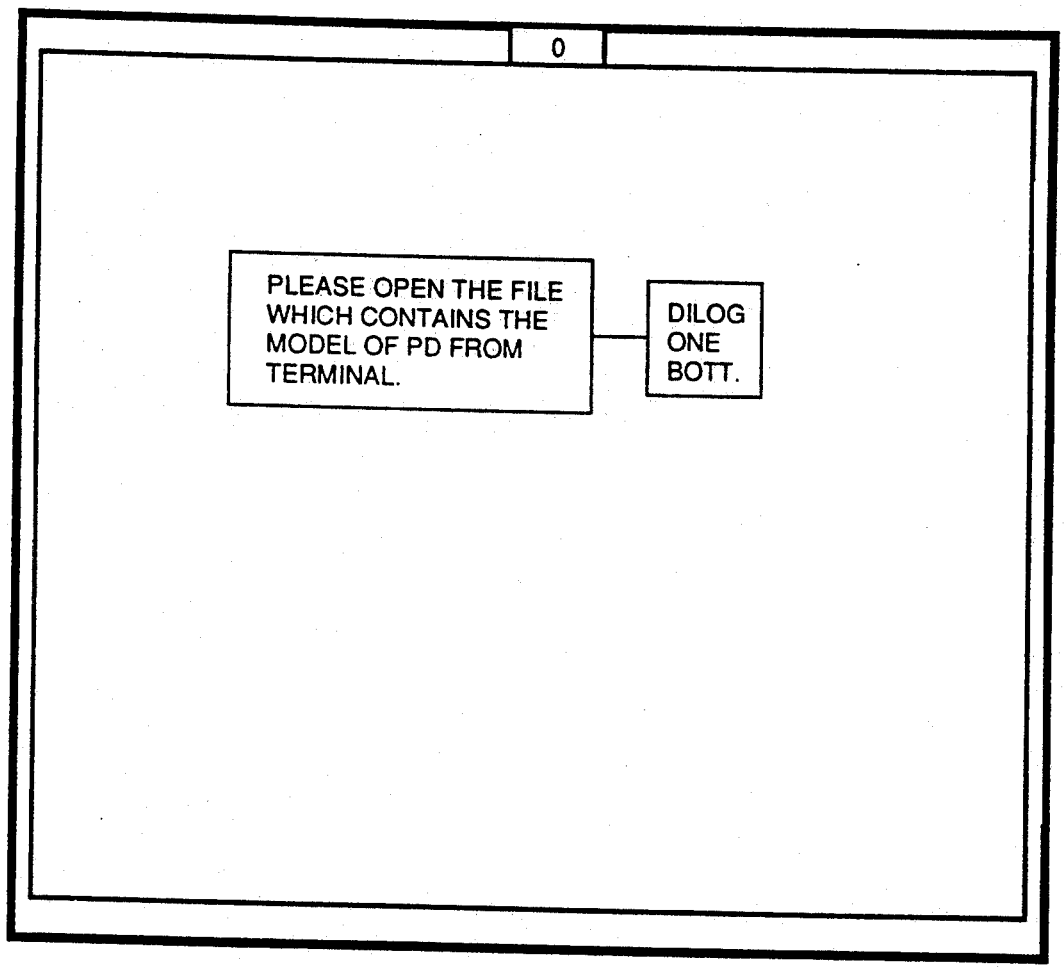
Figure 19:
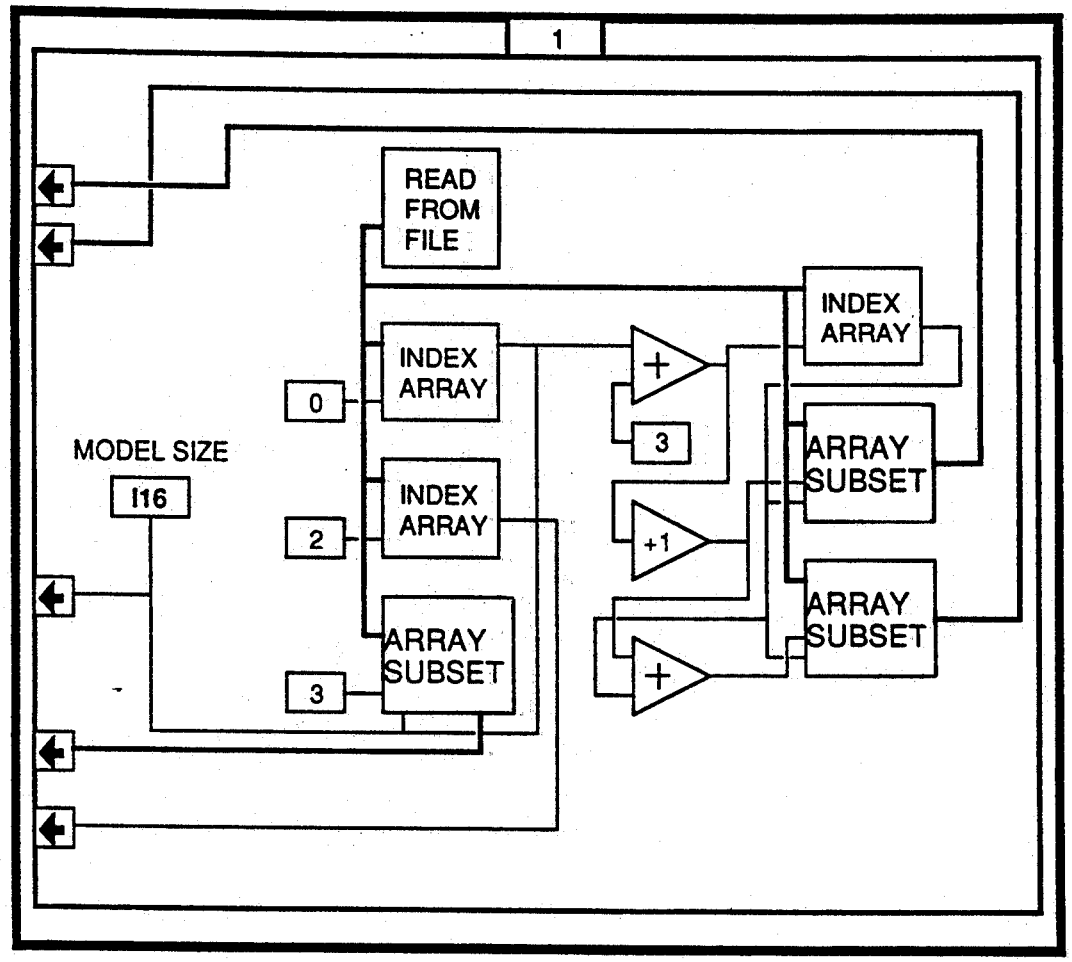
Figure 19:
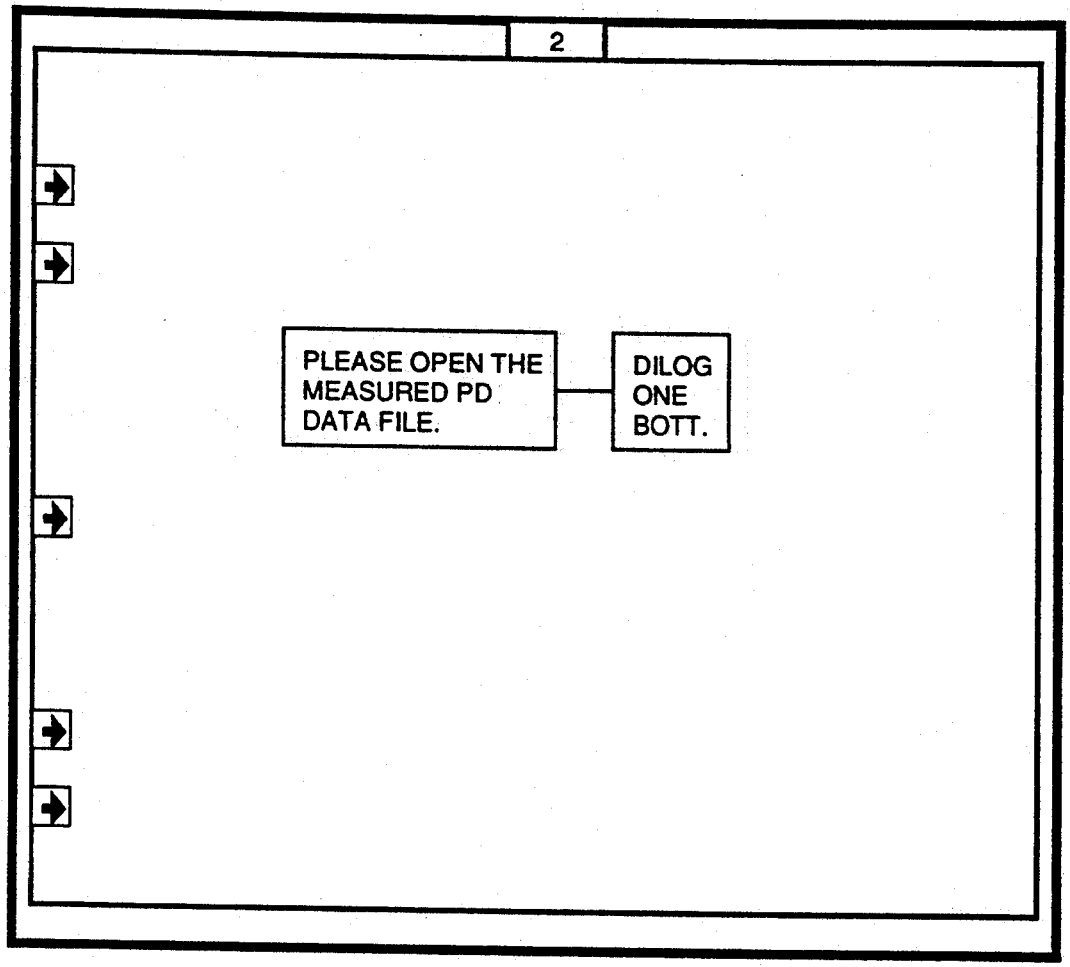
Figure 19:
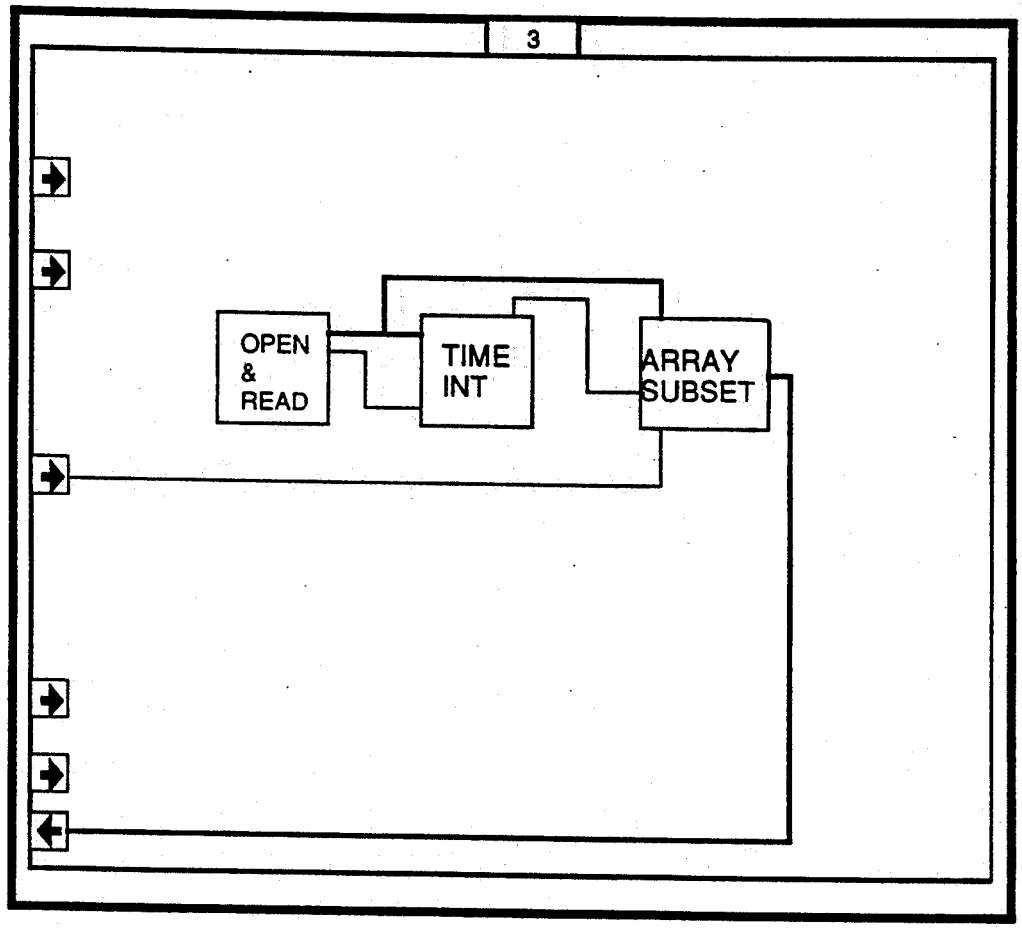
Figure 19:
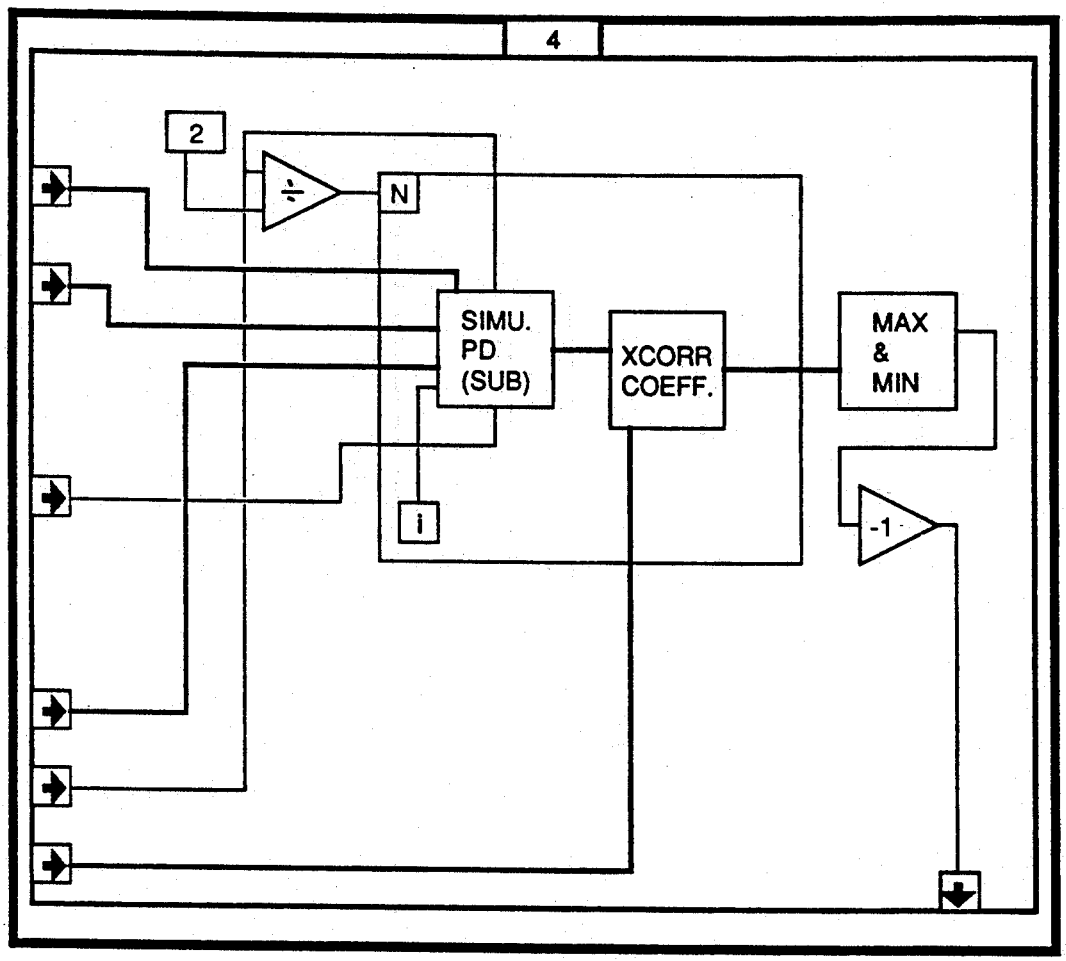
Figure 19:
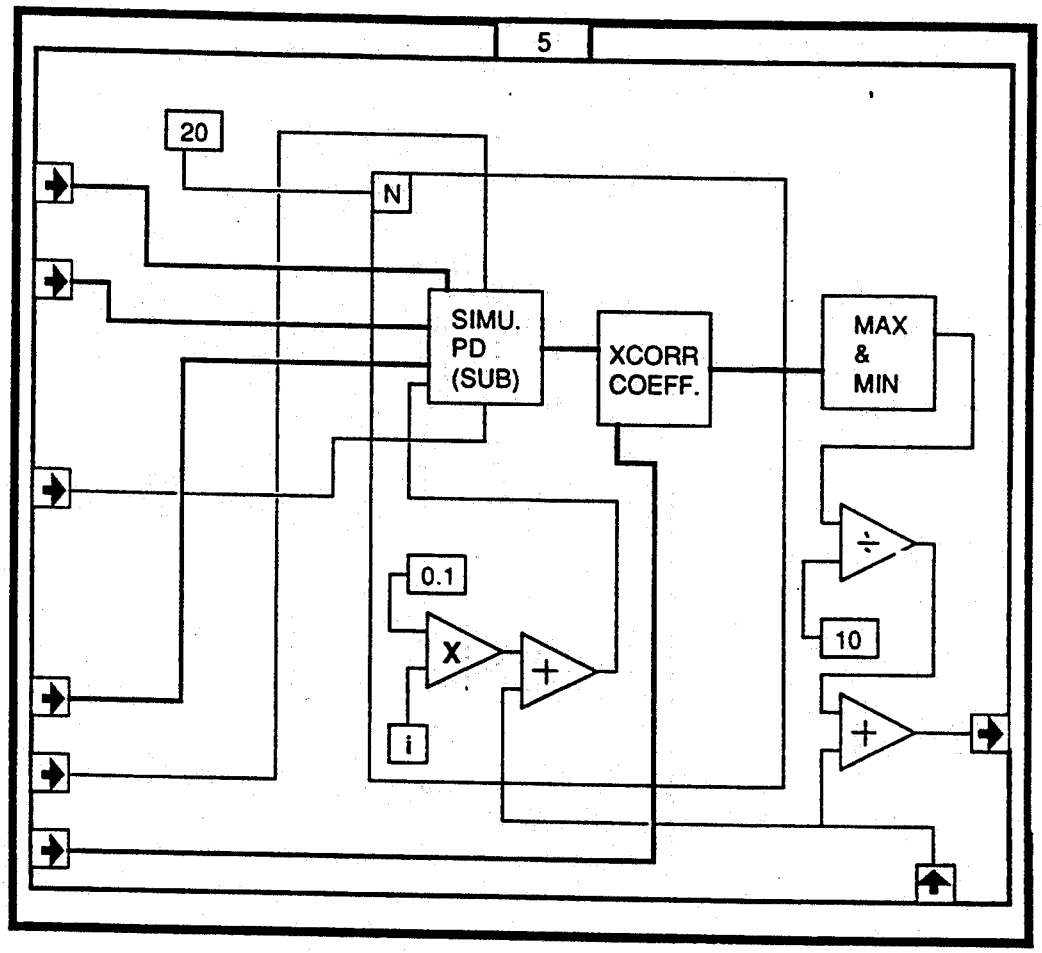
Figure 19:
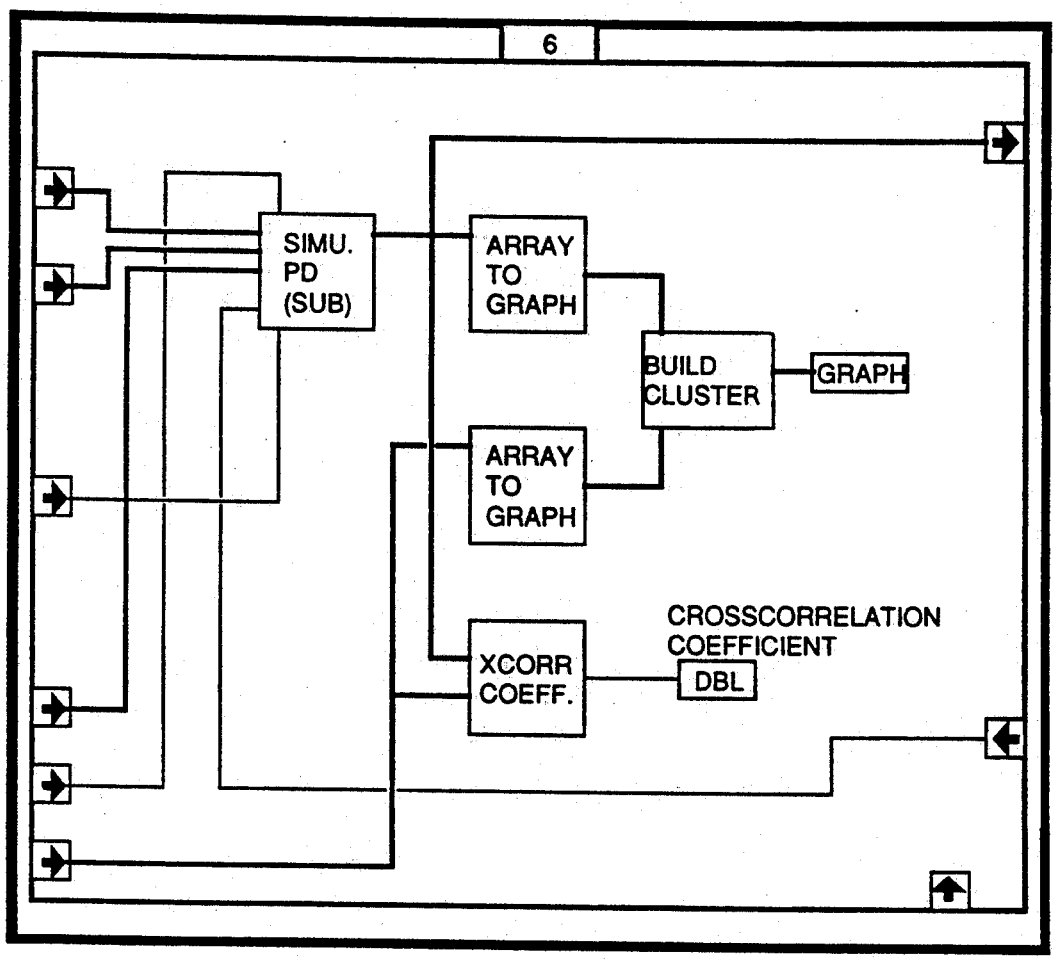
Figure 19:
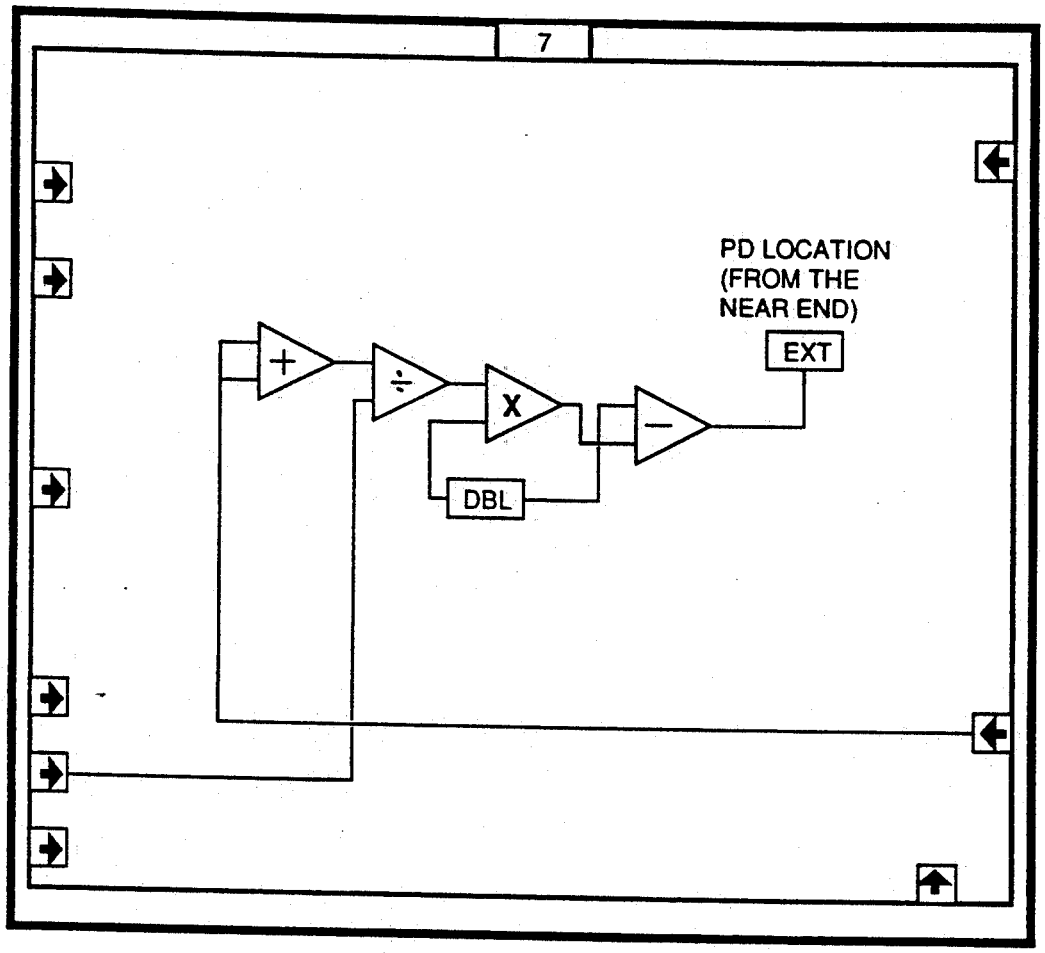
Figure 19:
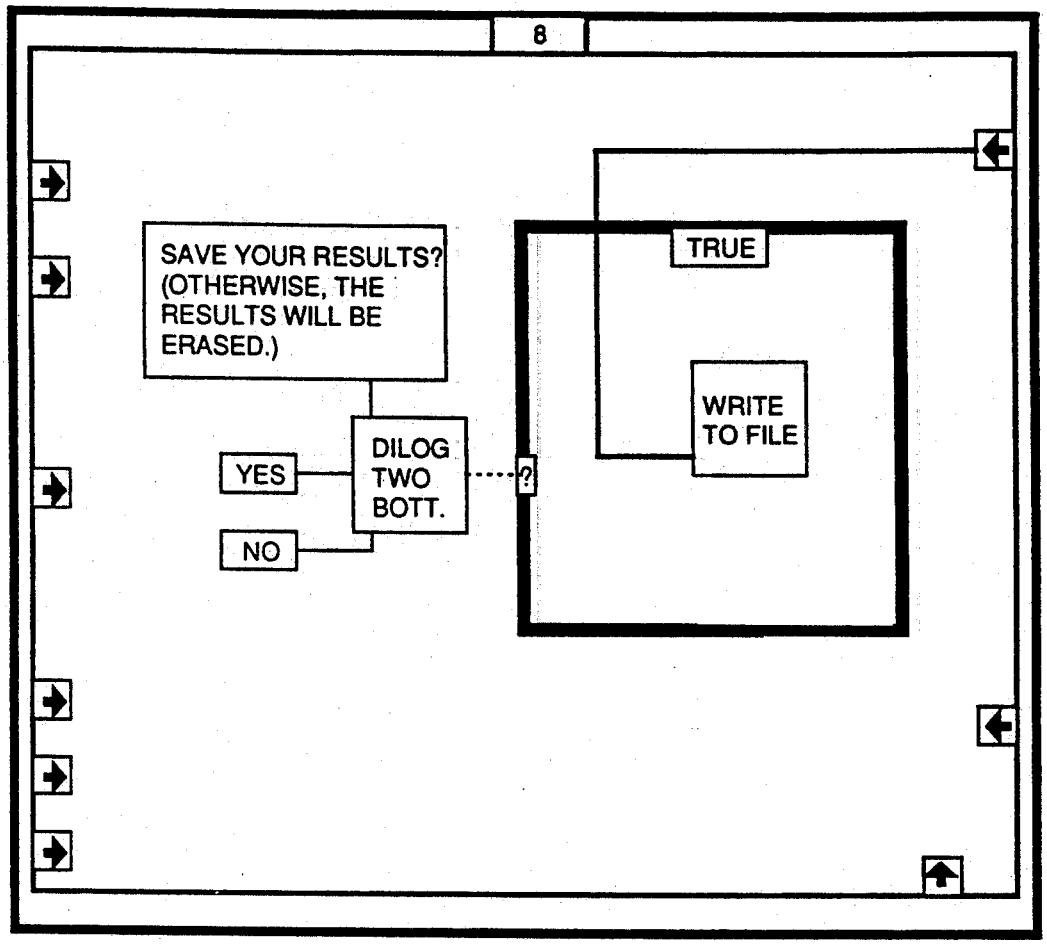
Figure 19:
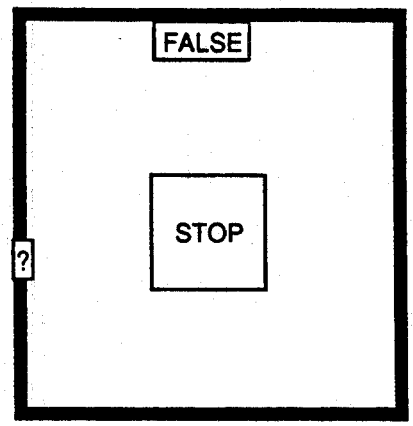
Figure 19:
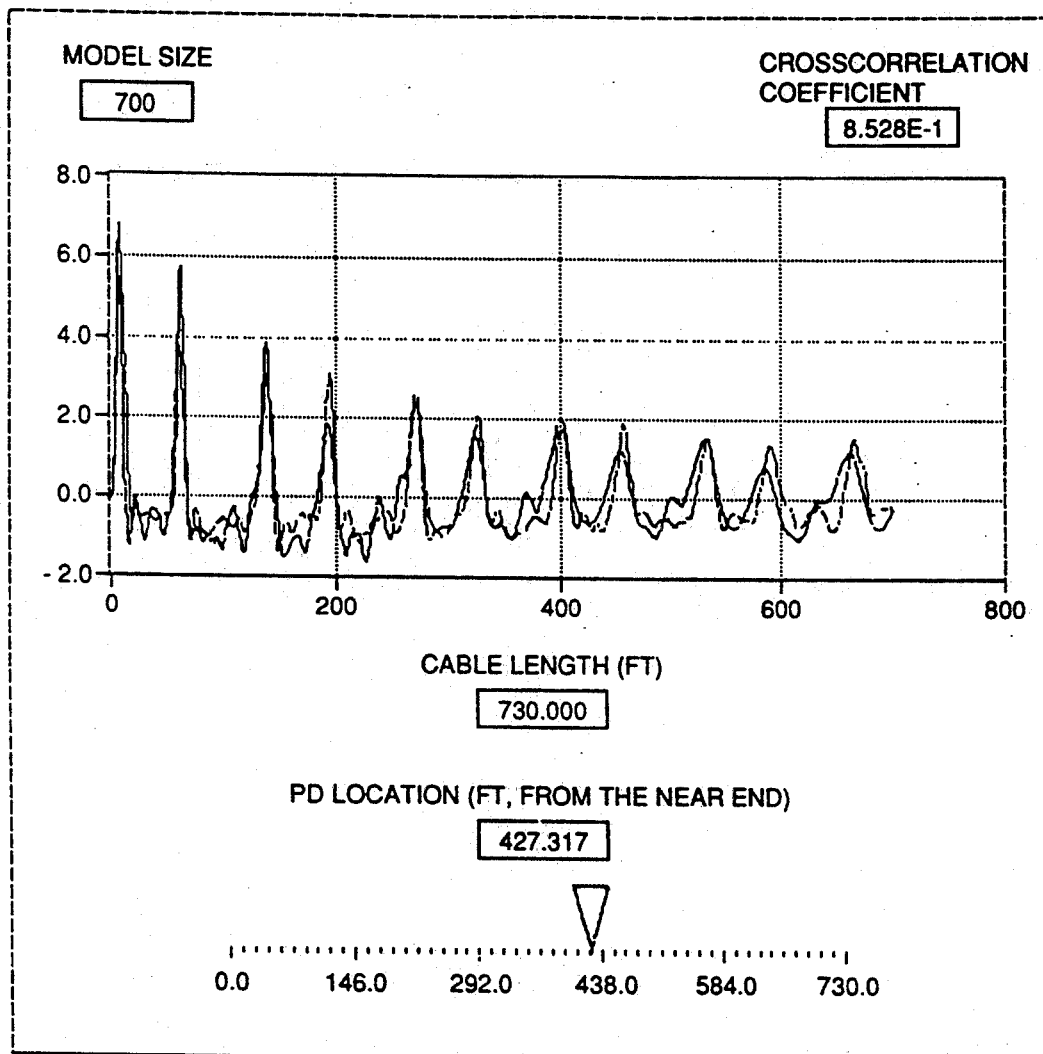

This subroutine is shown in FIG. 18a, and it is used with the previous program. It simulates the open loop cable response to a PD for a given open loop gain and round trip time delay. The program is written in "C" language and interfaced to the LabVIEW2 through the CIN (Code Interface Node). The program is set forth in FIG. 18b. The graphic display is represented in FIG. 18c.

DetPD-InpMod

This program is illustrated in FIGS. 19a-19j and it accepts as inputs the model described under LMS-Model 1-KD above and the actual (noisy) PD signal recorded by the DSO. It estimates the exact location of the PD source, and comprises the PD location detecting program. Given the cable length and the model of the measuring cable, the PD location can be estimated by using this program, and the simulated PD waveform will be shown on the screen as shown in FIG. 18k. The estimation method used in the program is least mean squared error.

SimulPD(sub)

Figure 20:
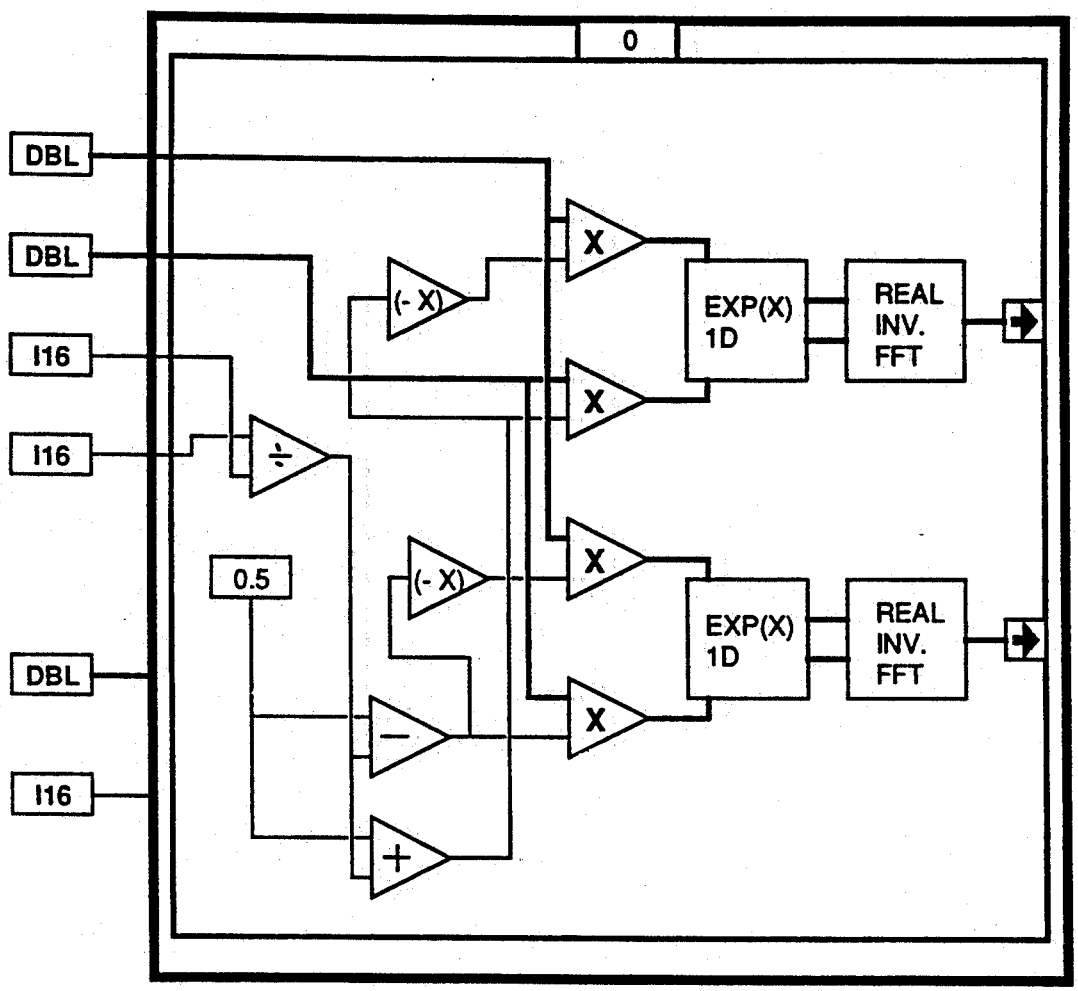
Figure 20:
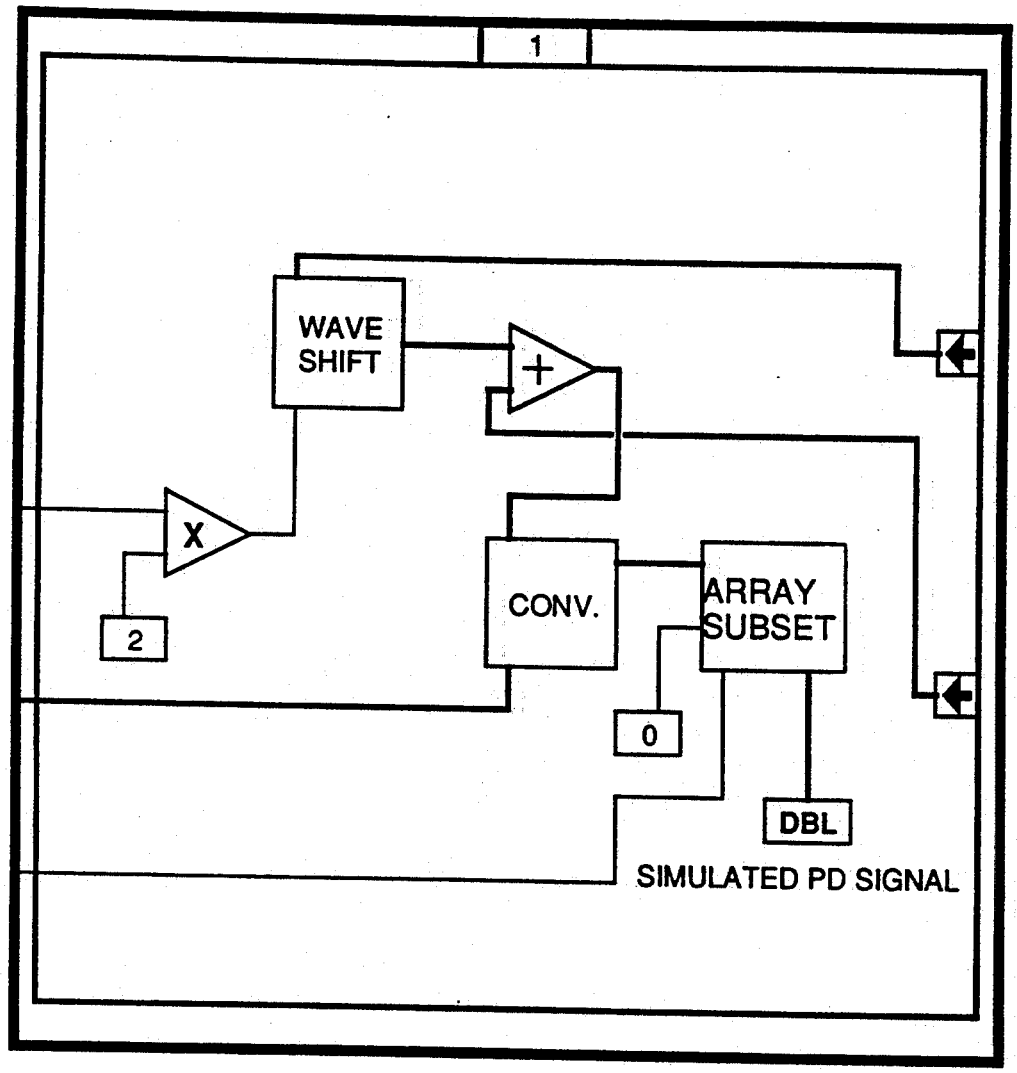
Figure 20:
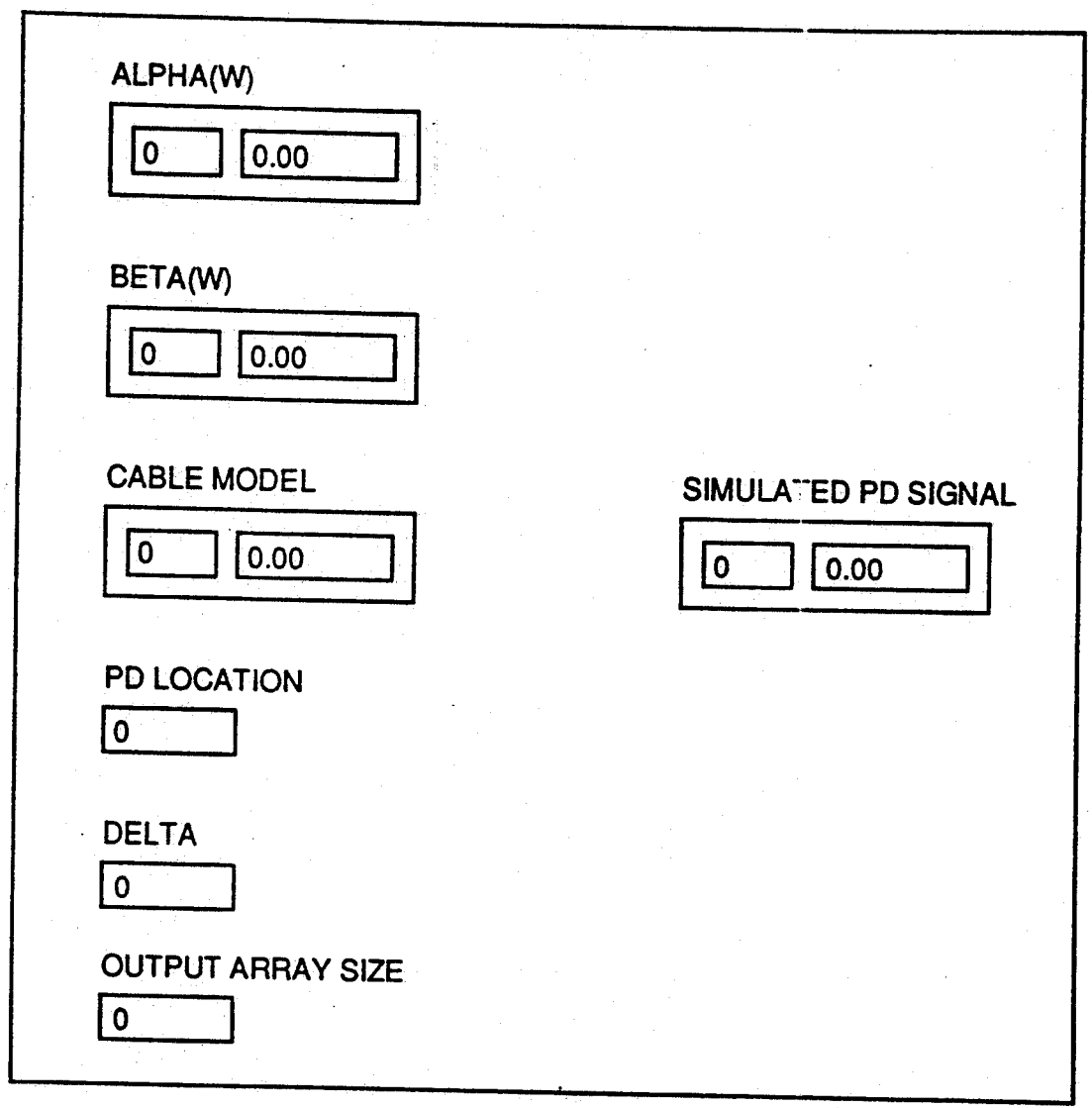
Figure 21:
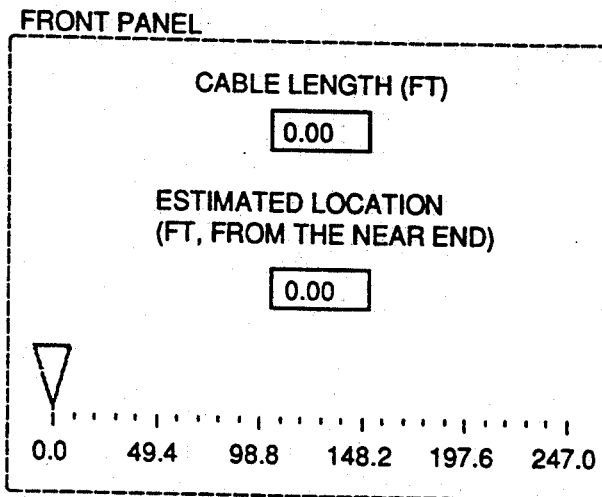
Figure 21:
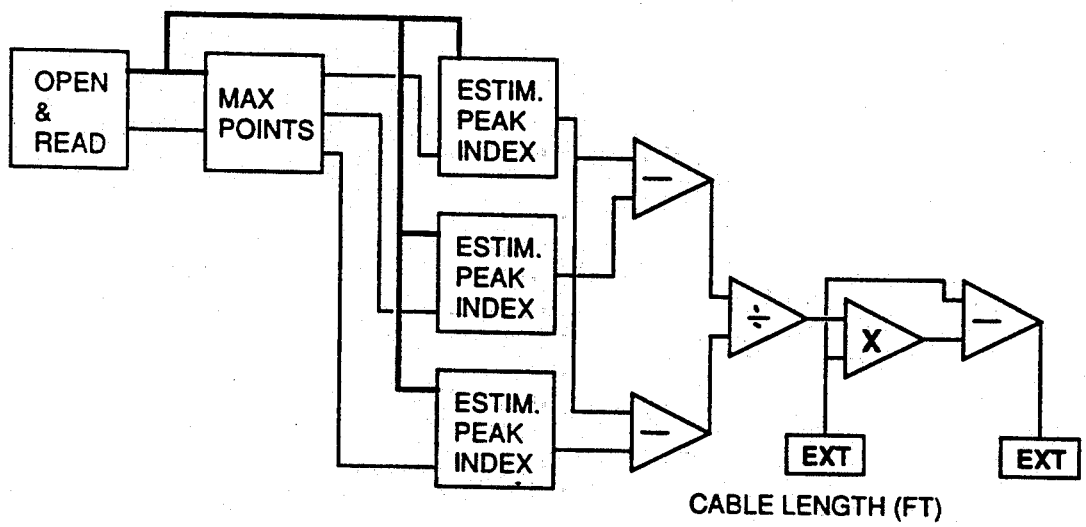
Figure 21:
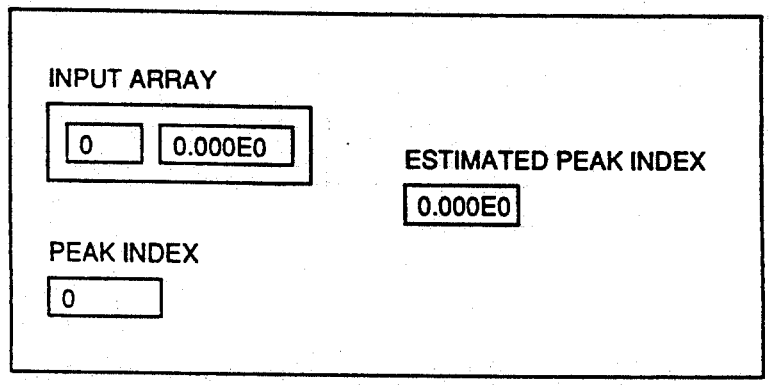
Figure 21:
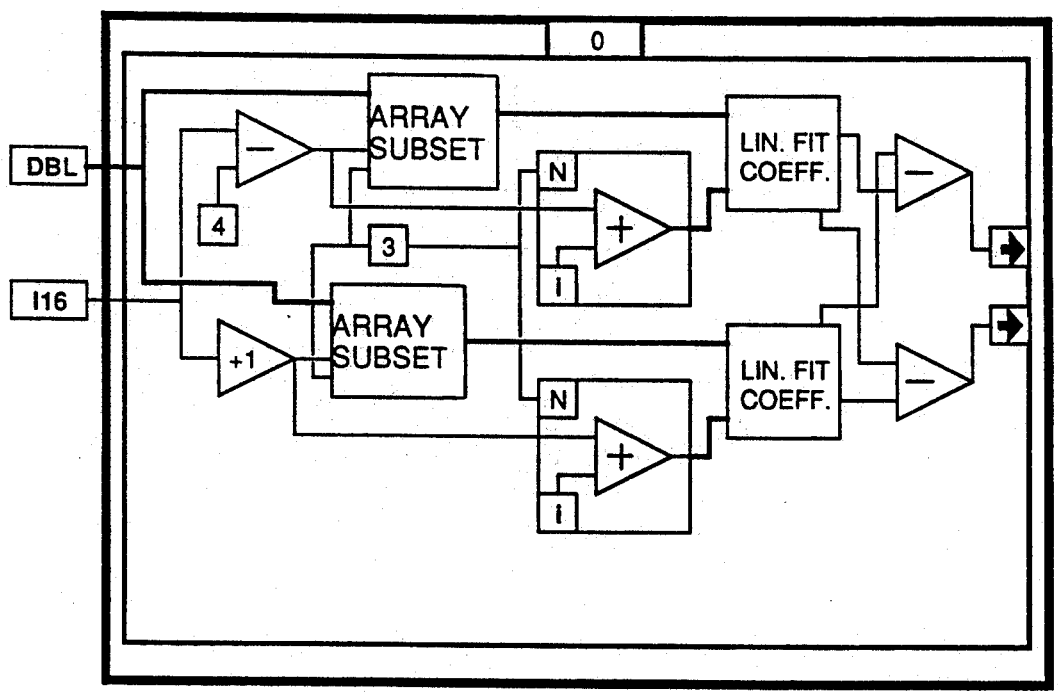
Figure 21:
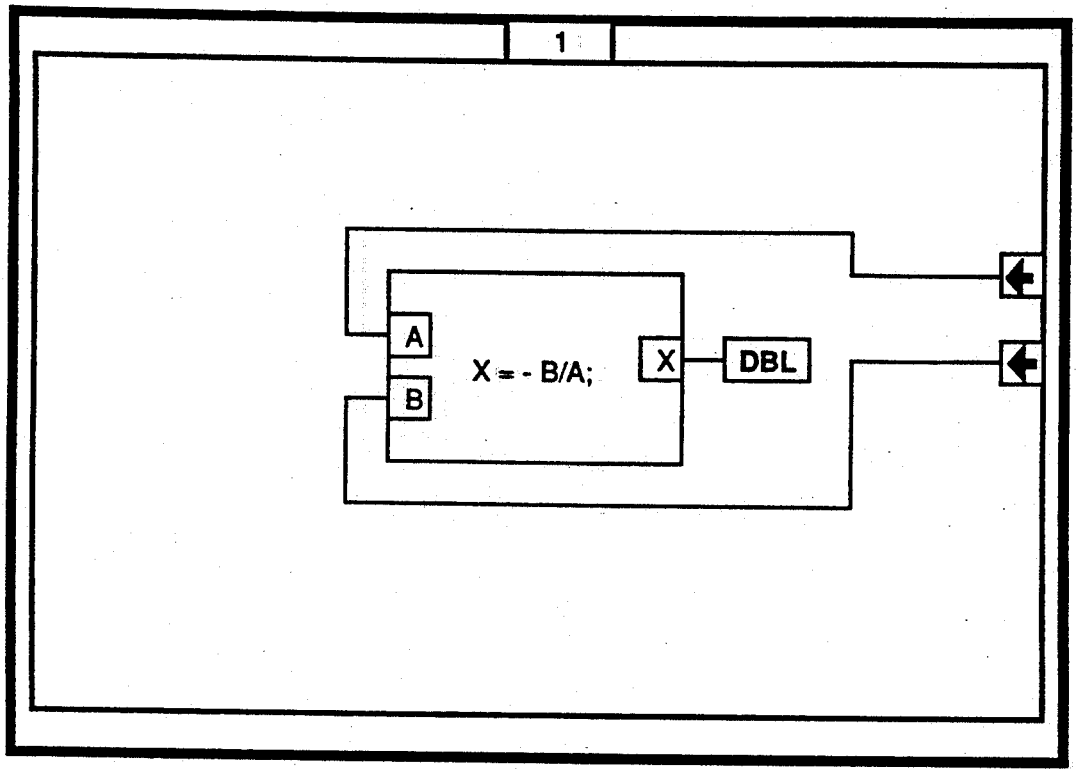
Figure 21:
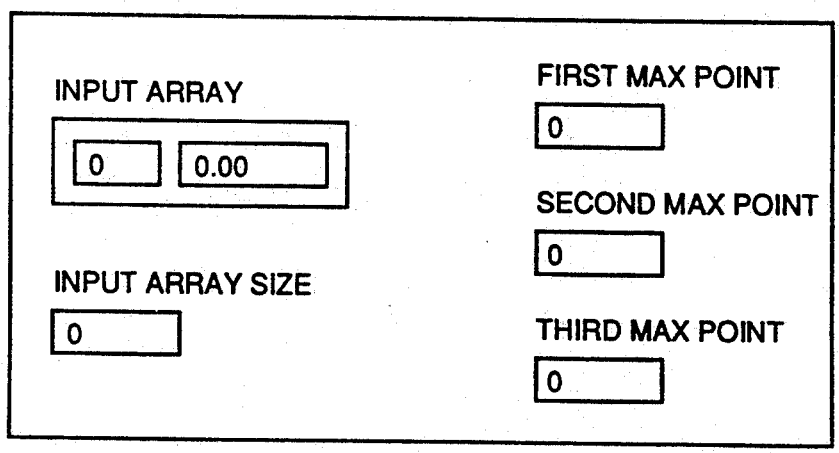
Figure 21:
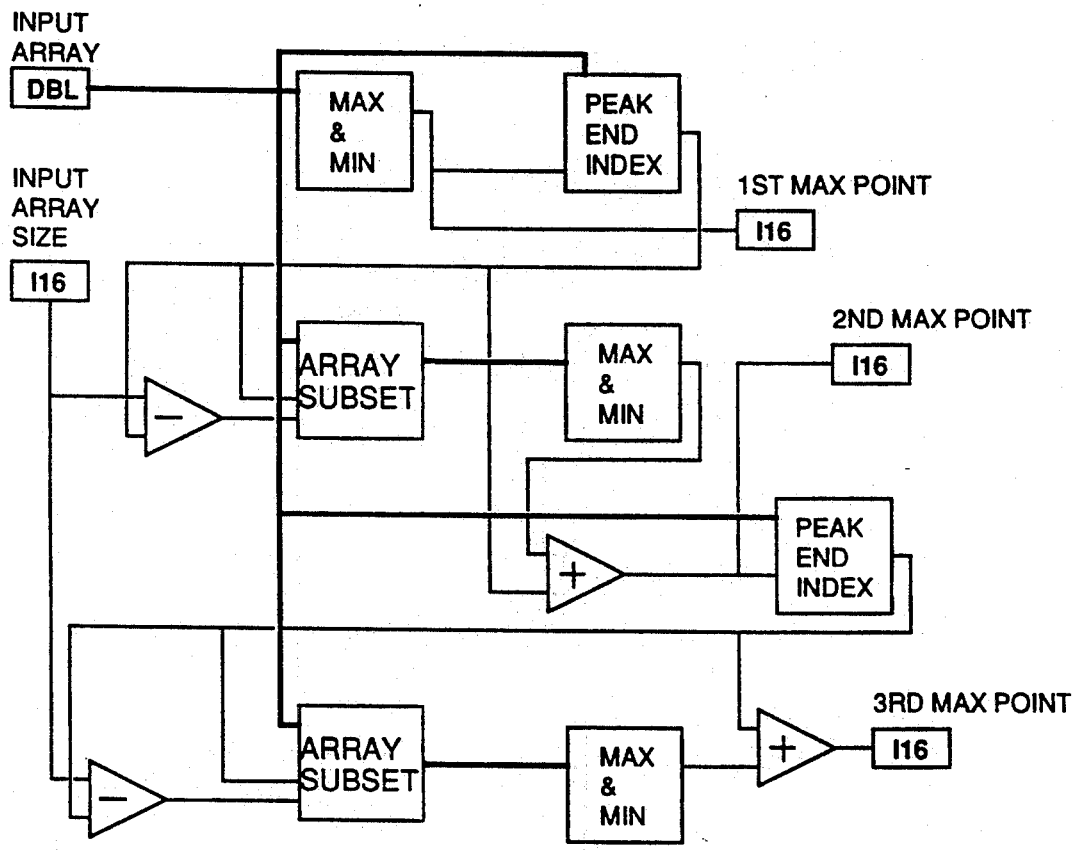
Figure 21:
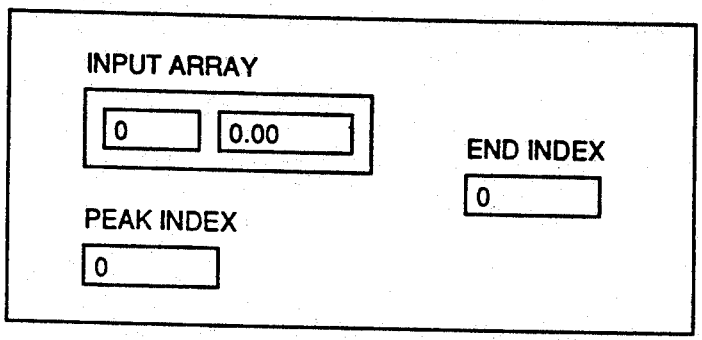
Figure 21:
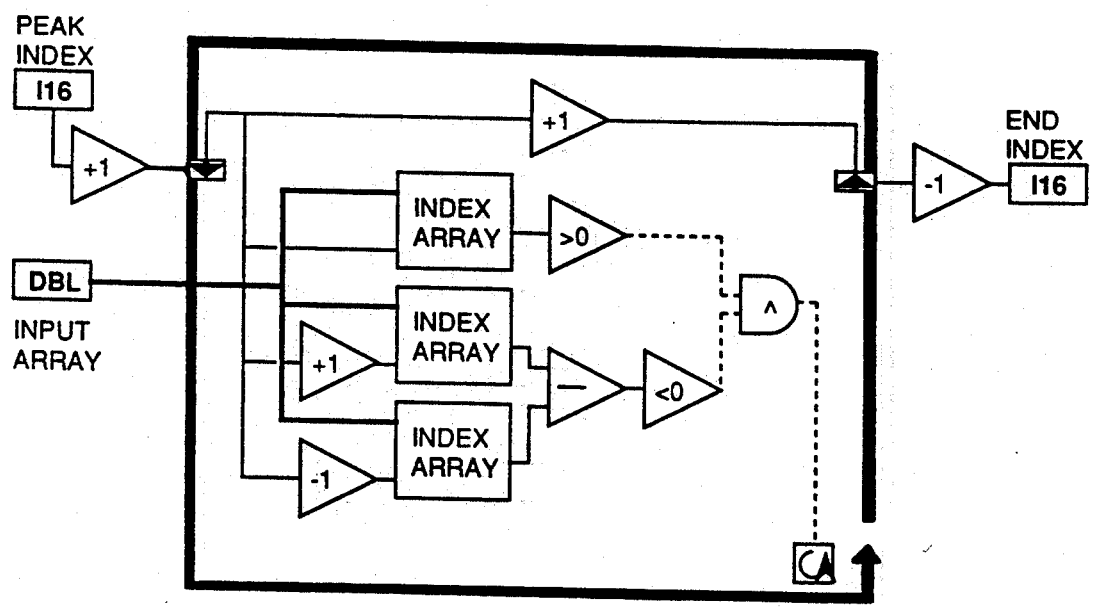

This program is illustrated in FIGS. 20a-20b and is a subroutine of the preceeding program. It simulates a PD emanating from any desired position along the cable. The displayed information is shown in FIG. 20c.

IntpPeak

This program and its displays are illustrated in FIGS. 20a-20c and accepts PD signals recorded (a sequence of peaks), interpolates peak position in the PD signal, and calculates automatically the time locations of the initial three peaks.

Trans,AV

Figure 22:
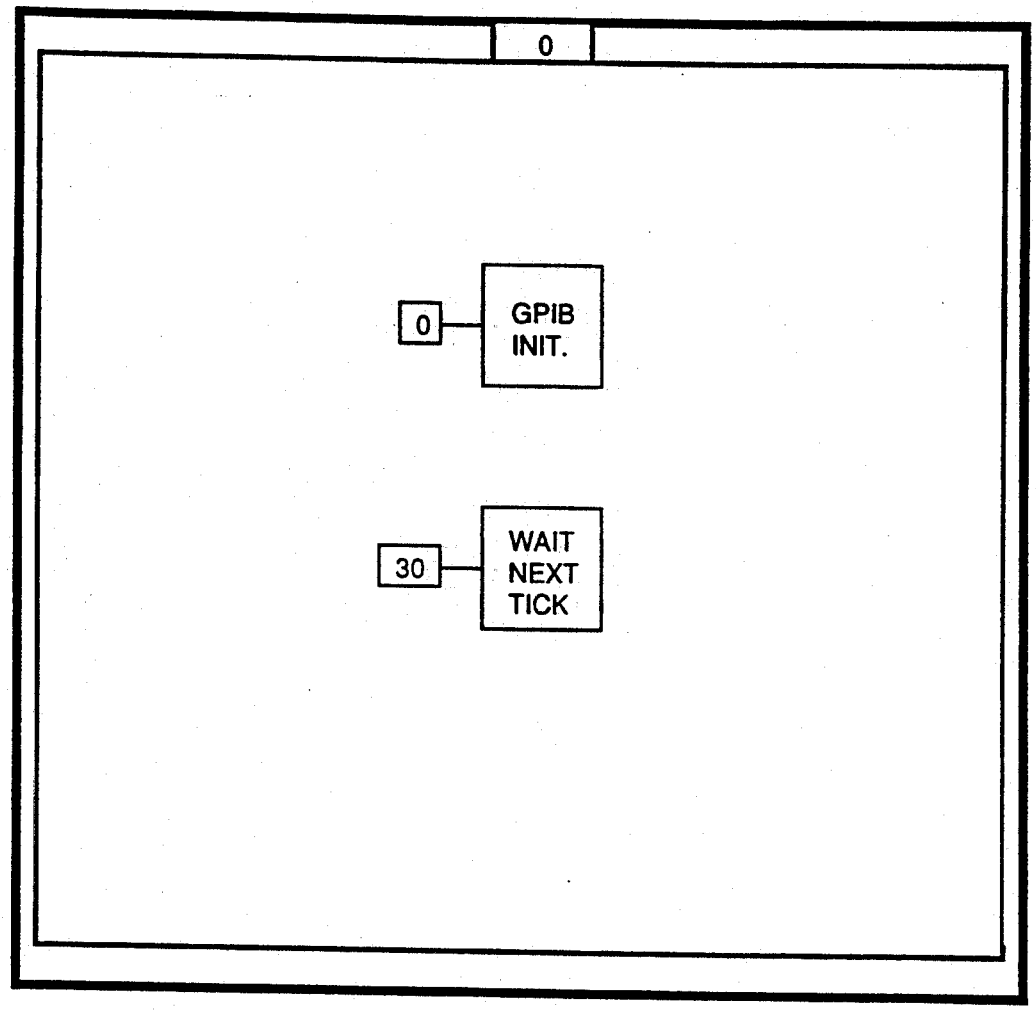
Figure 22:
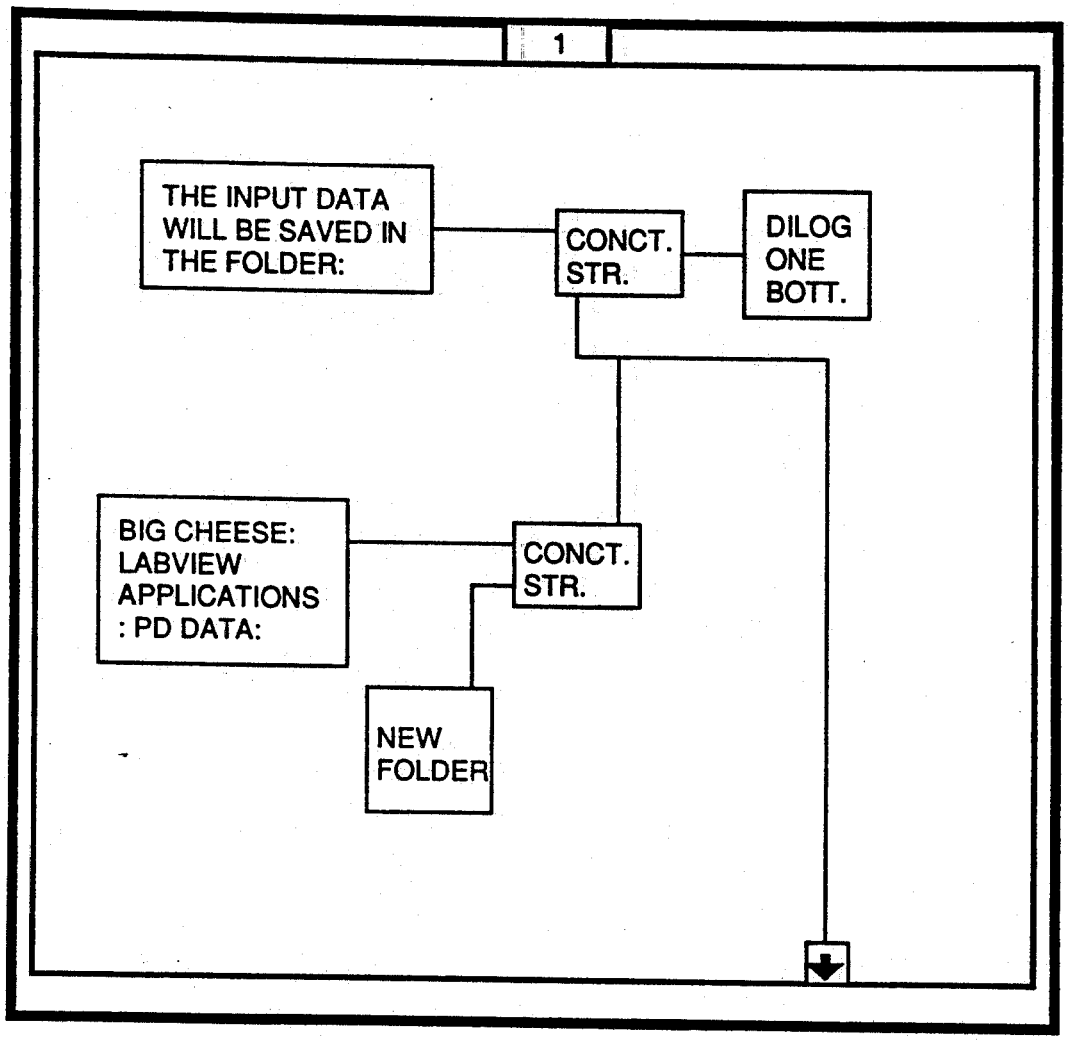
Figure 22:
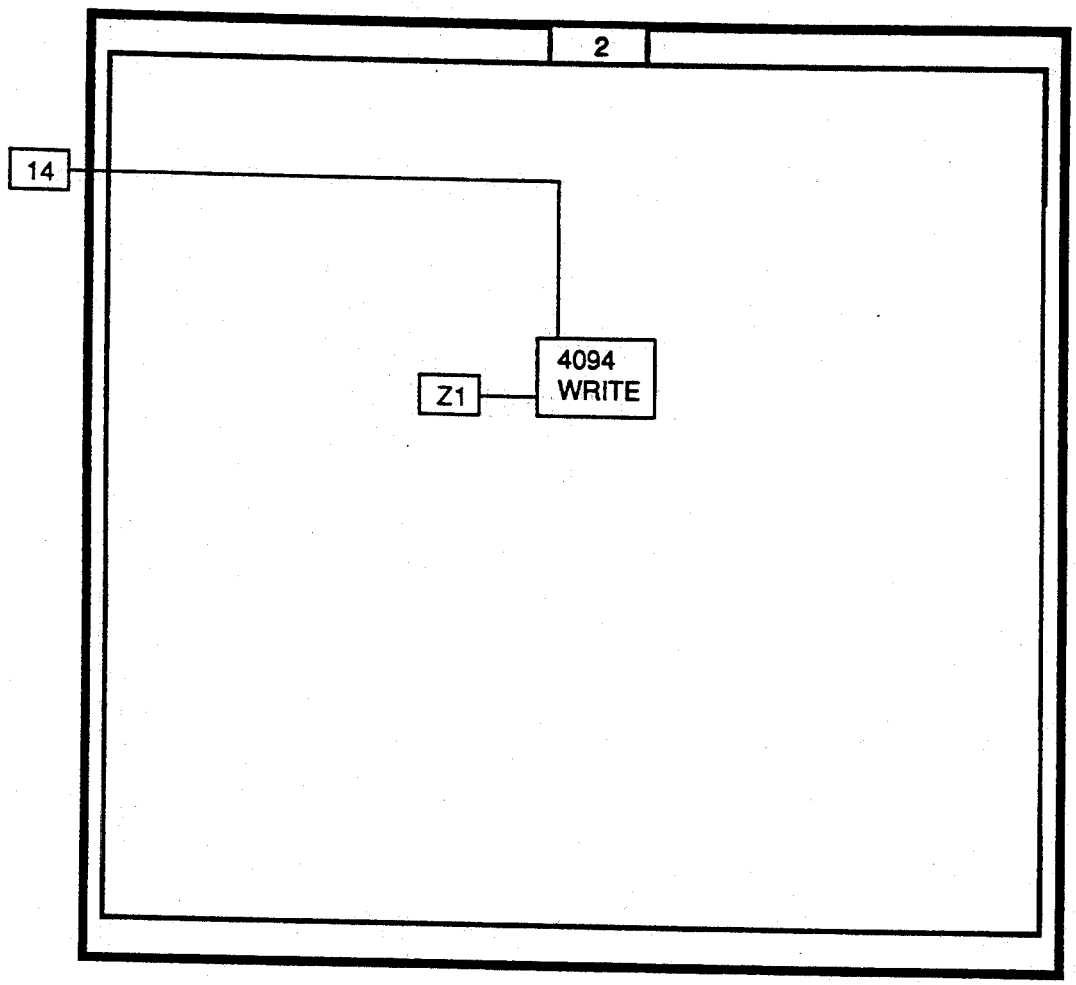
Figure 22:
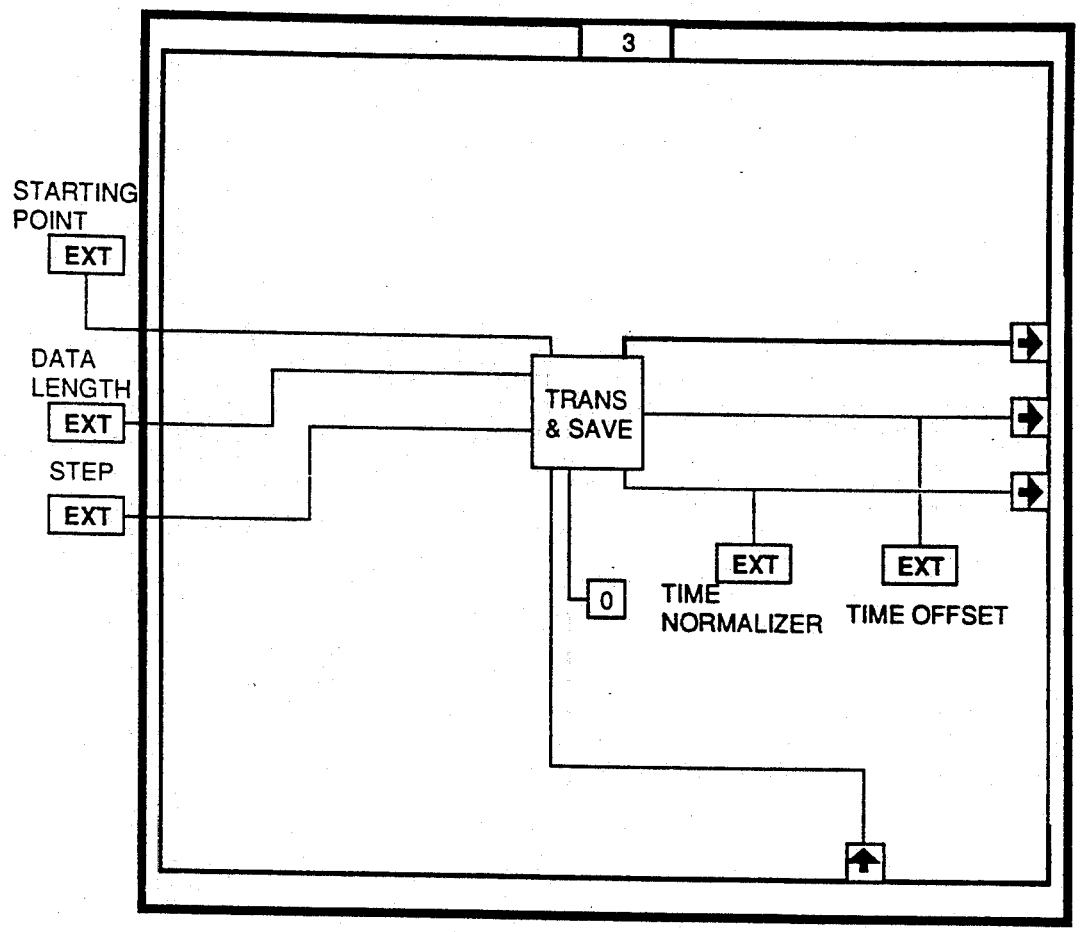
Figure 22:
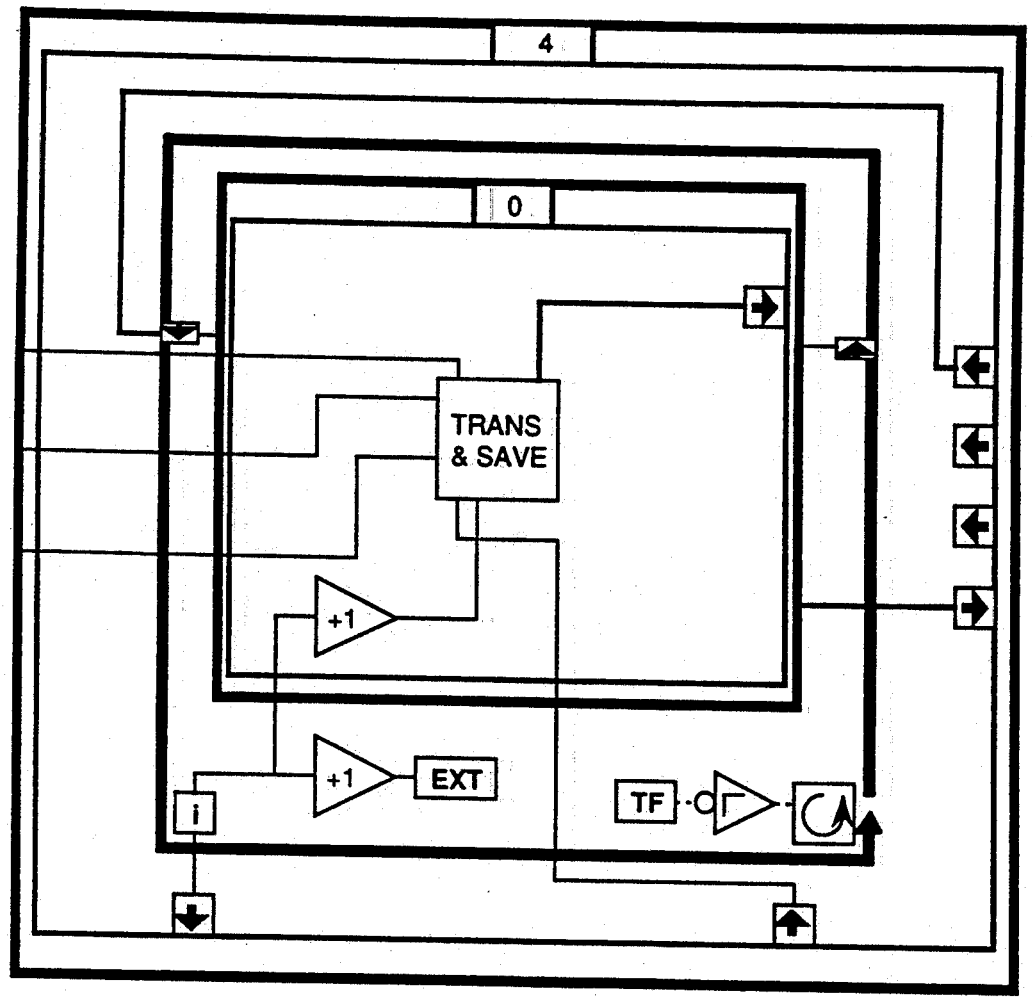
Figure 22:
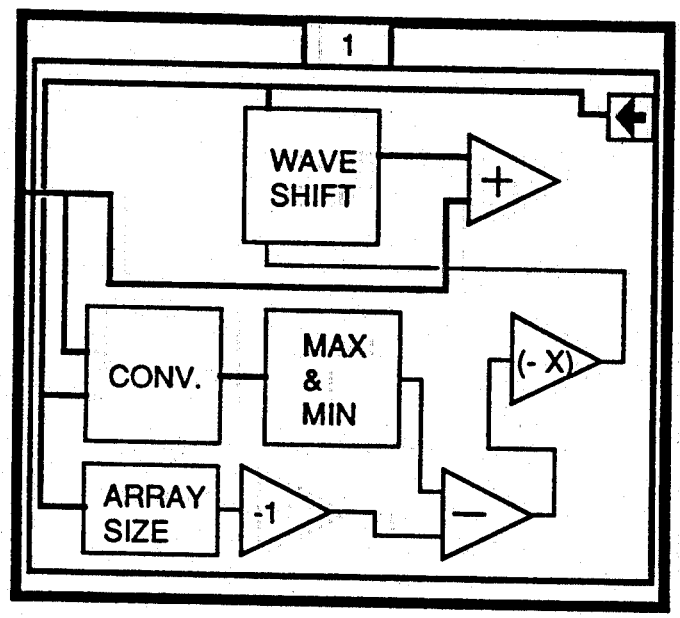
Figure 22:
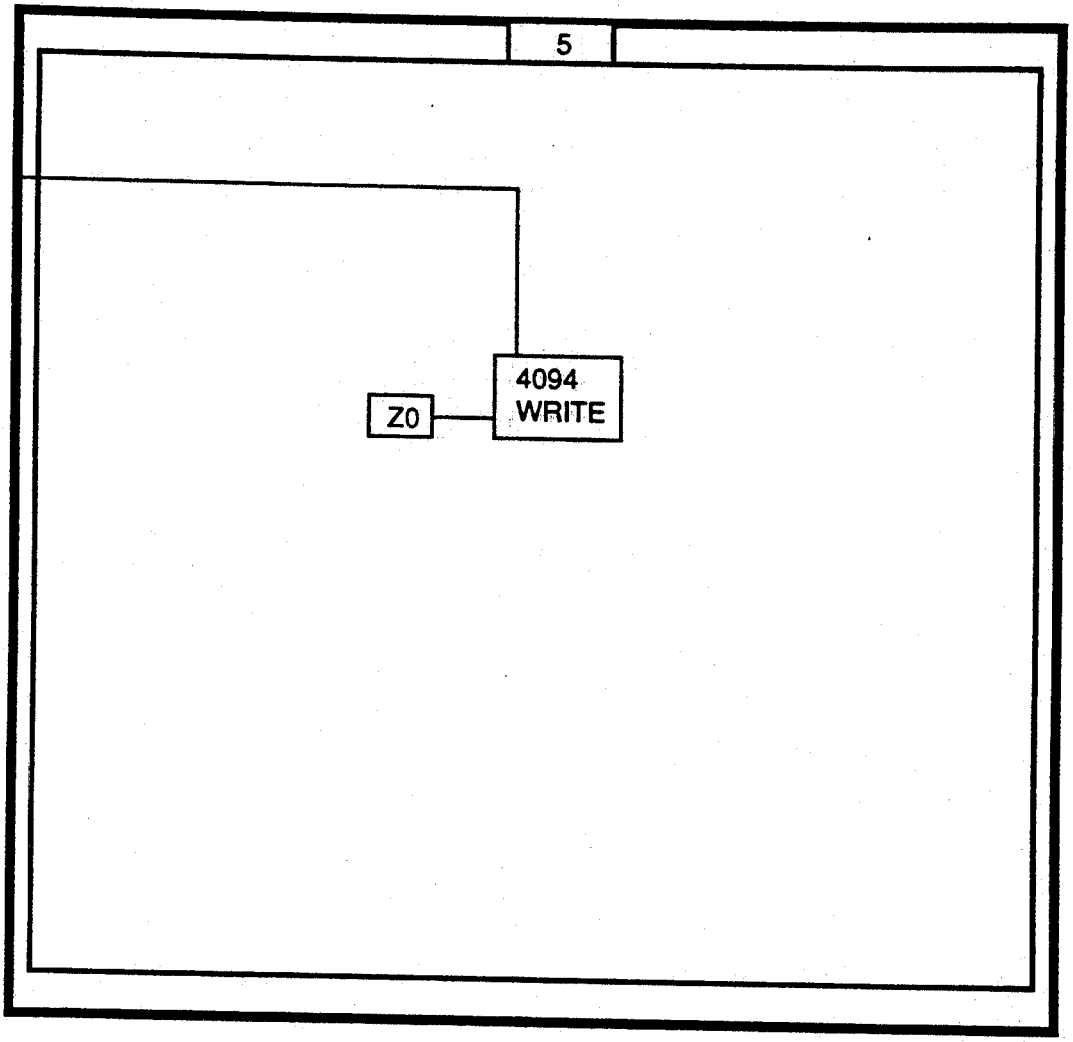
Figure 22:
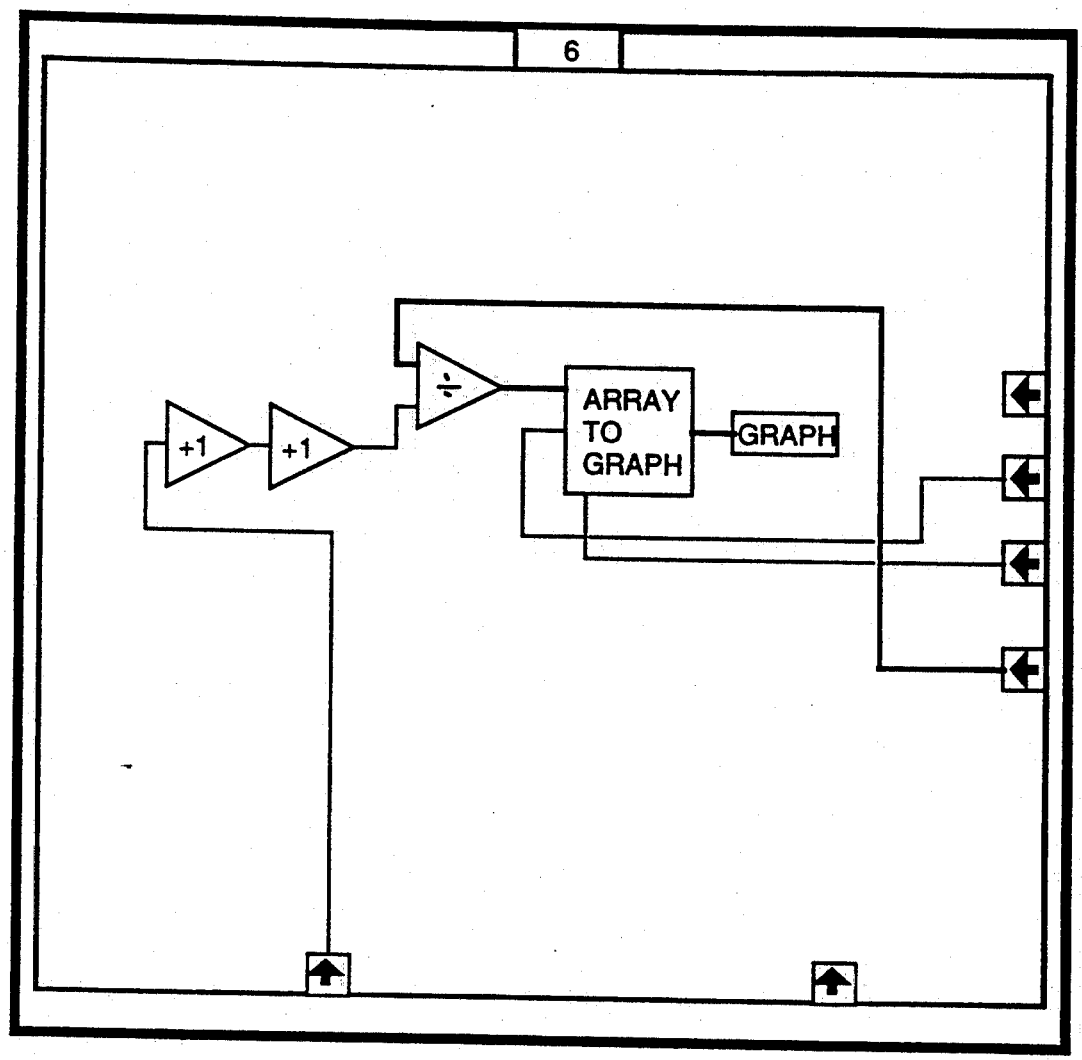
Figure 22:
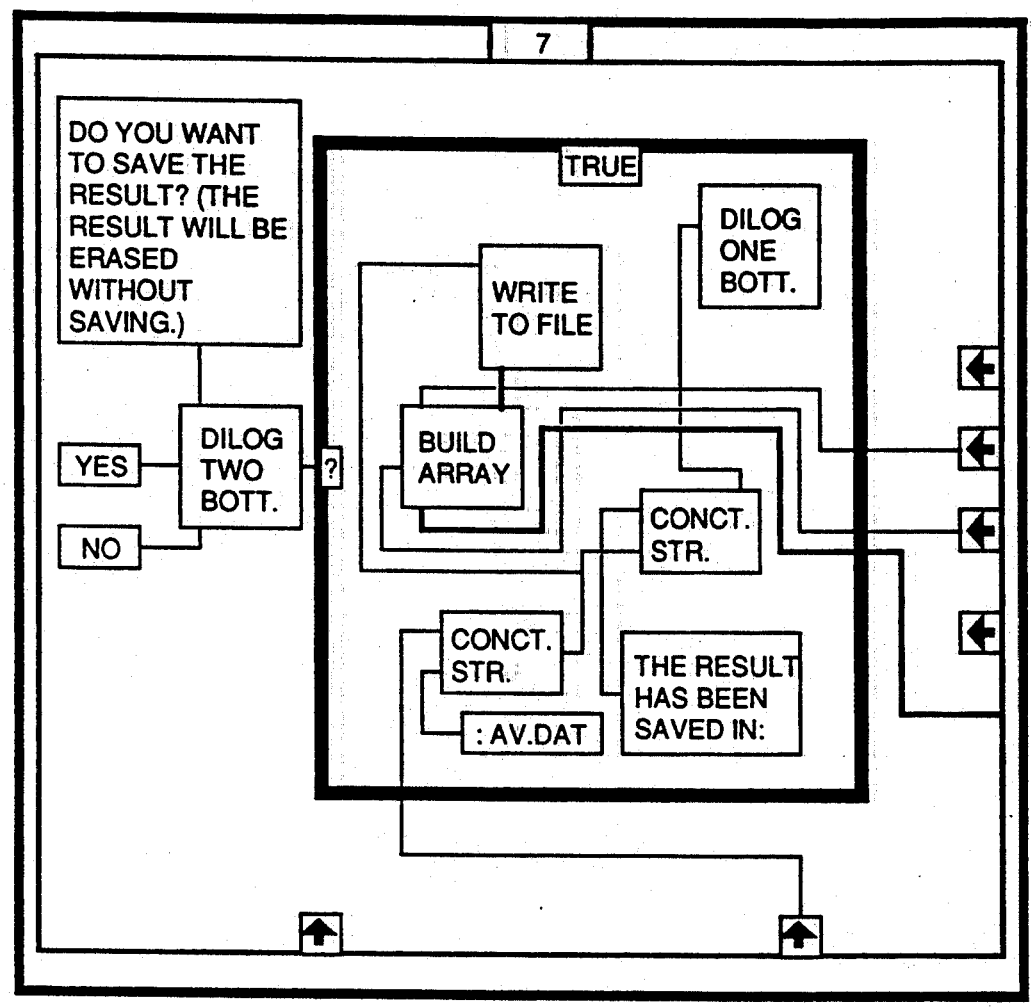
Figure 22:
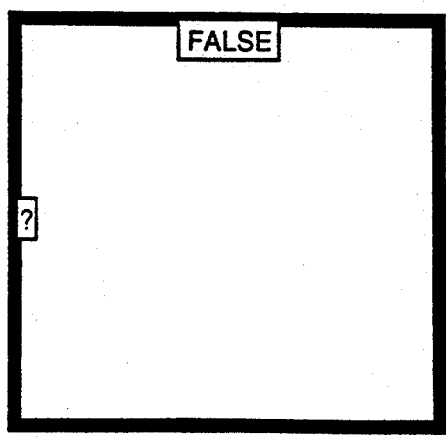
Figure 22:
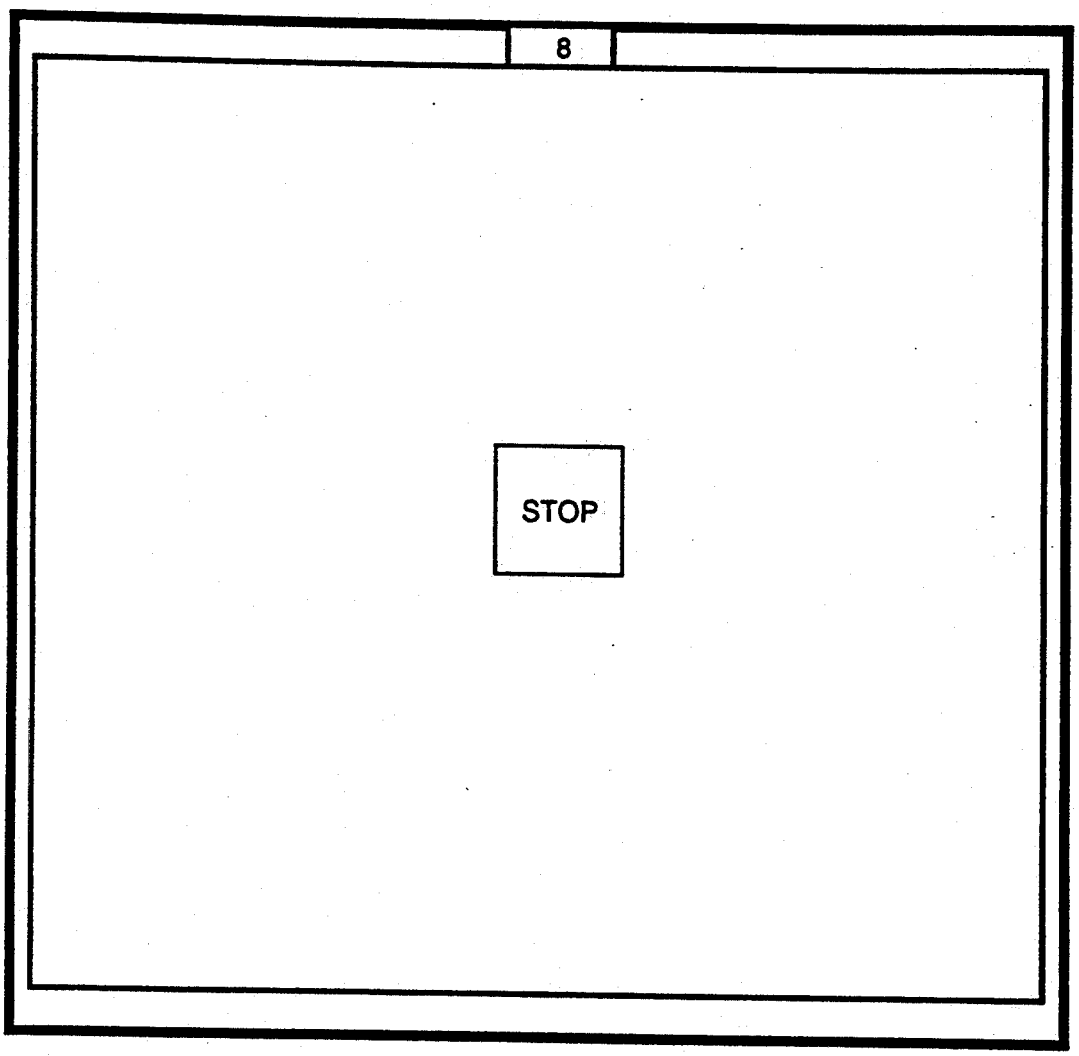
Figure 22:
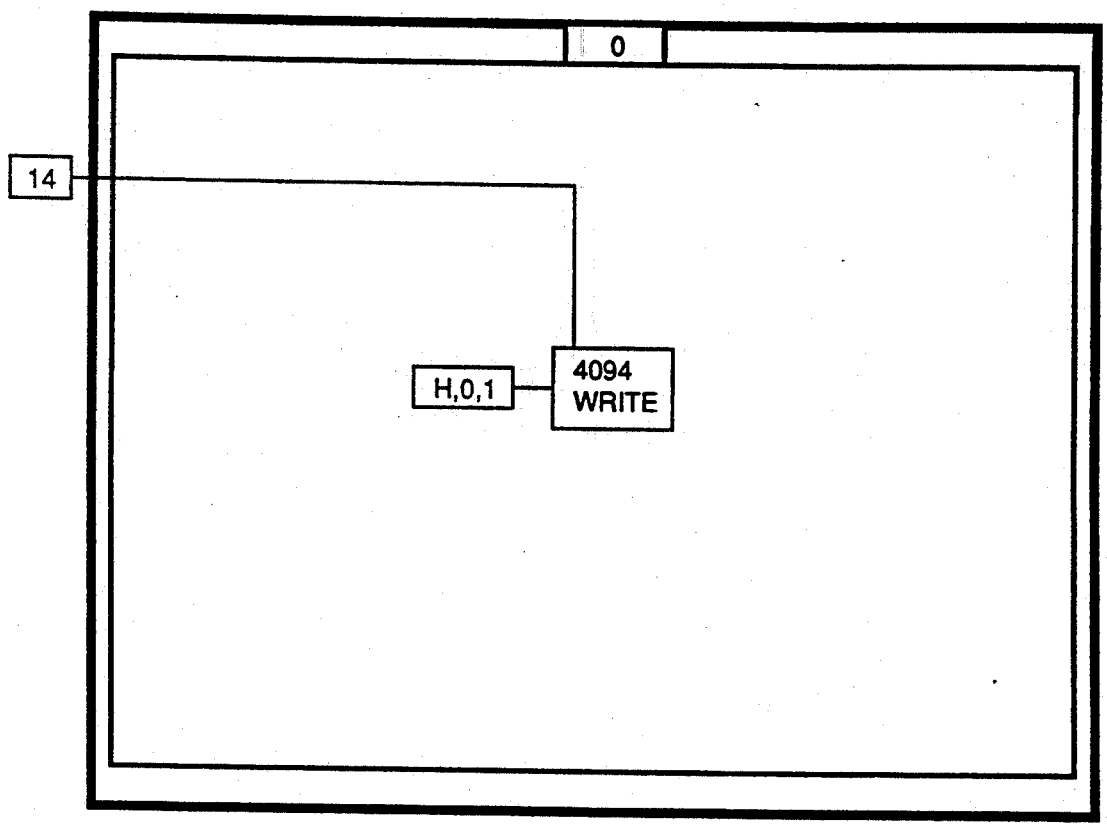
Figure 22:
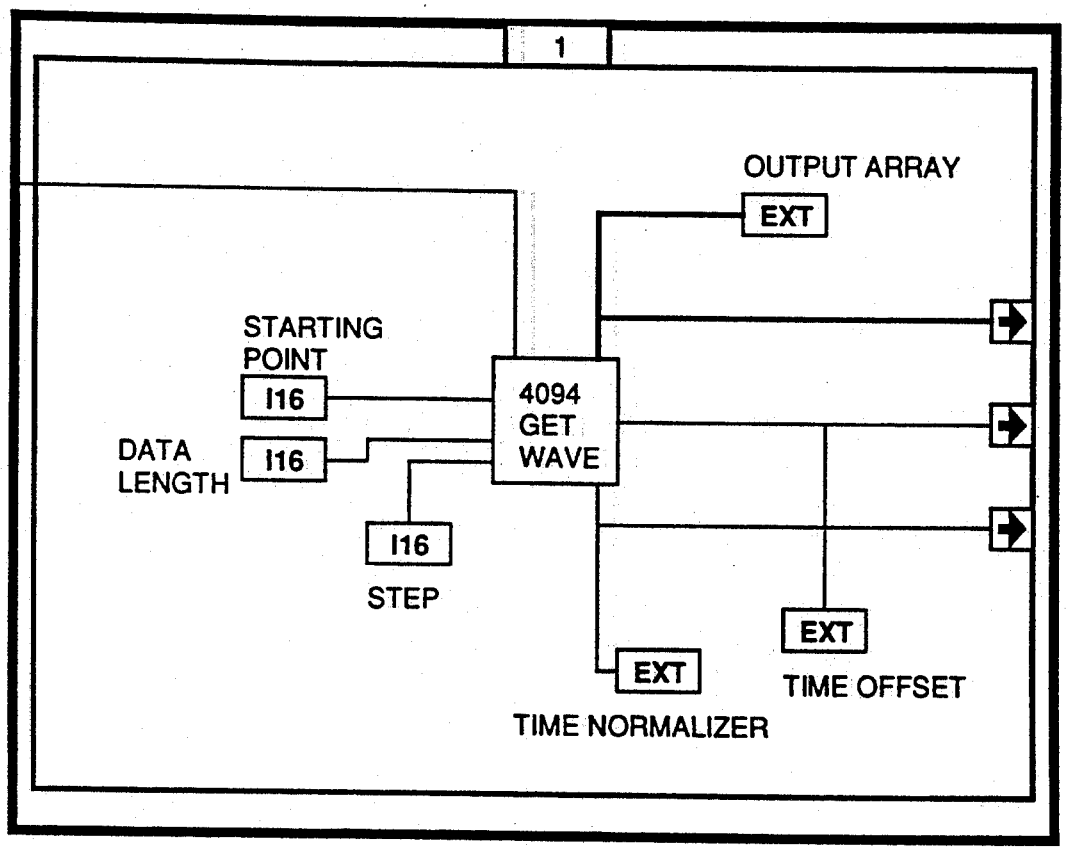
Figure 22:
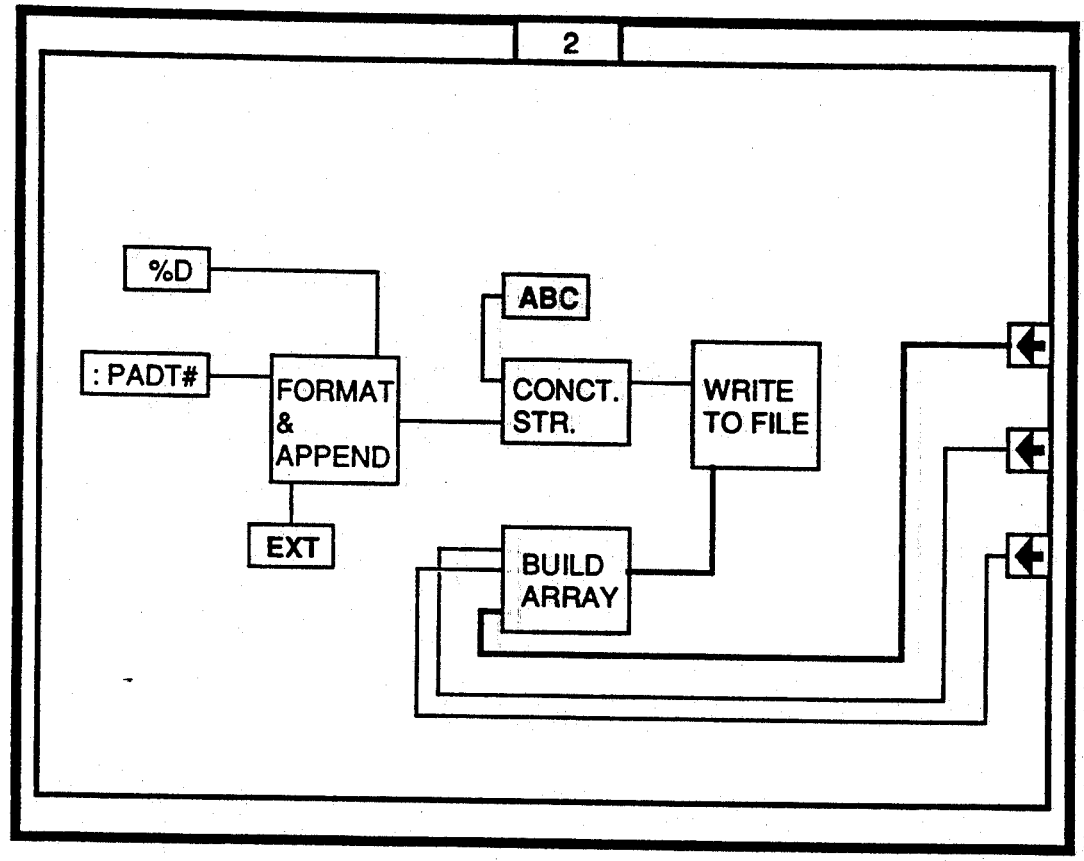
Figure 22:
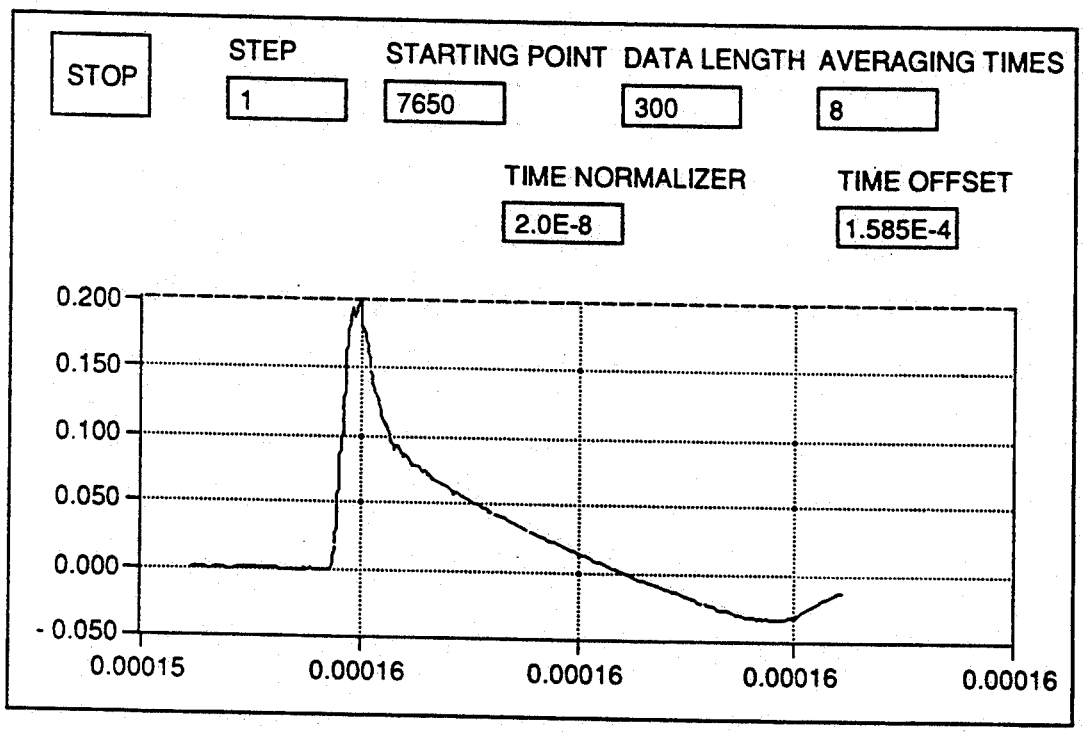
Figure 23:
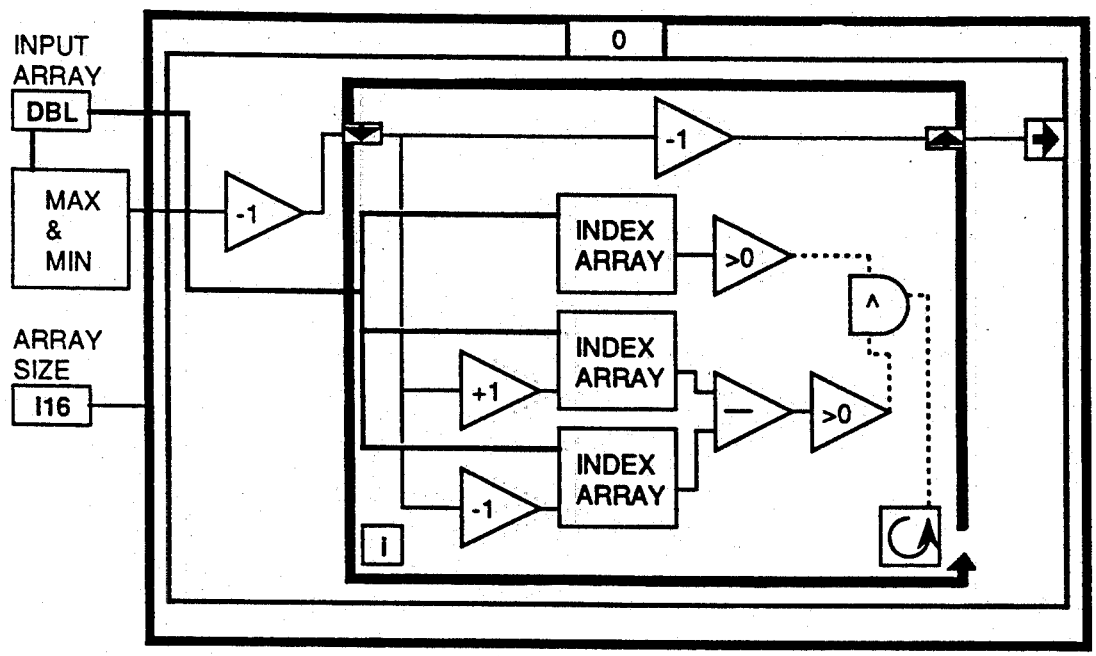
Figure 23:
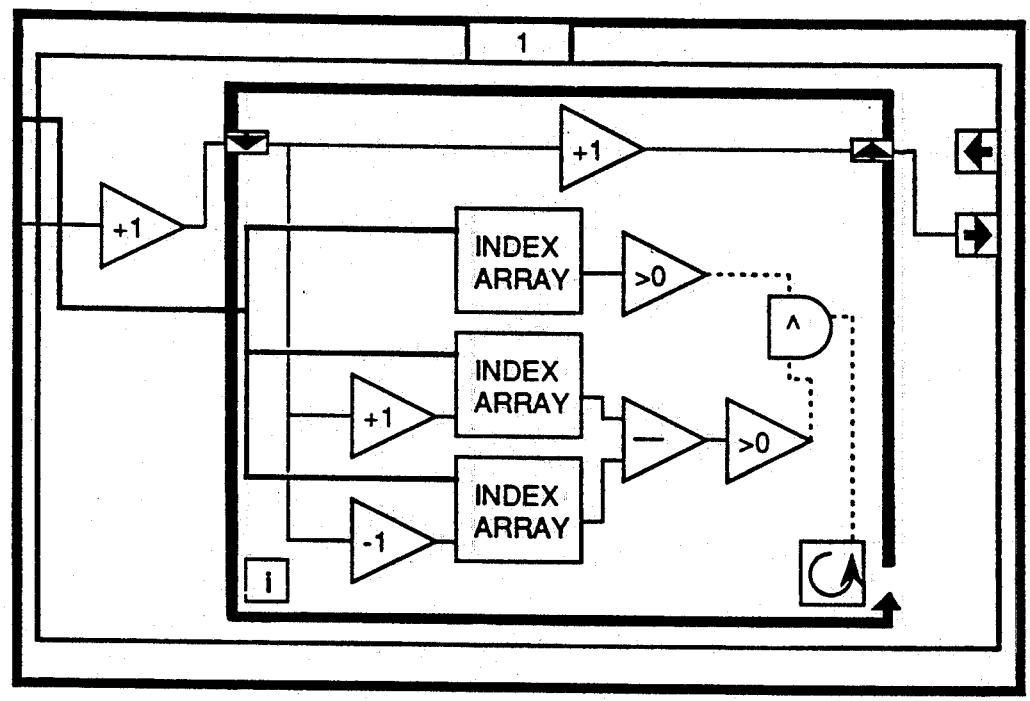
Figure 23:
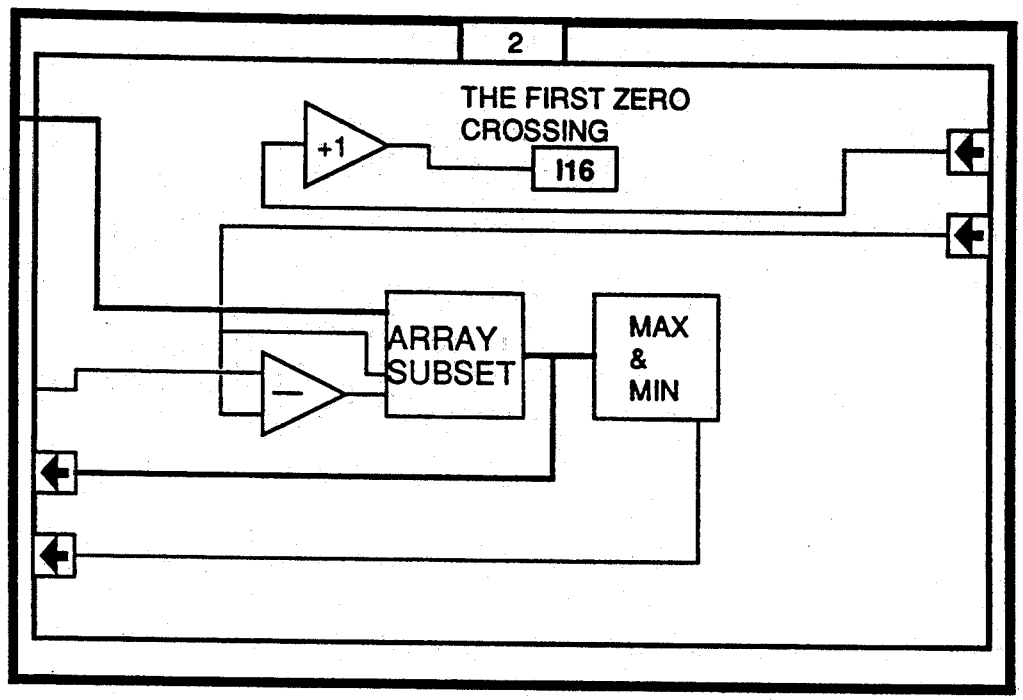
Figure 23:
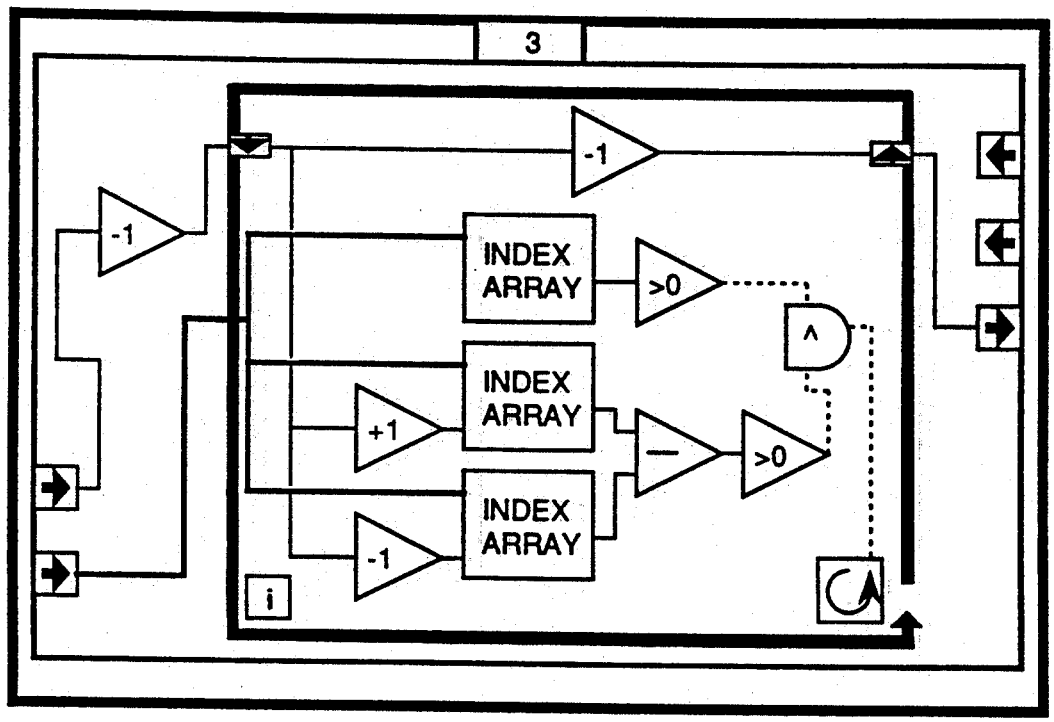
Figure 23:
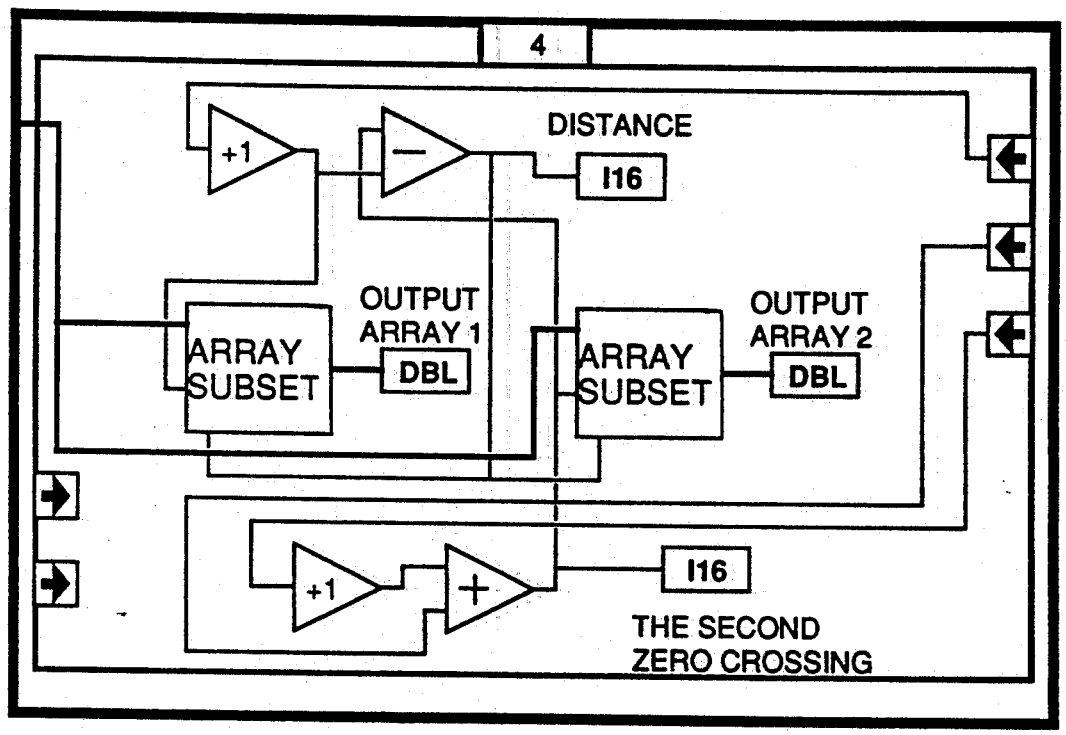

This program is illustrated in FIGS. 22a-22o, and it accepts data obtained by the DSO when operating in the "external trigger" mode. It lines up the first peaks of 40-100 frames of PD signals obtained on repeated triggering, averages the data and places the information on the computer hard disk. This virtual instrument transfers data from Nicolet DSO and performs averaging, and saves the original data and the averaged data on the hard disk. The visual display is seen in FIG. 22p.

Time-Int(sub)

This subroutine is illustrated in FIGS. 23a-23e, and it can be used in conjunction with IntpPeak.vi (item 3) to compute the zero crossing of a PD wavelet and provide a mathematical estimate of the wavelet in order to determine the location of its peak. This virtual instrument can be used to find the zero crossing of a waveform and to obtain the waveform between two peaks (first and second, second and third). Its visual display is illustrated in FIG. 23f.

XcorrCoeff(sub)

Figure 24:
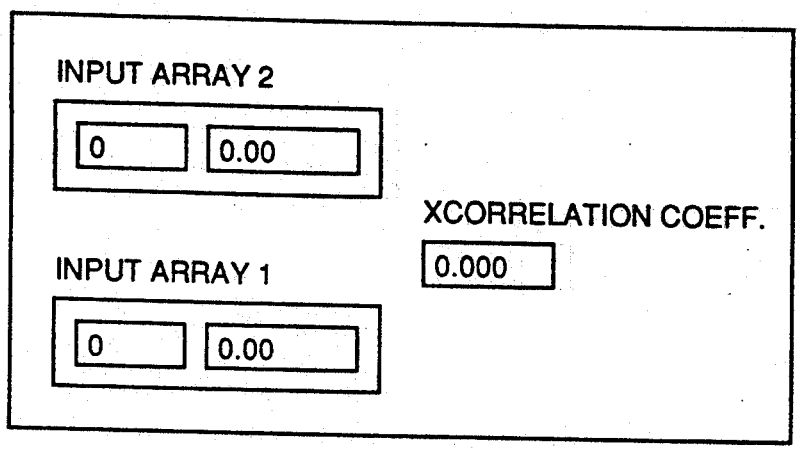
Figure 24:
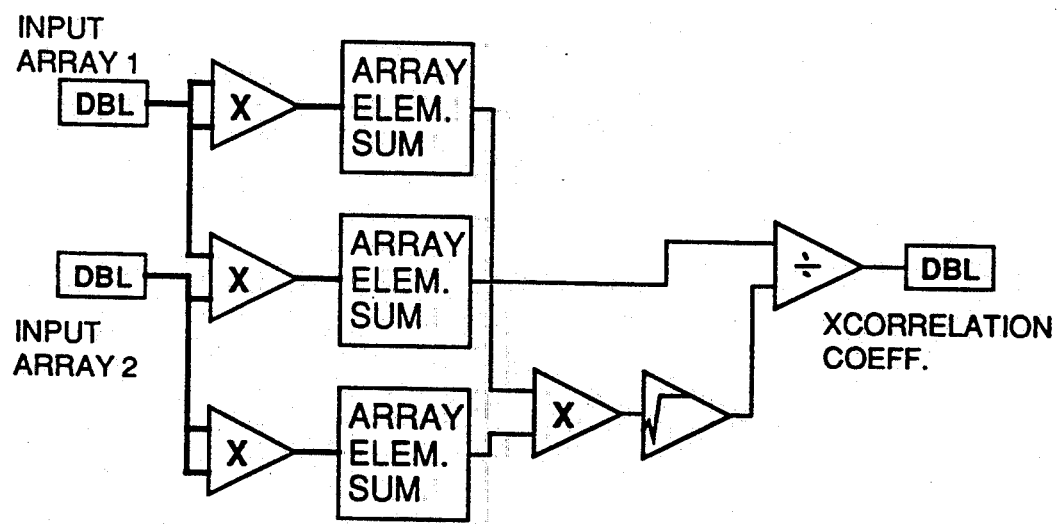

This is a subroutine is illustrated in FIG. 24a, and it is used with several of the programs listed previously. It allows a cross correlation function to be developed between two sets of PD signals, and computes the cross correlation coefficient between the two input signals. Its display is illustrated in FIG. 24b.

Open&Read

Figure 25:
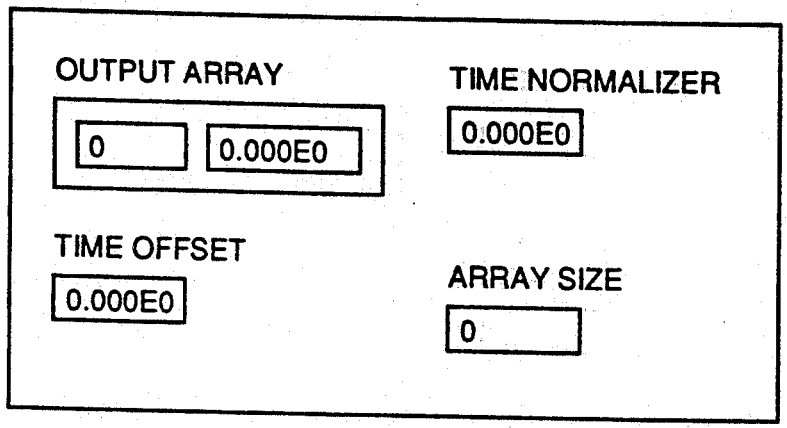
Figure 25:
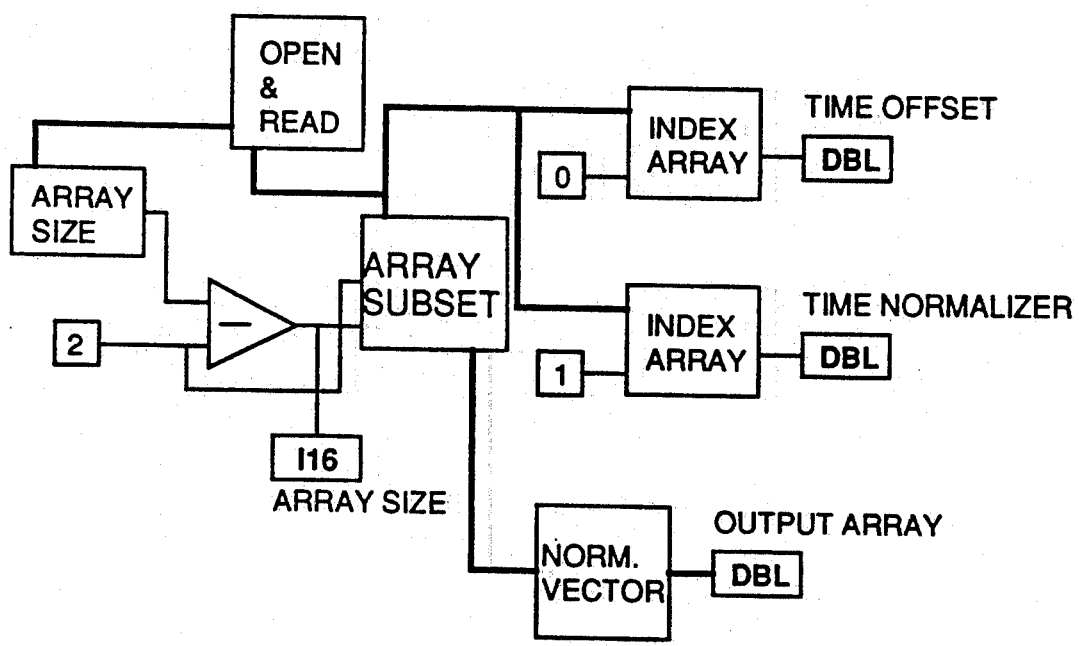

This program is illustrated in FIG. 25a and it opens a data file and outputs the data into an array in a normalized form. Its display is seen in FIG. 25b.

Although the method of the present invention has previously been described as applicable to cables in residential areas operating at 60 Hertz and subject to broadcast noise, it will be appreciated that it is also applicable to cables carrying current at other frequencies and to use in coping with noise from other sources and other frequencies.

The number of discrete segments of the signal stored by the DSO and processed should be at least 10 and preferably at least 20. There is no real benefit to be obtained by averaging more than 60 segments.

The timeframe for each segment should be on the order of 5-10 microseconds for the length of cables which will normally be found in service, and there is little to be gained by longer periods.

As will be appreciated, the DSO includes circuitry providing a short delay in processing a signal received directly from the amplifier through the isolation transformer. This may be set to account for the time delay required for the same portion of the signal to pass through the band pass filter and trigger the recording function of the DSO. Typically, this will be a fraction of a microsecond.

It can be seen that the instrumentation and the measurement method of the present invention are non destructive since the excitation voltage level may be at or below the normal service voltage of the cable system. Accordingly, it need not introduce destructive electrical stresses into the system. The instrumentation required is designed for field use with cables buried underground, and all measurements may be done in situ, rather than on a cable specimen in the laboratory. Moreover, all measurements may be done with no more than one sensor connected at one end at the same time. In a complex cable system, with multiple lateral branches, there may be a need to conduct measurements at multiple ports; if so, such measurements should be carried out sequentially with only one sensor in use at any time.

The instruments and software measure and analyze the spectral content of the electrical noise prevailing at the test site, and utilize line and notch filters to eliminate offending portions of the noise spectrum.

With the trigger synthesized by using the suitably filtered signal, triggering of the DSO occurs only on genuine PD waveforms even when the PD is buried in the noise. The method and apparatus provide electronic and software related SNR (signal to noise ratio) enhancement techniques to produce clean, readily processible PD signals. The individual filtered frames are readily aligned to permit many frames to be averaged to cancel out noise and enhance the desired PD signals.

The adaptive digital signal processing technique requires much less operator intervention and can make use of the transfer function of the cable for added accuracy. Accordingly, it may include construction of an accurate cable model capable of generating signals which simulate actual PD signals emanating from an arbitrary location along the cable. It may also include the development of a cable transfer function by the analysis of the cable response to either an injected low voltage pulse at one end as shown in the aforementioned Mashikian et al Patent, or introduction of an actual PD signal at one end by placing a special defective insulation system (DOE PD cell) and exciting it at a moderate power frequency voltage. In addition, it may include detection and location of the PD site(s) along the cable length through repeated cross correlation operation (performed by software) between the measured waveform and the model of a PD signal emanating from location $x=x_1$, with $x_1$ being varied in small increments to cover the cable length.

The procedure incorporates an adjustable parameter K (open loop gain) in the cable model for increased robustness of the algorithm, and a systematic procedure for determining the adjustable parameter K from the measured data. It also enables use of a new technique for finding the actual round trip delay time from the measured data, a new procedure for making the initial estimate for the round trip time from the measured data, and a new technique for estimating the location of the peak of a rounded or attenuated waveform. Lastly, it provides a new position calibrator configuration for coupling pulses into a buried cable, or receiving pulses from the buried cable by means of an antenna like device.

Thus, it can be seen that the method and apparatus of the present invention provide an effective means for determining the location of an incipient fault in a power cable in an environment where the PD signal is obscured by electrical noise. The apparatus is of relatively simple construction and operation, and the method requires minimal operator intervention.

Having thus described the invention, what is claimed is:

1. In a method for locating an incipient fault at a point along the length of an insulated power line, the steps comprising:
   (a) applying an excitation voltage at an open end of said power line to produce a partial discharge signal pulse at a fault in the power line;
   (b) passing said partial discharge signal pulse transmitted along said power line to an open end of the line through a high pass filter to remove the portion of said signal pulse which is at a frequency below the excitation voltage and its harmonics;
   (c) amplifying the filtered signal pulse to produce an amplified signal pulse;
   (d) passing the amplified signal pulse through a band pass filter to remove a high frequency portion of the signal containing a large proportion of noise relative to the partial discharge signal pulse occupying the same frequency band and to provide a doubly filtered signal pulse;
   (e) passing the doubly filtered signal pulse from the band pass filter to a digital storage device triggered by a doubly filtered signal pulse of a predetermined amplitude;
   (f) triggering said digital storage device by a doubly filtered signal pulse of at least said predetermined amplitude, said device when triggered receiving said amplified signal pulse directly from said and storing digital data concerning amplitude and time of said peaks of the amplified signal pulse for a predetermined period of time; and (g) processing the stored digital data to identify the peaks reflecting the point of partial discharge in said power line.

2. The method for locating an incipient fault in accordance with claim 1 wherein steps (d), (e) and (f) are repeated to store data from a predetermined number of discrete time periods; and the stored digital data from said predetermined number of time periods is processed.

3. The method for locating an incipient fault in accordance with claim 2 wherein said processing step includes aligning the first peaks of the stored data for said number of triggered time periods.

4. The method for locating an incipient fault in accordance with claim 3 wherein the stored data concerning amplitude for the peaks at the same time periods is averaged to identify the peaks and time for the signals of the point of incipient fault.

5. The method for locating an incipient fault in accordance with claim 2 wherein said predetermined number of time periods is at least 25.

6. The method for locating an incipient fault in accordance with claim 1 wherein said digital storage device, upon triggering, is operative to record data in that portion of the doubly filtered signal pulse which has passed through said band pass filter to produce the triggering signal.

7. The method for locating an incipient fault in accordance with claim 6 wherein the amplified signal pulse entering said digital storage device is time delayed to enable said doubly filtered signal pulse to trigger said digital storage device.

8. The method for locating an incipient fault in accordance with claim 1 wherein said amplified signal pulse has rounded peaks of reduced amplitude.

9. The method for locating an incipient fault in accordance with claim 8 wherein said processing step includes the estimation of the peaks in the amplified signal pulse prior to rounding.

10. The method for locating an incipient fault in accordance with claim 9 wherein said estimation employs second order equations for increase and decay of the signal amplitude.

11. The method for locating an incipient fault in accordance with claim 1 wherein said processing determines the time location of an initial series of at least two peaks.

12. The method for locating an incipient fault in accordance with claim 11 wherein the initial series comprises three peaks.

13. The method for locating an incipient fault in accordance with claim 1 wherein the processed data is further processed to estimate the position of the point of partial discharge along the length of the power line.

14. The method for locating an incipient fault in accordance with claim 1 wherein there is included an initial step of injecting an artificial partial discharge signal pulse at one end of the power line and processing the signal pulse received at said one end of the power line after multiple reflections at both ends to produce a mathematical model simulating a partial discharge input at said one end for the simulation of a partial discharge at any point along the length of the power line.

15. The method for locating an incipient fault in accordance with claim 14 wherein said step of processing of said digital data from said digital storage device analyzes said stored digital data and said mathematical model to estimate the point of the partial discharge.

16. The method for locating an incipient fault in accordance with claim 1 wherein said power line is carrying current at 60 Hertz, and said high pass filter removes that portion of the signal partial discharge pulse which is below about 10 kHz.

17. The method for locating an incipient fault in accordance with claim 1 wherein said band pass filter removed the portion of the amplified signal pulse above about 450 kHz.

18. The method for locating an incipient fault in accordance with claim 1 wherein said time period is at least about 5 microseconds.

19. The method for locating an incipient fault in accordance with claim 1 wherein there are included the steps of
 (a) applying an excitation voltage at one end of said insulated power line;
 (b) placing a pulse receiver at a point along the length of said power line spaced a known lineal distance from said one end;
 (c) receiving the signal pulse generated by said excitation voltage; and
 (d) processing said excitation voltage signal pulse to obtain data reflecting amplitude and time of signal peaks corresponding to the known distance.

20. The method for locating an incipient fault in accordance with claim 19 wherein there is included the step of comparing the data obtained from said known distance processing with the data reflecting the point of partial discharge to indicate the relative position of said point of partial discharge.

21. The method for locating an incipient fault in accordance with claim 1 wherein there are included the steps of preliminarily applying an excitation voltage of zero, amplifying the signal pulse received at said open end, and analyzing said amplified signal pulse to evaluate its frequency components.

22. The method for locating an incipient fault in accordance with claim 21 in which the frequencies obtained from the evaluation of said signal pulse using the zero excitation voltage are utilized to establish the frequencies to be set in digital notch filters for the signal pulse.

23. The method for locating an incipient fault in accordance with claim 22 wherein the frequencies are used to adjust the parameters in the processing of the stored data to create adaptivity the proper digital notch filtering of said stored data during the processing of said data to eliminate undesirable noise frequencies.

24. The method for locating an incipient fault in accordance with claim 1 wherein there are included the steps of:
 (a) placing a pulse receiver at said open end of said power line;
 (b) applying an excitation voltage at a point along the length of said power line spaced a known lineal distance from said open end thereof;
 (c) receiving the signal pulse generated by said excitation voltage; and
 (d) processing said excitation voltage signal pulse to obtain data reflecting amplitude and time of signal peaks corresponding to the known distance.

25. The method for locating an incipient fault in accordance with claim 24 wherein there is included the step of comparing the data obtained from said known distance processing with the data reflecting the point of partial discharge to indicate the relative position of said point of partial discharge.

26. Apparatus for locating an incipient fault at a point along the length of an insulated power line, comprising:
   (a) means for applying an excitation voltage at an open end of the power line to produce a partial discharge signal pulse at a fault in the power line;
   (b) means at an open end of the power line for receiving and analyzing said signal pulse transmitted along the power line to an open end of the power line including:
      (i) a high pass filter to remove the portion of the signal pulse which is at a frequency below the excitation voltage and its harmonics;
      (ii) an amplifier for amplifying the filtered signal pulse to produce an amplified signal pulse;
      (iii) a band pass filter to remove a high frequency portion of the amplified signal pulse containing a large proportion of noise relative to the frequency of the partial discharge signal pulse occupying the same frequency band and to produce a doubly filtered signal pulse;
      (iv) a digital storage device triggered by a doubly filtered signal pulse of a predetermined amplitude from the band pass filter, said device receiving the amplified signal pulse directly form the amplifier and storing digital data concerning amplitude and time of the peaks of the amplified signal pulse for a predetermined period of time; and
   (c) a processor for processing the stored digital data to identify the peaks reflecting the point of partial discharge in the power line.

27. The apparatus for locating an incipient fault in accordance with claim 26 wherein there is included control means to permit triggering of said storage device and storage of data and said processor processes the data form the predetermined number of periods.

28. The apparatus for locating an incipient fault in accordance with claim 27 wherein the stored data concerning amplitude for the peaks at the same time periods is averaged to identify the peaks and time for the signals of the point of incipient fault.

29. The apparatus for locating an incipient fault in accordance with claim 26 wherein said digital storage device, upon triggering, is operative to record data in that portion of the amplified signal pulse which corresponds to the doubly filtered signal pulse passing through said band pass filter to produce the triggering signal.

30. The apparatus for locating an incipient fault in accordance with claim 29 wherein said apparatus includes time delay means for the amplified signal pulse entering said digital storage device.

31. The apparatus for locating an incipient fault in accordance with claim 29 wherein said processor aligns the first peaks of the stored data for said number of triggered time periods.

32. The apparatus for locating an incipient fault in accordance with claim 26 wherein said band pass filter removes the portion of the amplified signal pulse above about 450 kHz.

33. The apparatus for locating, an incipient fault in accordance with claim 26 wherein the doubly filtered signal pulse from said amplifier has rounded peaks of reduced amplitude, and the processor estimates the peak of the signal.

34. The apparatus for locating an incipient fault in accordance with claim 26 wherein the processor further processes the data to estimate the position of the point of partial discharge along the length of the power line.

* * * * *

UNITED STATES PATENT AND TRADEMARK OFFICE
CERTIFICATE OF CORRECTION

PATENT NO. : 5,272,439
DATED : December 21, 1993
INVENTOR(S) : Matthew S. Mashikian, Robert B. Northrop, Rajeev Bansal and Francesco Palmieri It is certified that error appears in the above-indentified patent and that said Letters Patent is hereby corrected as shown below:

Column 16, line 6, before "signal", please insert --partial discharge--; line 6, after "signal", please delete "partial discharge".

Column 17, line 26, please delete "form" and insert --from--.

Column 18, line 2, please delete "form" and insert --from--.

Signed and Sealed this

Fifth Day of July, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,272,439

DATED : December 21, 1993

INVENTOR(S) : Matthew S. Mashikian, et al

It is certified that error appears in the above-indentified patent and that said Letters Patent is hereby corrected as shown below:

Column 14, line 52; after "pulse" insert —to produce an amplified signal pulse—.

Signed and Sealed this

Thirteenth Day of September, 1994

Attest:

BRUCE LEHMAN

Attesting Officer   Commissioner of Patents and Trademarks

UNITED STATES PATENT AND TRADEMARK OFFICE
CERTIFICATE OF CORRECTION

PATENT NO. : 5,272,439

DATED : December 21, 1993

INVENTOR(S) : Matthew S. Mashikian, et al

It is certified that error appears in the above-indentified patent and that said Letters Patent is hereby corrected as shown below:

Column 14, line 67, after "said" (second occurrence), insert --amplification step--.

Signed and Sealed this

Fifteenth Day of November, 1994

Attest:

BRUCE LEHMAN

Attesting Officer      Commissioner of Patents and Trademarks